(12) United States Patent
Daniels et al.

(10) Patent No.: US 7,427,782 B2
(45) Date of Patent: Sep. 23, 2008

(54) ROLL-TO-ROLL FABRICATED LIGHT SHEET AND ENCAPSULATED SEMICONDUCTOR CIRCUIT DEVICES

(75) Inventors: John James Daniels, Higganum, CT (US); Gregory Victor Nelson, Branford, CT (US)

(73) Assignee: Articulated Technologies, LLC, Higganum, CT (US)

( * ) Notice: Subject to any disclaimer, the term of this patent is extended or adjusted under 35 U.S.C. 154(b) by 0 days.

(21) Appl. No.: 11/029,137

(22) Filed: Jan. 4, 2005

(65) Prior Publication Data

US 2005/0212007 A1  Sep. 29, 2005

Related U.S. Application Data

(63) Continuation-in-part of application No. 10/919,830, filed on Aug. 17, 2004, now Pat. No. 7,052,924, and a continuation-in-part of application No. 10/920,010, filed on Aug. 17, 2004, and a continuation-in-part of application No. 10/919,915, filed on Aug. 17, 2004.

(60) Provisional application No. 60/556,959, filed on Mar. 29, 2004.

(51) Int. Cl.
*H01L 27/15* (2006.01)
*H01L 31/12* (2006.01)
*H01L 33/00* (2006.01)
*H01L 31/00* (2006.01)

(52) U.S. Cl. ............... 257/80; 257/88; 257/100; 257/443

(58) Field of Classification Search .......... 257/98, 257/99, 100, 80, 88, 79, 103, 443; 438/46, 438/455, 604
See application file for complete search history.

(56) References Cited

U.S. PATENT DOCUMENTS 3,792,308 A   2/1974  Ota (Continued)

FOREIGN PATENT DOCUMENTS

WO    WO 92-06144    4/1992

OTHER PUBLICATIONS

Lee et al., Tae-Woo, "Organic Light-Emitting Diodes Formed by Soft Contact Lamination." *Proceedings of the National Academy of Sciences (PNAS)*, vol. 101, No. 2 (Jan. 13, 2004): pp. 429-433.

(Continued)

*Primary Examiner*—Chuong Anh Luu
(74) *Attorney, Agent, or Firm*—Michaud-Duffy Group LLP

(57) ABSTRACT

A method of making a light active sheet. A bottom substrate having an electrically conductive surface is provided. A hot-melt adhesive sheet is provided. Light active semiconductor elements, such as LED die, are embedded in the hotmelt adhesive sheet. The LED die each have a top electrode and a bottom electrode. A top transparent substrate is provided having a transparent conductive layer. The hotmelt adhesive sheet with the embedded LED die is inserted between the electrically conductive surface and the transparent conductive layer to form a lamination. The lamination is run through a heated pressure roller system to melt the hotmelt adhesive sheet and electrically insulate and bind the top substrate to the bottom substrate. As the hotmelt sheet is softened, the LED die breakthrough so that the top electrode comes into electrical contact with the transparent conductive layer of the top substrate and the bottom electrode comes into electrical contact with the electrically conductive surface of the bottom substrate. Thus, the p and n sides of each LED die are automatically connected to the top conductive layer and the bottom conductive surface. Each LED die is encapsulated and secured between the substrates in the flexible, hotmelt adhesive sheet layer. The bottom substrate, the hotmelt adhesive (with the embedded LED die) and the top substrate can be provided as rolls of material. The rolls are brought together in a continuous roll fabrication process, resulting in a flexible sheet of lighting material.

14 Claims, 50 Drawing Sheets

U.S. PATENT DOCUMENTS

| | | |
|---|---|---|
| 4,335,501 A | 6/1982 | Wickenden et al. |
| 4,495,514 A | 1/1985 | Lawrence et al. |
| 5,273,608 A | 12/1993 | Nath |
| 5,469,019 A | 11/1995 | Mori |
| 5,537,433 A | 7/1996 | Watanabe |
| 5,705,888 A | 1/1998 | Staring et al. |
| 5,757,138 A | 5/1998 | Tsai |
| 5,783,292 A | 7/1998 | Tokito et al. |
| 5,800,478 A | 9/1998 | Chen et al. |
| 5,858,561 A | 1/1999 | Epstein et al. |
| 5,869,350 A | 2/1999 | Heeger et al. |
| 5,882,806 A | 3/1999 | Mori |
| 5,925,897 A | 7/1999 | Oberman |
| 5,965,979 A | 10/1999 | Friend et al. |
| 5,991,456 A | 11/1999 | Rahman et al. |
| 5,994,205 A | 11/1999 | Yamamoto et al. |
| 6,087,196 A | 7/2000 | Strum |
| 6,117,567 A | 9/2000 | Andersson et al. |
| 6,252,564 B1 | 6/2001 | Albert |
| 6,290,713 B1 | 9/2001 | Russell |
| 6,307,751 B1 | 10/2001 | Bodony |
| 6,340,824 B1 | 1/2002 | Komoto et al. |
| 6,395,328 B1 | 5/2002 | May |
| 6,402,579 B1 | 6/2002 | Pichler |
| 6,416,885 B1 | 7/2002 | Towns |
| 6,420,200 B1 | 7/2002 | Yamazaki |
| 6,422,687 B1 | 7/2002 | Jacobson |
| 6,433,355 B1 | 8/2002 | Riese et al. |
| 6,445,126 B1 | 9/2002 | Arai et al. |
| 6,607,413 B2 | 8/2003 | Stevenson et al. |
| 6,614,058 B2 * | 9/2003 | Lin et al. ............. 257/99 |
| 6,737,799 B1 | 5/2004 | Lih et al. |
| 6,762,069 B2 | 7/2004 | Huang et al. |
| 6,876,143 B2 | 4/2005 | Daniels |
| 6,936,131 B2 | 8/2005 | McCormick et al. |
| 2003/0189402 A1 | 10/2003 | Gaudiana et al. |
| 2003/0192584 A1 | 10/2003 | Beckenbaugh et al. |
| 2004/0110866 A1 | 6/2004 | Irvin et al. |
| 2004/0130045 A1 | 7/2004 | Bayless |
| 2004/0195576 A1 | 10/2004 | Watanabe et al. |
| 2005/0045851 A1 | 3/2005 | He et al. |

OTHER PUBLICATIONS

Dabbousi et al., O.D., "Electrode Lumeniscent from CdSe Quantum-dot/Polymer Composites," *Applied Physics Letters*, 66(11) (Mar. 13, 1995).

Land, Edwin, "An Alternative Technique for the Computation of the Designator in the Retinex Theory of Color Vision." *Proceedings of the National Academy of Science*, vol. 83 (1986): pp. 3078-3080.

Land, Edwin, "Color Vision and The Natural Image." *Proceedings of the National Academy of Science*, vol. 45 (1959): pp. 115-129.

Soppimath et al., K.S., "Biodegradable Polymeric Nanoparticles as Drug Delivery Devices," *Journal of Controlled Release*, vol. 70 (2001): pp. 1-20.

Collins, Graham P., "Liquid-Crystal Holograms Form Photonic Crystals," *Scientific American* (2003).

Kang, et al., Solid polymer electrolytes based on cross-linked polysiloxane-g-oligo (ethylene oxide): ionic conductivity and electrochemical properties,Journal of Power Source.

Sotzing et al., Poly(thieno[3,4-b]thiophene):A p- and n-Dopable Polythiophene Exhibiting High Optical Transparency in the Semiconducting State, 7281 Macromolecules 2002.

* cited by examiner solid state conductor
adhesive, CTC, SSE

RGB pattern structure can include conductive adhesives, non-conductive adhesives, combinations convex lens system concave lens system

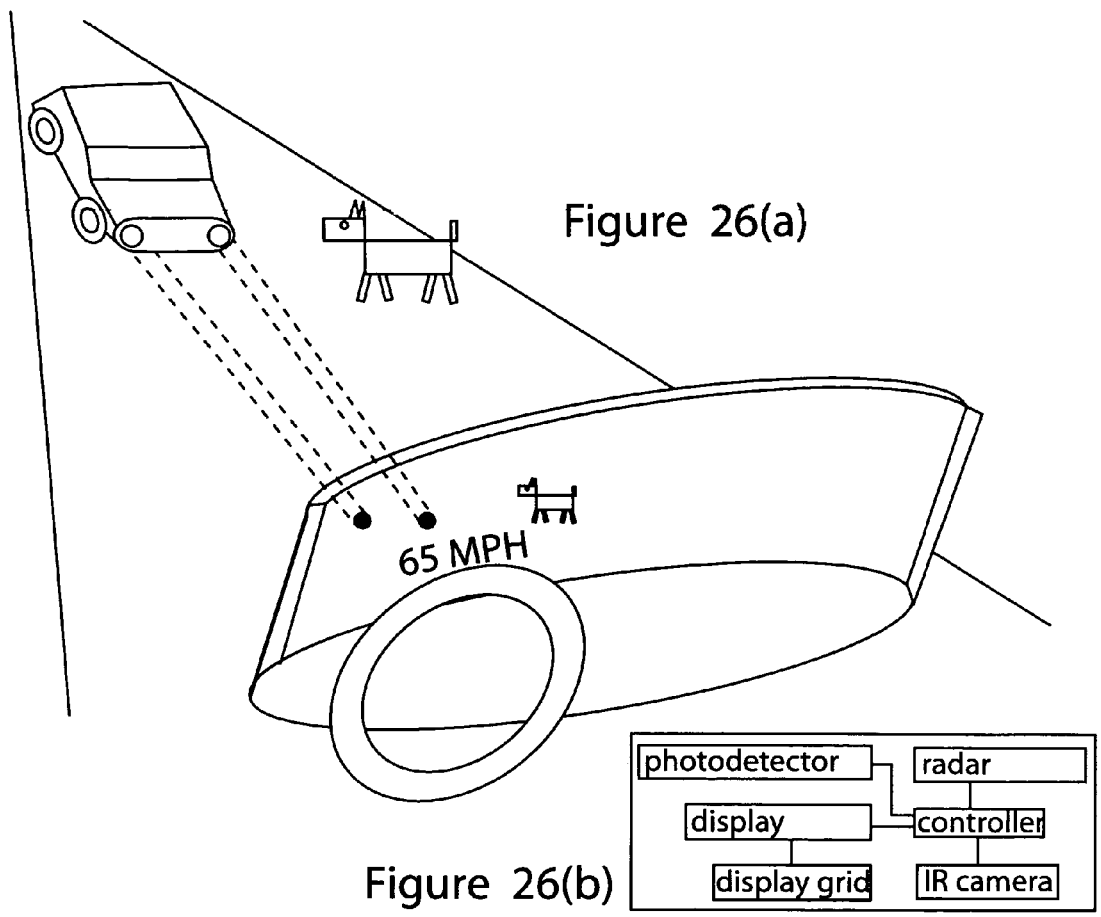
Figure 26(a)
Figure 26(b)
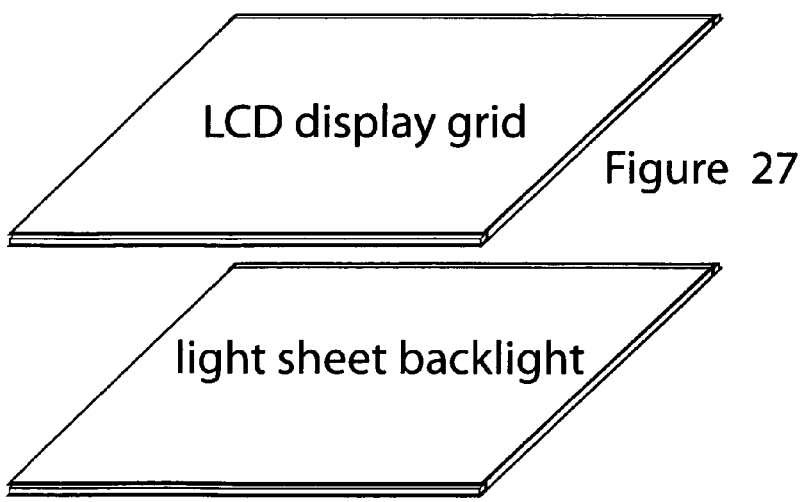
Figure 27

1) doctor blade the particle/matrix 2) apply top substrate 3) polymerize matrix 4) trim to remove edge effects 5) completed panel

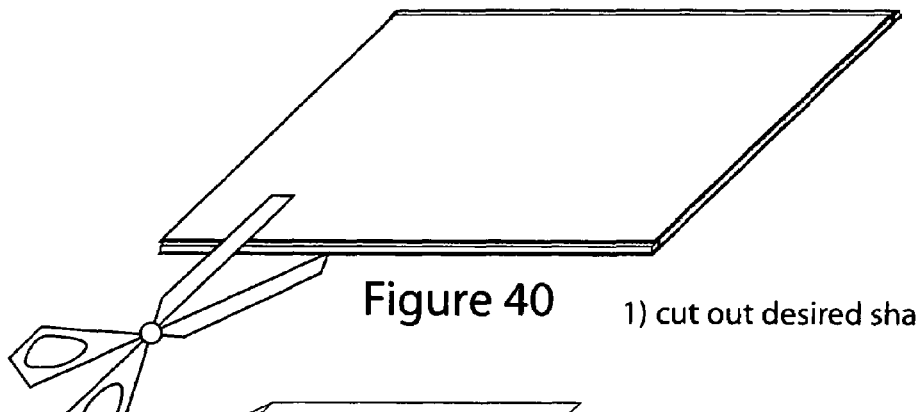
Figure 40    1) cut out desired shape
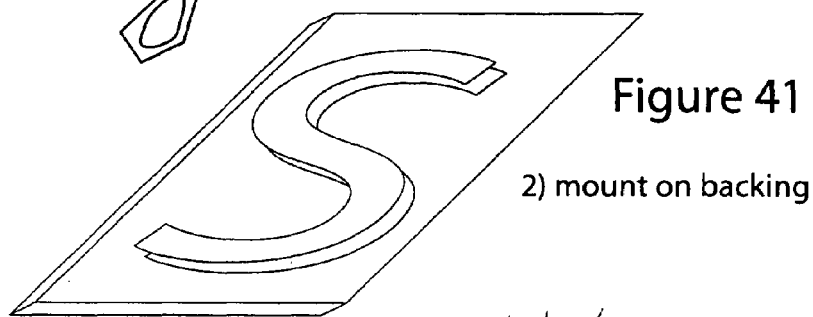
Figure 41
2) mount on backing board
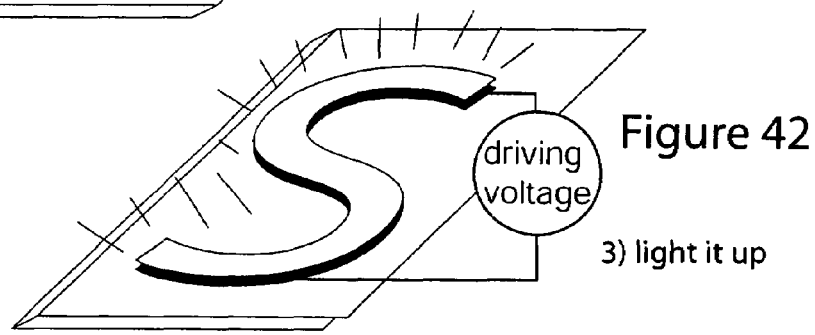
Figure 42
3) light it up
Figure 43

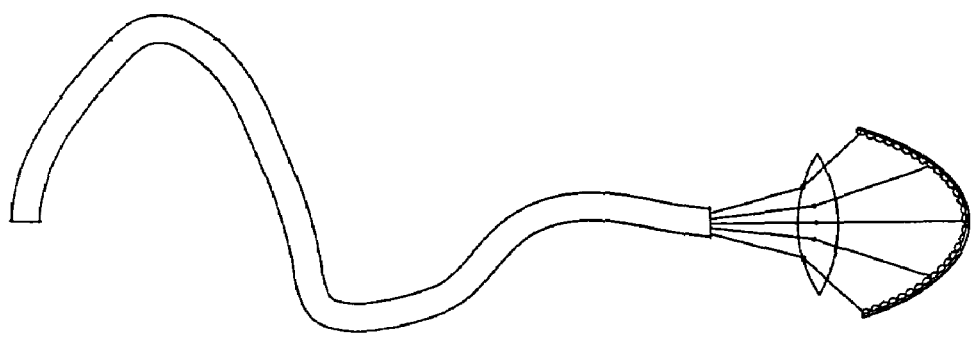
Figure 46
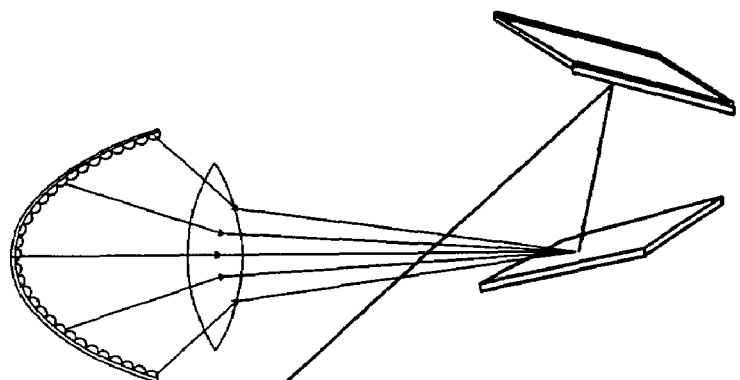
Figure 47
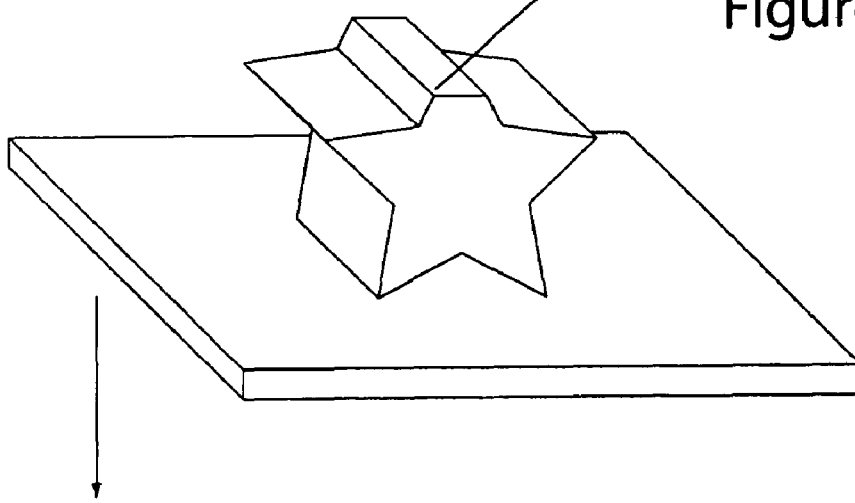

10 mW/chip at 4 volts

In a square cm, 400 chips are arranged in formation. Each chip's output is 10 mW/chip at 4 volts. The total output of the formation is 4 W/cmsq cooling channels heat sink Continuous UV Light Device direction of substrate motion uncured UV-curable adhesive continuous high intensity UV cure zone cured UV-curable adhesive

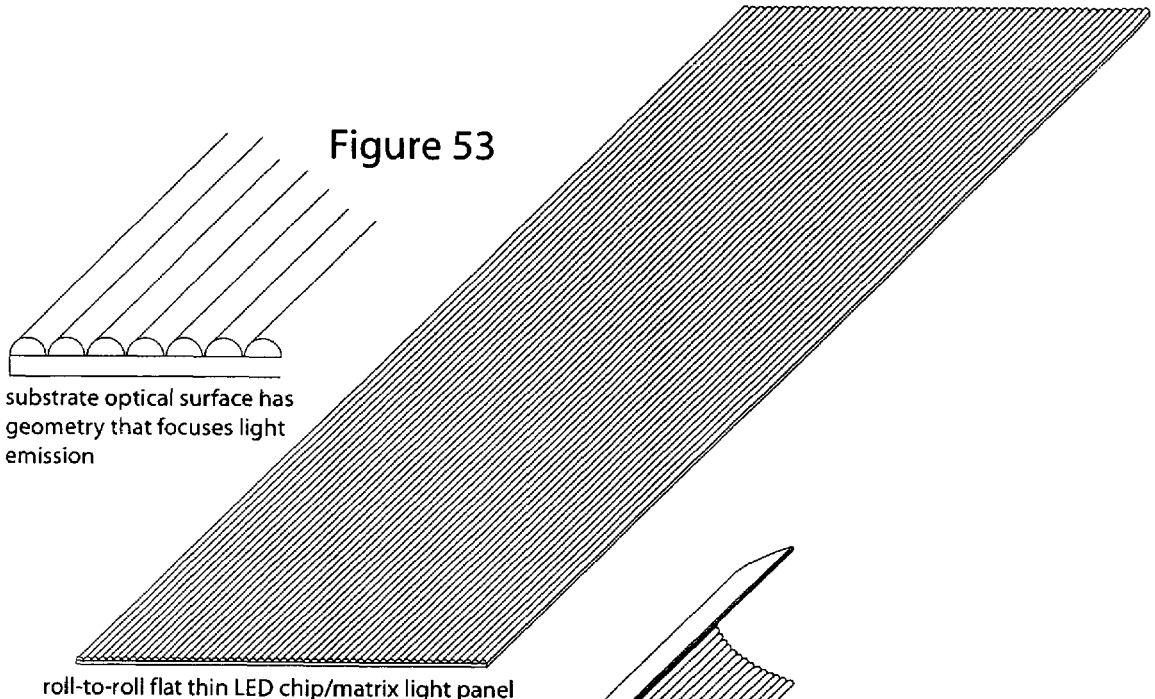
Figure 53
substrate optical surface has geometry that focuses light emission
roll-to-roll flat thin LED chip/matrix light panel
Figure 54
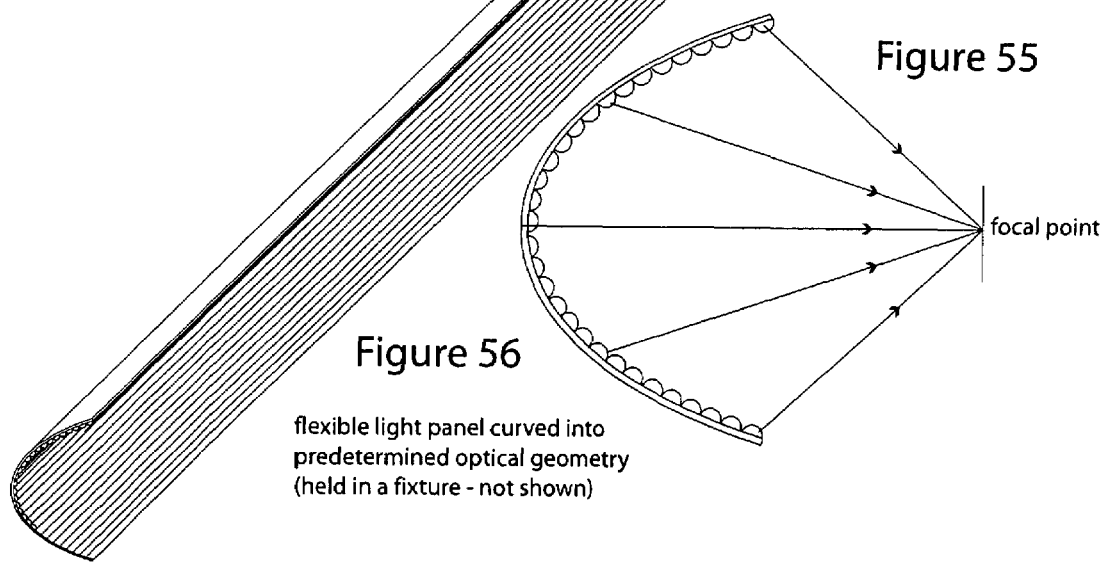
Figure 55
Figure 56
focal point
flexible light panel curved into predetermined optical geometry (held in a fixture - not shown)

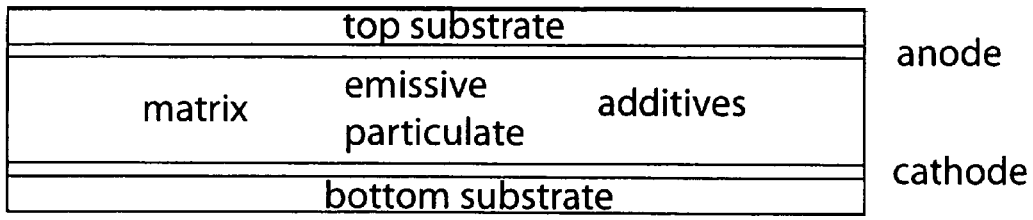

Figure 62 top substrate/anode: ITO coated polyester bottom substrate/cathode: aluminum foil adhered to mylar or metalized mylar with adhesive removed matrix: PEO-based electrolyte* emissive particulate: tyntek AlGaAs/AlGaAs Red Chip-TK 112UR

* transparent, good conductivity, photopolymerizable
see, Solid Polymer Electrolytes based on cross-linked polysiloxane-g-oglio9ethylene oxide): ionic conductivity and electrochemical properties

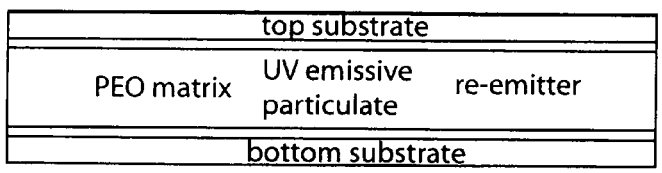

Figure 63 top substrate/anode: FEP*
anode material: ITO spray coated**
bottom substrate/cathode: aluminum foil adhered to mylar or metalized mylar with adhesive removed or silver coated PET matrix: PEO-based solid polymer electrolyte (or new SPE that does is transmissive to UV)

emissive particulate: Cree C405-MB290-S0100 or other UV LED Chip additives: light diffusion particles/glass dust (if necessary)

* fluroethylenepropylen: high UV transmission available from Adtech Poymer Engineering

**see, Low-Cost Deposition of Highly-Conductive Indium-Tin-Oxide Transparent Films by Chemical Process; Spray CVD and Dip Coating

| | |
|---|---|
| top substrate | substrate coating / anode |
| matrix   emissive particulate   additives | |
| bottom substrate | cathode | top substrate/anode: ITO coated polyester
substrate coating: light diffuser/re-emitter (e.g., phosphors)
bottom substrate/cathode: examples, aluminum foil adhered to mylar
or metalized mylar or silver coated PET

Figure 64 matrix: PEO-based solid polymer electrolyte (or new SPE that does
is transmissive to UV)
emissive particulate: Cree C405-MB290-S0100 or other UV LED Chip ⎤
additive: YAG (Yttrium Aluminum Garnet) phosphor               ⎦ emissive particulate: red LED chips   ⎤
green LED chips                       ⎥
blue LED chips                        ⎦

| | |
|---|---|
| top substrate | anode |
| matrix   blue and yellow emissive particulate   light diffusers | YAG layer |
| bottom substrate | cathode |

Figure 65

$R_1$ = lead
$R_2$ = transparent conductor
$R_3$ = bottom conductor

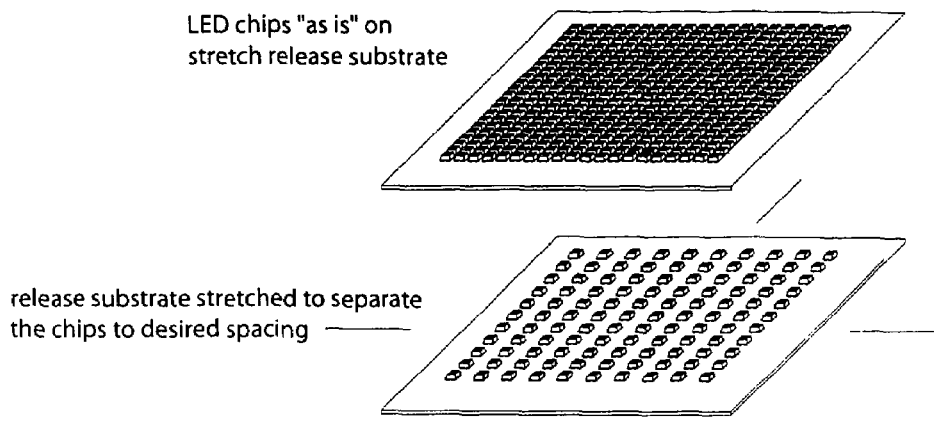
Figure 81
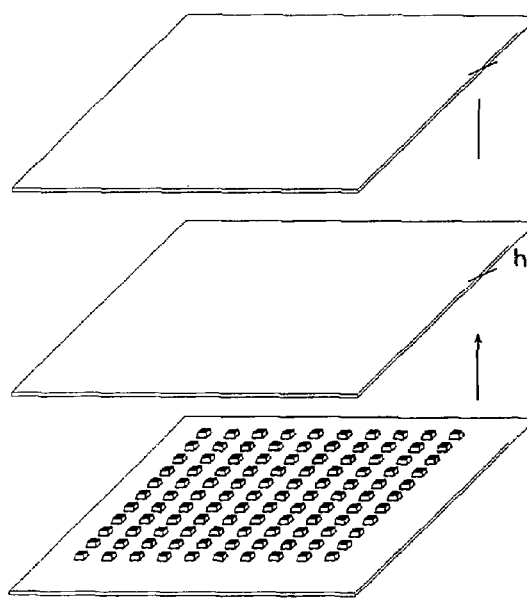
Figure 82
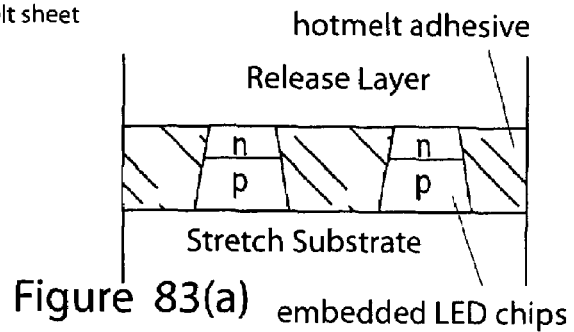
Figure 83(a) embedded LED chips
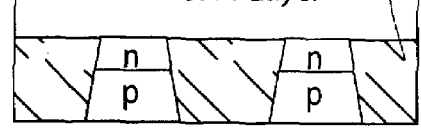
Figure 83(b)

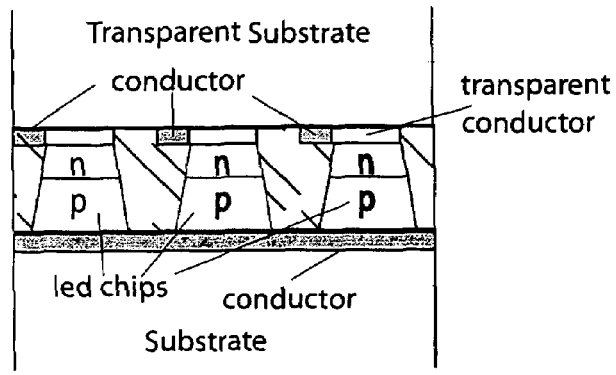
Figure 88
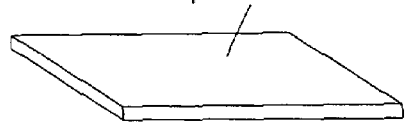
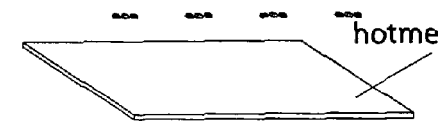
Figure 89
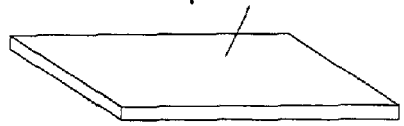
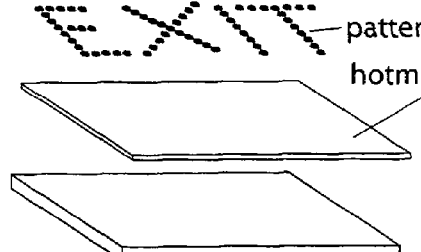
Figure 90

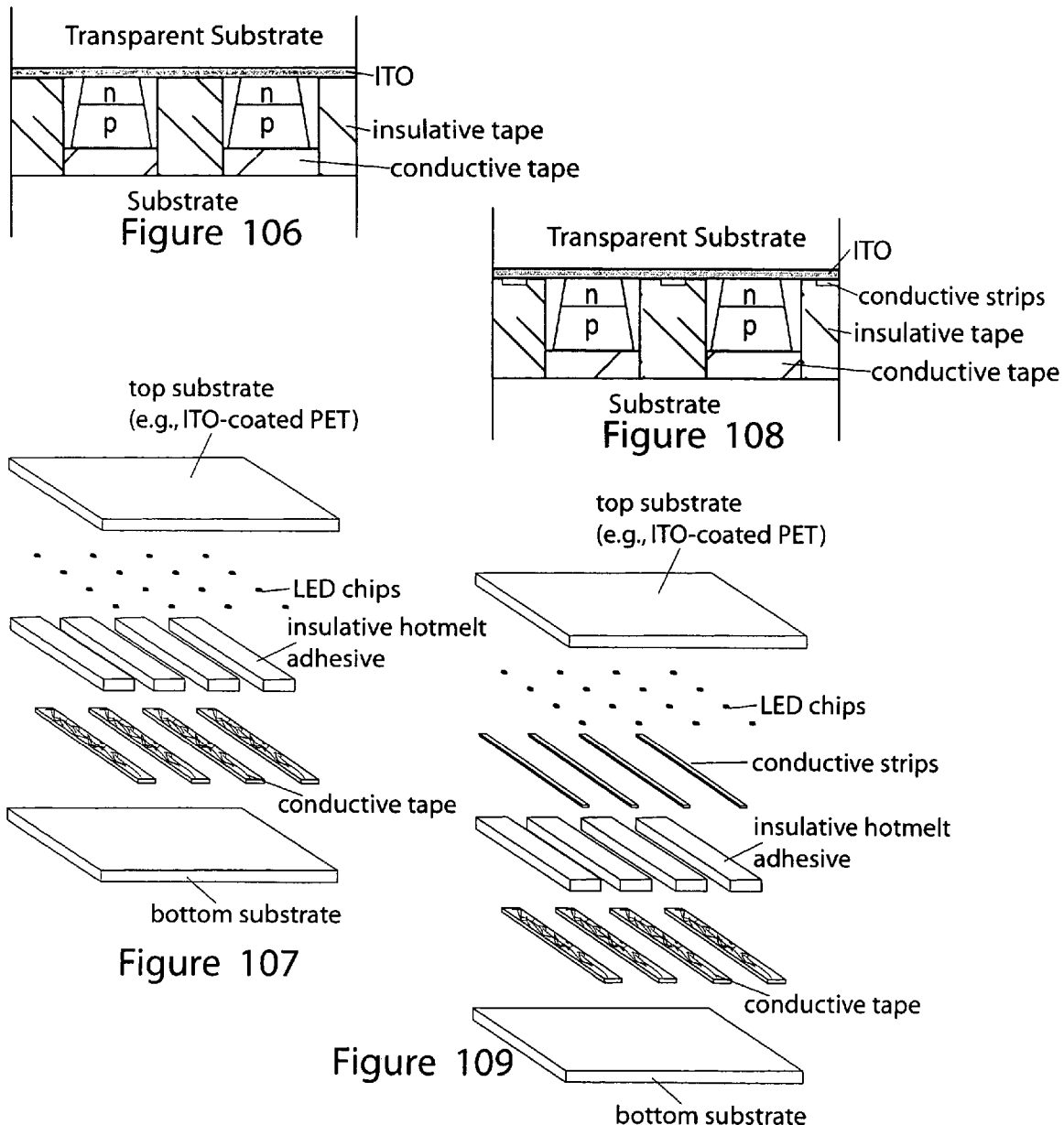

$R_2$

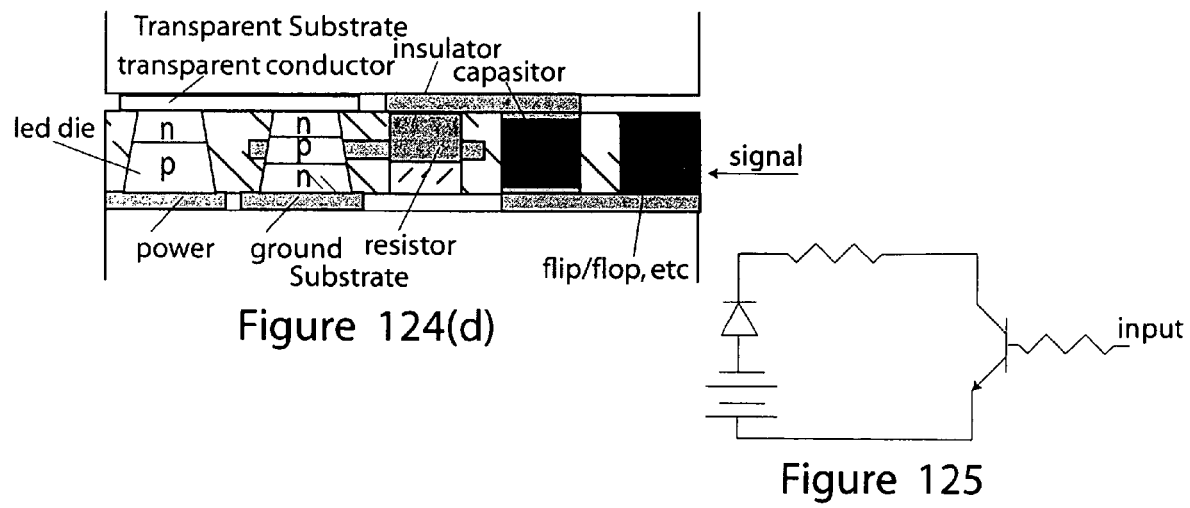
Figure 124(d)
Figure 125
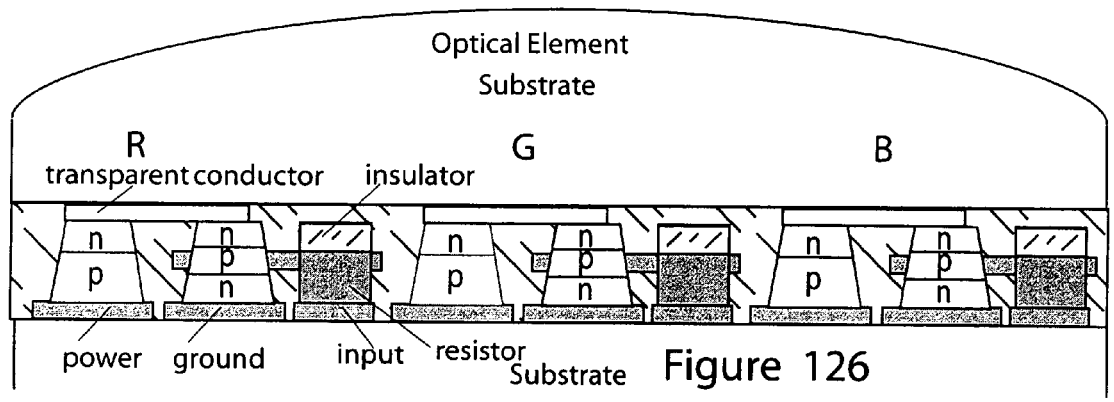
Figure 126
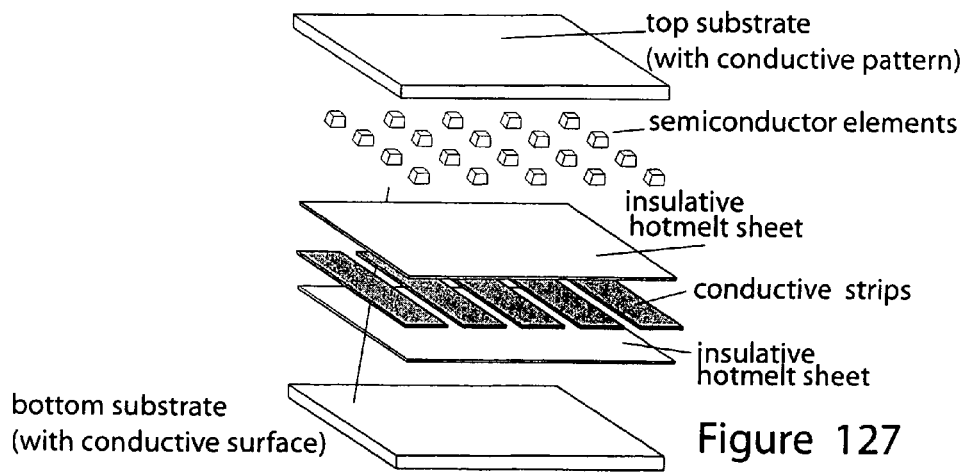
Figure 127

Figure 128(a)
hotmelt sheet with embedded LED die
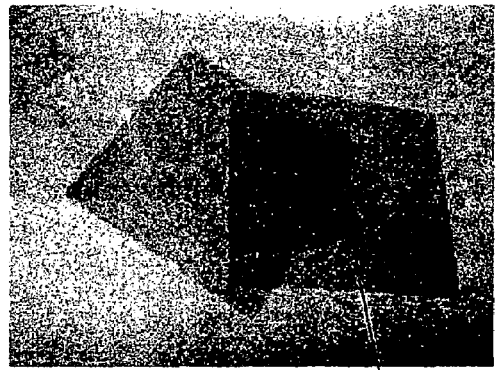
Figure 128(b)
TOcoated PET substrates
hotmelt sheet with embedded LED die
assembled substrates and active layer
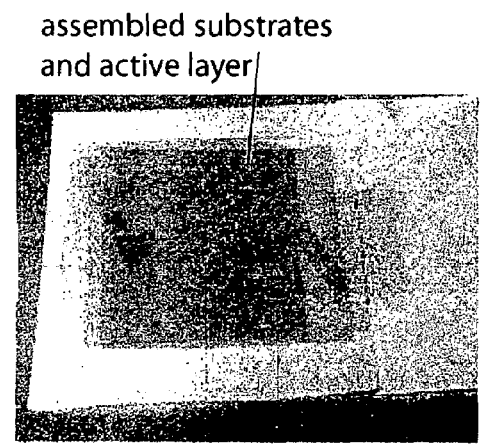
Figure 128(c)
Figure 128(d)
assembly passing through heat laminator
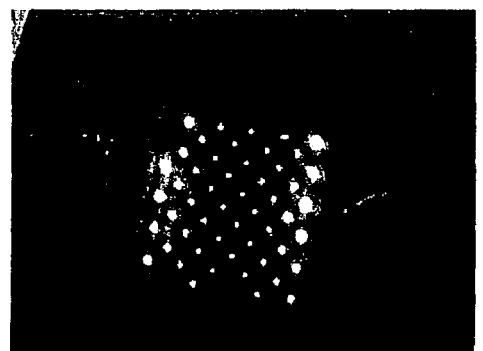
Figure 128(e)
lights up yellow with one polarity
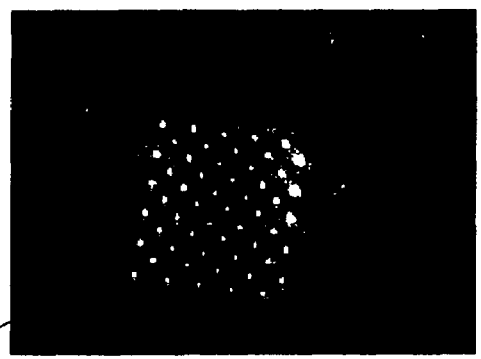
lights up red with other polarity    Figure 128(f)

US 7,427,782 B2

ROLL-TO-ROLL FABRICATED LIGHT SHEET AND ENCAPSULATED SEMICONDUCTOR CIRCUIT DEVICES

CROSS-REFERENCE TO RELATED APPLICATIONS

This is a Continuation-in-Part of U.S. Utility application Ser. No. 10/919,830, entitled Light Active Sheet And Methods For Making The Same, filed Aug. 17, 2004 now U.S. Pat. No. 7,052,924, which is a U.S. Utility Application of U.S. Provisional Application Ser. No. 60/556,959, filed Mar. 29, 2004. This application is also a Continuation-in-Part of U.S. Utility application Ser. No. 10/920,010, entitled Light Active Sheet Material, filed Aug. 17, 2004 and U.S. Utility application Ser. No. 10/919,915 entitled Photo-Radiation Source, filed Aug. 17, 2004. This is also related to co-pending U.S. Utility application Ser. No. 11/029,129 entitled Roll-to-Roll Fabrication Light Sheet and Encapsulated Semiconductor Circuit Devices filed Jan. 4, 2005, the subject matter of these patent documents is incorporated by reference herein in its entirety.

BACKGROUND OF THE INVENTION

The present invention pertains to a semiconductor roll-to-roll manufacturing method. The present invention also pertains to an inorganic light emitting diode light sheet and methods for manufacturing the same. More particularly, the present invention pertains to an inorganic light emitting diode light sheet that can be used as a photo-radiation source for applications including, but not limited to, general illumination, architectural lighting, novelty lighting, display backlighting, heads-up displays, commercial and roadway signage, monochromatic and full-color static and video displays, a radiation-source for photo-curable materials, patterned light emissive images, and the like. Further, the present invention pertains more particularly to an inorganic light active sheet that can be used as a light-to-energy device for converting photo-radiation to electrical energy for applications including, but not limited to, solar panels, CCD-type cameras, photo-sensors, and the like. Further, the present invention pertains more particularly, to methods for mass-producing the inventive light active sheet at relatively low cost.

Inorganic light emitting diodes (LED) are based on elements of the periodic table of a vast variety. They come out of semiconductor technology, and indeed, a semiconductor diode such as a silicon diode, or a germanium diode were among the first semiconductor devices. These were made by doping the silicon or the germanium with a small amount of impurity to make n-type (excess electrons) or p-type (excess holes) in the material. LEDs emit light because of the materials selected so that the light is emitted in the ultra-violet, visible, or infrared ranges of the spectrum. The types of materials used are made from vapor deposition of materials on semiconductor wafers and cut into dice (a single one is a die). Typically, the die, or LED dice, are about 12 mil sq. The composition of the dice depends on the color, for example some red dice are AlInGaAs and some blue dice are InGaN. The variations are typically "three-five" variations, so-called because they vary based on the third and fifth period of the periodic table to provide the n- and p-type materials.

The conversion of an LED die into an LED lamp is a costly process, involving very precise handling and placement of the tiny LED die. The LED dice are most simply prepared as 3 mm LED lamps. The die is robotically placed in a split cup with electrodes on each side. The entire structure is encased in a plastic lens that attempts to focus the beam more narrowly. High brightness dice may also be surface mounted with current-driving and voltage limiting circuits, and elaborate heat sink and heat removal schemes. Connection is by soldering or solderless ultrasonic wire bond methods. The result is a discrete point source of light. The LED lamp has a pair of leads, which can then be soldered to a printed circuit board. The cost of forming the lamp and then soldering the lamp to a printed circuit board is a relatively expensive process. Accordingly, there is a need to reduce the cost of forming a light emitting device based on the LED die.

As an example application of LED lamps, it has recently been shown that ultraviolet LED lamps can be used to cure photo-polymerizable organic materials (see, for example, Loctite® 7700 Hand Held LED Light Source, Henkel-Loctite Corporation, Rocky Hill, Conn.).

Photo-polymerizable organic materials are well known and are used for applications such as adhesives, binders and product manufacturing. Photo-polymerization occurs in monomer and polymer materials by the cross-linking of polymeric material. Typically, these materials are polymerized using radiation emitted from sources of light including intensity flood systems, high intensity wands, chambers, conveyors and unshielded light sources.

As an example use of photo-polymerizable organic materials, precision optical bonding and mounting of glass, plastics and fiber optics can be obtained with photo-polymerizable adhesives. These materials can be used for opto-mechanical assembly, fiber optic bonding and splicing, lens bonding and the attachment of ceramic, glass, quartz, metal and plastic components.

Among the drawbacks of the conventional systems that utilize photo-polymerizable organic materials is the requirement of a high intensity photo-radiation source. Typically, light sources, such as mercury vapor lamps, have been used to generate the radiation needed for photo-polymerization. However, these light sources are an inefficient radiation source because most of the energy put in to drive the lamp is wasted as heat. This heat must be removed from the system, increasing the overall bulk and cost. Also, the lamps have relatively short service life-times, typically around 1000 hours, and are very costly to replace. The light that is output from these light sources usually covers a much broader spectrum than the photo-radiation wavelengths that are needed for photo-polymerization. Much of the light output is wasted. Also, although the material can be formulated to be hardened at other wavelengths, the typical photo-polymerizable organic material is hardened at one of the peak output wavelengths of the mercury vapor lamp, to increase the polymerization efficiency. This peak output wavelength is in the UV region of the radiation spectrum. This UV radiation is harmful to humans, and additional shielding and protective precautions such as UV-filtering goggles are needed to protect the operators of such equipment.

FIG. 66 is a side view of an inorganic LED die available. A conventional inorganic LED die is available from many manufacturers, typically has a relatively narrow radiation emission spectrum, is relatively energy efficient, has a long service life and is solid-state and durable. The die shown is an example of an AlGaAs/AlGaAs red die, obtained from Tyntek Corporation, Taiwan. These dice have dimensions roughly 12 mil×12 mil×8 mil, making them very small point light sources. As shown in FIG. 67, in a conventional LED lamp, this die is held in a metal cup so that one electrode of the die (e.g., the anode) is in contact with the base of the cup. The metal cup is part of an anode lead. The other electrode of the die (e.g., the cathode) has a very thin wire soldered or wire bonded to it, with the other end of the wire soldered or wire bonded to an anode lead. The cup, die, wire and portions of the anode and cathode leads are encased in a plastic lens with the anode and cathode leads protruding from the lens base. These leads are typically solder or wire bonded to a circuit board to selectively provide power to the die and cause it to emit light. It is very difficult to manufacture these conventional lamps due to the very small size of the die, and the need to solder or wire bond such a small wire to such a small die electrode. Further, the plastic lens material is a poor heat conductor and the cup provides little heat sink capacity. As the die heats up its efficiency is reduced, limiting the service conditions, power efficiency and light output potential of the lamp. The bulkiness of the plastic lens material and the need to solder or wire bond the lamp leads to an electrical power source limits emissive source packing density and the potential output intensity per surface area.

There is a need for a photo-radiation source that is energy efficient, generates less heat, is low cost and that has a narrow spectrum of radiation emission. There have been attempts to use inorganic light emitting diode lamps (LEDs) as photo-radiation sources. Usually, these LEDs are so-called high brightness UV radiation sources. A typical LED consists of a sub-millimeter sized die of light emitting material that is electrically connected to an anode lead and a cathode lead. The die is encased within a plastic lens material. However, the processing that takes the LED dice and turns it into an LED lamp is tedious and sophisticated, mostly due to the very small size of the LED die. It is very difficult to solder or wire bond directly to the dice, and so it is common practice to use LED lamps that are then solder or wire bonded onto a circuit board. Conventionally, UV LED lamps have been solder or wire bonded onto a circuit board in a formation to create a source of photo-radiation for photo-polymerizable organic materials.

This solution is far from optimum, since the relatively high cost of the LED lamps keeps the overall cost of the photo-radiation source high. There is a need for a photo-radiation source that can use the LED dice directly, without the need for the lamp construction or a direct solder or wire bonded connection between the anode and cathode of the die. Such as system would have an efficient die packing density, enabling a high-intensity photo-radiation source having a narrow emission band.

Wantanabe et al., published patent application U.S. 2004/0195576A1, teaches a device and method for forming a transparent electrode over the light-emitting portion of an LED die. This reference is concerned with overcoming the difficulty of forming an electrode accurately at the light output surface of a minute LED device (10 square microns). A conventional LED is 300 square microns. The reference states that forming a transparent electrode on a semiconductor device so as not to shield emitted light is already known. The crux of the Wantanabe invention is to form a transparent electrode directly and specifically over the light output face of a tiny LED device, or an array of such devices, instead of the conventional bonding or soldering of an opaque wire to connect the LED device to a power supply line or lead. To form the transparent electrode on such a small device, this reference teaches the use of semiconductor and/or printed circuit board techniques.

An example of the steps of forming the Wantanabe device consist of:

1) Providing a substrate
2) Forming p-side wiring on the substrate
3) Transferring a light emitting diode onto the substrate so the p side of the diode is connected to the wiring
4) Forming an insulation resin layer to cover the substrate, wiring and diode
5) Selectively removing the insulation resin to expose the n-side surfaces of the diode
6) Forming n-side wiring on the surface of the insulation resin
7) Forming a transparent electrode connecting the n-side of the diode to the n-side wiring The steps for forming the transparent electrode are:

7a) Forming a resist film to cover the insulation resin and the exposed n-side surfaces
7b) Selectively removing the resist layer to form an opening portion defining the light output surface of the diode and the n-side wiring
7c) Applying an electrode paste to the opening portion and the resist film
7d) Removing the electrode paste from the resist film to leave electrode paste only where the opening portion is so that the light output surface of the diode and the n-side wiring are connected.

There are variations disclosed to the various steps and materials used, but in essence, the same cumbersome PCB-type processes are described in each of the examples. This reference shows that it is known to form a transparent electrode using PCB techniques on the light output surface of a diode to reduce the shielding of light emitted from the diode. But, replacing the conventionally-used opaque wire with a transparent electrode film is not new and is in the public domain (see, Lawrence et al, U.S. Pat. No. 4,495,514).

Oberman, U.S. Pat. No. 5,925,897, teaches using a diode powder between conductive contacts, forming a conductor/emissive layer/conductor device structure. The diode powder consists of crystal particles 10-100 microns in size. The diode powder is formed by heating a mixture of In and Ga in a crucible and flowing nitrogen gas over the heated mixture. This powder now contains all n-type material. The powder is adhered to a glass plate that is coated with an appropriate contact metal. A p-type dopant is diffused into the powder crystals to form a p-region and the p-n diode junction. A top substrate with a transparent conductive surface is placed on the powder and the entire structure thermally annealed to enhance the adhesion of the powder to the upper contact. Oberman states that the conventional LED is typically fabricated by connecting electrical contacts to the p and n regions of individual dies, and enclosing the entire LED die in a plastic package. Oberman's diode powder is specifically based on an observation that surfaces, interfaces and dislocations appear to not adversely affect the light emitting properties of III-V nitrides. This reference says that the state-of-the-art nitride LED is grown on a sapphire substrate, and since sapphire is non-conducting, both electrical contacts are made from the top of the structure.

Wickenden et al., U.S. Pat. No. 4,335,501, teaches a method for manufacturing a monolithic LED array. The individual LEDs are formed by cutting isolation channels through a slice of n-type material. The channels are cut in two steps, a first step is cutting a gap into the back of the slice of n-type material and then this gap is filled with glass. Then, in a second step the front of the slice is cut to complete the channel and the front cut is also filled with glass. Once the isolation channels have been formed, the tops of the remaining blocks of n-type material are doped to become p-type and the n-p junction of each LED formed. Beam leads are formed connecting the p-regions of the LEDs.

Nath, et al., WO92/06144 and U.S. Pat. No. 5,273,608, teaches a method for laminating thin film photovoltaic devices with a protective sheet. The method provides the encapsulation of thin-film devices such as flexible solar cells within a top insulating substrate and a bottom insulating substrate. Nath's description of the relevant prior art shows that encapsulating thin film devices between insulating sheets is not new. This reference teaches that the use of a heated roller is undesirable. Nath's invention is to a specific method that heats a whole roll of composite material all at once to avoid the use of heated rollers. Nath teaches a new method for protecting and encapsulating thin film devices. Encapsulating thin film devices between insulating sheets is not new, but Nath teaches a specific method that avoids the use of heated rollers.

SUMMARY OF THE INVENTION

The present invention is intended to overcome the drawbacks of the prior art. It is an object of the present invention to provide methods for manufacturing solid-state light active devices. It is another object of the present invention to provide device structures for solid-state light active devices. It is still another object of the present invention to provide a photo-radiation source for the selective polymerization of photo-radiation-curable organic material. It is yet another object of the present invention to provide a method of making a light sheet material. It is yet another object of the present invention to provide a method of manufacturing an encapsulated semiconductor circuit using a roll-to-roll fabrication process.

The present invention pertains to a method of making a light active sheet. A bottom substrate having an electrically conductive surface is provided. A hotmelt adhesive sheet is provided. Light active semiconductor elements, such as LED die, are embedded in the hotmelt adhesive sheet. The LED die each has a top electrode and a bottom electrode. A top transparent substrate is provided having a transparent conductive layer. The hotmelt adhesive sheet with the embedded LED die is inserted between the electrically conductive surface and the transparent conductive layer to form a lamination. The lamination is run through a heated pressure roller system to melt the hotmelt adhesive sheet and electrically insulate and bind the top substrate to the bottom substrate. As the hotmelt sheet is softened, the LED die breakthrough so that the top electrode comes into electrical contact with the transparent conductive layer of the top substrate and the bottom electrode comes into electrical contact with the electrically conductive surface of the bottom substrate. Thus, the p and n sides of each LED die are automatically connected to the top conductive layer and the bottom conductive surface. Each LED die is encapsulated and secured between the substrates in the flexible, hotmelt adhesive sheet layer. The bottom substrate, the hotmelt adhesive (with the embedded LED die) and the top substrate can be provided as rolls of material. The rolls are brought together in a continuous roll fabrication process, resulting in a flexible sheet of lighting material.

This simple device architecture is readily adaptable to a high yield, low cost, roll-to-roll fabrication process. Applicants have proven the device architecture and method are effective by making many proof-of-concept prototypes. FIG. 119 shows photographs of working prototypes constructed in accordance with the inventive method for manufacturing an inorganic light sheet. FIG. 128(*a*) is a photograph showing a step of the proof-of-concept prototype construction, this photo shows an active layer sheet comprised of LED die embedded in a sheet of hotmelt adhesive, the LED die being red emitting and yellow emitting. FIG. 128(*b*) is a photograph showing another step of the proof-of-concept prototype construction, this photo shows the three constituent layers—active layer sheet (LED die embedded in a sheet of hotmelt adhesive), a top substrate (ITO coated PET) and a bottom substrate (ITO coated PET). FIG. 128(*c*) is a photograph showing another step of the proof-of-concept prototype construction, this photo shows the three constituent layers with the active layer between the substrates to form an assembly. FIG. 128(*d*) is a photograph showing another step of the proof-of-concept prototype construction, this photo shows the assembled lamination being passed through a heat laminator to activate the hotmelt sheet by melting between pressure rollers.

Applicants have discovered that as the hotmelt sheet is softened, the LED dice breakthrough the adhesive so that the top electrode comes into electrical contact with the transparent conductive layer of the top substrate and the bottom electrode comes into electrical contact with the electrically conductive surface of the bottom substrate. Thus, the p and n sides of each LED die are automatically connected to the top conductive layer and the bottom conductive surface. Each LED die is completely encapsulated within the hotmelt adhesive and the substrates. In addition, the LED dice are each permanently secured between the substrates in the flexible, hotmelt adhesive sheet layer. FIG. 128(*e*) is a photograph showing the just constructed proof-of-concept prototype being applied a voltage of a polarity and lighting up the yellow LED die. FIG. 128(*f*) is a photograph showing the just constructed proof-of-concept prototype being applied a voltage of the opposite polarity and lighting up the red LED die.

In accordance with an aspect of the present invention, a method of making a light active sheet is provided. A bottom substrate having an electrically conductive surface is provided. An electrically insulative adhesive is provided. Light active semiconductor elements, such as LED die, are fixed to the electrically insulative adhesive. The light active semiconductor elements each have an n-side and a p-side. A top transparent substrate is provided having a transparent conductive layer.

The electrically insulative adhesive having the light active semiconductor elements fixed thereon is inserted between the electrically conductive surface and the transparent conductive layer to form a lamination. The electrically insulative adhesive is activated to electrically insulate and bind the top substrate to the bottom substrate. The device structure is thus formed so that either the n-side or the p-side of the light active semiconductor elements are in electrical communication with the transparent conductive layer of the top substrate, and so that the other of the n-side or the p-side of each the light active semiconductor elements are in electrical communication with the electrically conductive surface of the bottom substrate to form a light active device. In accordance with the present invention, p and n sides of each LED die are automatically connected and maintained to the respective top and bottom conductor, completely securing each LED die between the substrates in a flexible, hotmelt adhesive sheet layer.

The bottom substrate, the electrically insulative adhesive and the top substrate can be provided as respective rolls of material. This enables the bottom substrate, the electrically insulative adhesive (with the LED die embedded therein) and the top substrate together in a continuous roll fabrication process. It is noted that these three rolls are all that are necessary for forming the most basic working device structure in accordance with the present invention. This simple and uncomplicated structure is inherently adaptable to a high yield, continuous, roll-to-roll fabrication techniques that is not obtainable using prior art techniques.

In a preferred embodiment, the electrically insulative adhesive comprises a hotmelt material. The step of activating comprises applying heat and pressure to the lamination to soften the hotmelt material. At least one of the heat and pressure are provided by rollers. Alternatively, the adhesive may be composed so that activating it comprises at least one of solvent action (e.g., silicone adhesive), catalytic reaction (e.g., epoxy and hardner) and radiation curing (e.g., UV curable polymer adhesive).

The light active semiconductor elements can be light emitting diode die such as is readily commercially available from semiconductor foundries. The light active semiconductor elements may alternatively or additionally be light-to-energy devices, such as solar cell devices. To make white light, a first portion of the light active semiconductor elements emit a first wavelength of radiation and second portion of the light active semiconductor elements emit a second wavelength of radiation. Alternatively, yellow light emitting LED die and blue light emitting LED die can be provided in proper proportions to create a desired white light appearance. Diffusers can be included within the adhesive, substrates or as a coating on the substrates and/or the adhesive to create a more uniform glowing surface.

The electrically insulative adhesive can be a hotmelt sheet material, such as that available from Bemis Associates, Shirley, Mass. The light active semiconductor elements can be pre-embedded into the hotmelt sheet before the step of inserting the adhesive sheet between the substrates. In this way, the hotmelt sheet can have the semiconductor devices embedded off-line so that multiple embedding lines can supply a roll-to-roll fabrication line. A predetermined pattern of the light active semiconductor elements can be formed embedded in the hotmelt sheet. The predetermined pattern can be formed by electrostatically attracting a plurality of light active semiconductor elements on a transfer member, similar to a laser printer electrostatic drum, and transferring the predetermined pattern onto the insulative adhesive.

The predetermined pattern of the light active semiconductor elements can be formed by magnetically attracting a plurality of light active semiconductor elements on a transfer member, such as an optomagnetically coated drum, and transferring the predetermined pattern onto the insulative adhesive. The predetermined pattern of the light active semiconductor elements can be formed using conventional pick and place machines. Or, an adhesive transfer method, described in detail herein, can be employed. In this case, the predetermined pattern is formed by transferring the semiconductor elements from a relatively lower tack adhesive to a relatively higher tack adhesive.

The transparent conductive layer can be formed by printing a transparent conductive material, such as ITO particles in a polymer binder, to form conductive light transmissive connecting lands. Each land is provided for connecting with a respective light active semiconductor. A relatively higher conducting line pattern can be formed on at least one of the top substrate and the bottom substrate for providing a relatively lower path of resistance from a power supply source to each light active semiconductor element.

The electrically conductive surface and the electrically conductive pattern may comprise a respective x and y wiring grid for selectively addressing individual light active semiconductor elements for forming a display.

Color light can be provided by including LED capable of emitting different wavelengths of light. For example, a red emitting LED combined with a yellow emitting LED when driven together and located near each other will be perceived by the human eye as generating an orange light. White light can be generated by combining yellow and blue LED dice, or red, green and blue dice. A phosphor can be provided in the lamination. The phosphor is optically stimulated by a radiation emission of a first wavelength (e.g., blue) from the light active semiconductor element (e.g., LED die) to emit light of a second wavelength (e.g., yellow).

In accordance with another aspect of the present invention, a method is provided for making an electronically active sheet. The electronically active sheet has a very thin and highly flexible form factor. It can be manufactured using the low cost, high yield continuous roll-to-roll fabrication method described herein. The electronically active sheet can be used for making a lighting device, a display, a light-to-energy device, a flexible electronic circuit, and many other electronic devices. The semiconductor elements can include resistors, transistors, diodes, and any other semiconductor element having a top and bottom electrode format. Other electronic elements can be provided in combination or separately and employed as components of the fabricated flexible electronic circuit. The inventive steps for forming the electronically active sheet include providing a bottom planar substrate having an electrically conductive surface. An adhesive is provided and at least one semiconductor element is fixed to the adhesive. Each semiconductor element has a top conductor and a bottom conductor. A top substrate is provided having an electrically conductive pattern disposed thereon.

The adhesive with semiconductor element fixed thereto is inserted between the electrically conductive surface and the electrically conductive pattern to form a lamination. The adhesive is activated to bind the top substrate to the bottom substrate so that one of top conductor and bottom conductor of semiconductor element is automatically brought into and maintained in electrical communication with the electrically conductive pattern of the top substrate and so that the other of the top conductor and the bottom conductor of each semiconductor element is automatically brought into and maintained in electrical communication with the electrically conductive surface of the bottom substrate to form an electronically active sheet.

In accordance with another aspect of the present invention, a method is provided for making an encapsulated semiconductor device. A bottom substrate is provided having an electrically conductive surface. An adhesive layer is provided on the electrically conductive surface. A predetermined pattern of semiconductor elements are fixed to the adhesive. The semiconductor elements each having a top device conductor and a bottom device conductor. A top substrate having a conductive pattern disposed thereon. A lamination is formed comprising the bottom substrate, the adhesive layer (with the semiconductor elements) and the top substrate. The lamination is formed so that the adhesive electrically insulates and binds the top substrate to the bottom substrate. In so doing, one of the top device conductor and bottom device conductor of the semiconductor elements is in electrical communication with the conductive pattern of the top substrate and the other of the top device conductor and bottom device conductor of each semiconductor element is in electrical communication with the electrically conductive layer of the bottom substrate. In this manner, each semiconductor element is automatically connected to the top and bottom conductors that are preformed on the top and bottom substrates. There is no need for wirebonding, solder, lead wires, or other electrical connection elements or steps.

In accordance with another aspect of the present invention, at least one the semiconductor elements is provided with a middle conductor region between the top conductor and the bottom conductor. For example, the semiconductor can be an npn or pnp transistor. The adhesive comprises at least one electrically conductive portion for making an electrical connection with the middle conductor region.

The inventive light active sheet consists of a bottom substrate flexible sheet having an electrically conductive surface. A top transparent substrate flexible sheet has a transparent conductive layer disposed on it. An electrically insulative adhesive flexible sheet has light active semiconductor elements fixed to it. The light active semiconductor elements each have an n-side and a p-side. The electrically insulative adhesive sheet having the light active semiconductor elements fixed to it is inserted between the electrically conductive surface and the transparent conductive layer to form a lamination, The adhesive sheet is activated so that the electrically insulative adhesive electrically insulates and binds the top substrate sheet to the bottom substrate sheet. When the adhesive sheet is activated, one of the n-side or the p-side of the light active semiconductor elements is automatically brought into electrical communication with the transparent conductive layer of the top substrate sheet. The other of the n-side or the p-side is automatically brought into electrical communication with the electrically conductive surface of the bottom substrate sheet to form a light active device.

Due to the automatic assembly nature of the inventive light sheet, the bottom substrate, the electrically insulative adhesive and the top substrate can be provided as respective rolls of material. The electrically insulative adhesive can have the semiconductor elements pre-embedded into it and re-rolled, or the embedding of the semiconductor elements can be performed in line during the fabrication process. The adhesive is inserted between the substrates by bringing the bottom substrate, the electrically insulative adhesive and the top substrate together in a continuous roll fabrication process.

The electrically insulative adhesive preferably comprises a hotmelt material activatable by applying heat and pressure to the lamination to soften the hotmelt material. Alternatively, or additionally, the adhesive may be activatable by at least one of solvent action, evaporation, catalytic reaction and radiation curing.

The light active semiconductor elements can be light emitting diode die, or other semiconductor and circuit elements, such as transistors, resistors, conductors, etc. They can be connected in an electronic circuit through the inventive hotmelt lamination method described herein. Further, the light active semiconductor elements can be light-to-energy devices, such as diodes effective for converting sunlight to electrical energy.

In the case of light emitting diodes, a first portion of the light active semiconductor elements can emit a first wavelength of radiation and a second portion of the light active semiconductor elements emit a second wavelength of radiation. With this construction, the light active sheet can be effective for generating multiple colors and white light.

The electrically insulative adhesive can comprise a hotmelt sheet material, and the light active semiconductor elements can be pre-embedded into the hotmelt sheet before forming the lamination. The light active semiconductor elements can be formed into a predetermined pattern. The predetermined pattern can be formed by electrostatically attracting a plurality of light active semiconductor elements on a transfer member and transferring the predetermined pattern onto the insulative adhesive. Alternatively, or additionally, the light active semiconductor elements can be formed into the predetermined pattern by magnetically attracting the plurality of light active semiconductor elements on a transfer member and transferring the predetermined pattern onto the insulative adhesive.

The transparent conductive layer may comprise a transparent conductive material formed as conductive light transmissive connecting lands, each land for connecting with a respective light active semiconductor. A relatively higher conducting line pattern can be formed on at least one of the top substrate and the bottom substrate for providing a relatively lower path of resistance from a power supply source to each light active semiconductor element.

The electrically conductive surface and the electrically conductive pattern can comprise a respective x and y wiring grid for selectively addressing individual light active semiconductor elements for forming a display.

A phosphor can be provided in the lamination. The phosphor is optically stimulated by a radiation emission of a first wavelength from the light active semiconductor element to emit light of a second wavelength. With this construction, white light can be generated using a blue emitting LED and yellow emitting phosphors.

In accordance with another aspect of the present invention, an electronically active sheet comprises a bottom planar substrate having an electrically conductive surface. A top substrate having an electrically conductive pattern disposed thereon is also included. At least one semiconductor element having a top conductor and a bottom conductor is embedded in an adhesive sheet. The adhesive sheet is disposed between the electrically conductive surface and the electrically conductive pattern to form a lamination. The adhesive is activatable to bind the top substrate to the bottom substrate so that either the top conductor or the bottom conductor of the semiconductor element is automatically brought into and maintained in electrical communication with the electrically conductive pattern of the top substrate. The other of the top conductor and the bottom conductor of each semiconductor element is also automatically brought into and maintained in electrical communication with the electrically conductive surface of the bottom substrate to form an electronically active sheet.

With this construction, an electronically active sheet is formable using a high yield roll-to-roll fabrication method. In this case, the bottom substrate, the adhesive and the top substrate are all provided as respective rolls of material. The bottom substrate, the adhesive and the top substrate are brought together in a continuous roll fabrication process. The adhesive may comprise a hotmelt sheet material activatable by applying heat and pressure to the lamination to soften the hotmelt material. Alternatively, the adhesive is activatable by at least one of solvent action, evaporation, catalytic reaction and radiation curing of the adhesive. In any case, the adhesive can be provided as a sheet, and have the semiconductor elements pre-embedded into the sheet in a predetermined pattern before forming the lamination. Or, the adhesive can be printed, coated, or otherwise applied onto one of the substrates, and then the semiconductor elements disposed thereon.

The predetermined pattern of the semiconductor elements can be formed by electrostatically attracting a plurality of the semiconductor elements on a transfer member and transferring the predetermined pattern onto the adhesive. The predetermined pattern of the semiconductor elements can be formed by magnetically attracting a plurality of the semiconductor elements on a transfer member and transferring the predetermined pattern onto the adhesive. The predetermined pattern of the semiconductor elements can be formed using a pick and place device.

In accordance with another aspect of the invention, an encapsulated semiconductor device includes a bottom substrate having an electrically conductive surface. A top substrate has an electrically conductive pattern disposed thereon, the conductive pattern can be formed by coating, sputtering, printing, photolithography or other pattern forming method.

A predetermined pattern of semiconductor elements, each semiconductor element having a top device conductor and a bottom device conductor is fixed to an adhesive. The adhesive is disposed between the electrically conductive surface and the electrically conductive pattern to form a lamination. The adhesive is activated to bind the top substrate to the bottom substrate so that either the top conductor or the bottom conductor of each semiconductor element is automatically brought into and maintained in electrical communication with the electrically conductive pattern of the top substrate. Also, the other of the top conductor or the bottom conductor of each semiconductor element is automatically brought into and maintained in electrical communication with the electrically conductive surface of the bottom substrate to form an electronically active sheet.

In accordance with the present invention, the semiconductor elements includes a middle conductor region between the top conductor and the bottom conductor, for example, an n-p-n transistor element. The adhesive can comprise at least one electrically conductive portion for making an electrical connection with the middle conductor region.

The bottom substrate, the adhesive and the top substrate can be provided as respective rolls of material and the lamination formed by bringing the bottom substrate, the electrically insulative adhesive and the top substrate together in a continuous roll fabrication process.

The adhesive can be a hotmelt sheet material activatable by applying heat and pressure to the lamination to soften the hotmelt material. The pattern of semiconductor elements can be pre-embedded into the hotmelt sheet before forming the lamination. The predetermined pattern of the semiconductor elements can formed by electrostatically attracting a plurality of semiconductor elements on a transfer member and transferring the predetermined pattern onto the adhesive. The predetermined pattern of the semiconductor elements can be formed by magnetically attracting the plurality of semiconductor elements on a transfer member and transferring the predetermined pattern onto the adhesive. The predetermined pattern of the semiconductor elements can be formed using a pick and place device. The predetermined pattern of the semiconductor elements can also be formed by transferring the semiconductor elements from a relatively lower tack adhesive to a relatively higher tack adhesive.

In accordance with the present invention, substrate sheets are provided with a precoated transparent conductor film. The p and n sides of each LED die are automatically connected to the respective top and bottom conductor, completely securing each LED die between the substrates in a flexible, hotmelt adhesive sheet layer. There are no resist films to form, pattern and etch away. The transparent electrode is not necessarily formed only on each emissive device using elaborate semiconductor patterning and etching techniques.

In accordance with the present invention, LED die cut from a semiconductor wafer are utilized as light sources. The die are typically 300 microns square by 200 microns high.

The inventive device includes conventional LED die between sheets of conductive substrates.

In accordance with the present invention, a conductor/emissive layer/conductor device structure has an emissive layer made from an array of commercially available conventional LED die. A thin sheet of light is formed using a continuous roll-to-roll manufacturing method, and using conventional LED die that are commercially available from many sources.

In accordance with the inventive system, an unexpected result is obtained wherein an LED die array can be pre-embedded into a hotmelt sheet adhesive layer, forming the active layer of the device. This active layer is disposed between top and bottom sheet substrates. When the hotmelt is heated, the entire structure fuses together, locking in the LED die between the substrates. There is solid and flexible adhesive completely surrounding and securing each die, except at the contact surfaces with the planar electrode, and permanently securing the top substrate to the bottom substrate.

Apparently the hotmelt material does not wet the surface of the LED die and so when the hotmelt material is melted, the p surface and the n surface of the die become exposed and make electrical contact with the conductive surfaces of the top and bottom substrates. When the hotmelt adhesive cools and hardens, the intimate electrical contact between the LED die and the conductive surfaces is secured, making an extremely thin, easily formed, extremely robust and highly flexible light sheet device.

The resulting device structure is easily manufactured in a continuous roll-to-roll process, there are no resist layers to form, pattern and remove, there is no doping in-place of the emissive elements, there are no alignment issues for making contact with the p and n surfaces of the die. In the inventive system, these p and n surfaces automatically make contact with the respective conductive surfaces when the hotmelt is in its plastic or softened state and the lamination is placed between pressure rollers. Then, when the hotmelt hardens, the entire structure is fused into one coherent laminated composite sheet, with each die securely locked in electrical contact with the planar conductors of the top and bottom substrates. The entire device consists of just three sheet layers (the two substrates and the hotmelt/dice active layer) that can each be prepared off-line and put into rolls.

The present invention is provided for making sheets of inorganic LED lighting material. Substrate sheets may be utilized with precoated conductive films, or the conductive films can be printed and patterned directly onto the substrates. One film is a transparent conductor. The conductive films provide each of a plurality of LED die with a direct, face-to-face electrical connection, device-protecting resistance, and an optically transparent window for emitting light. In accordance with the present invention, when a hotmelt sheet melts under the pressure of a heated pressure roller, the LED die are squeezed between the substrate sheets and the top and/or bottom face of each die breaks through the hotmelt adhesive sheet and comes in face-to-face contact with the precoated conductive films. This enables each die to be automatically connected to the top and bottom conductor.

In accordance with another aspect of the invention, a method is provided for forming a sheet of light active material. A first substrate is provided having a transparent first conductive layer. A pattern of light active semiconductor elements are formed. The light active semiconductor elements have an n-side and a p-side. Each light active semiconductor element has either of the n-side or the p-side in electrical communication with the transparent conductive layer. A second substrate having a second conductive layer is provided. The second substrate is secured to the first substrate so that the other of the n-side or the p-side of each light active semiconductor element in electrical communication with the second conductive layer. Thus, a solid-state sheet of light active material is formed.

The transparent first conductive layer may comprise a transparent coating preformed on the first substrate. The transparent coating can be applied as a conductive ink or conductive adhesive.

The pattern of light active semiconductor elements can be formed by electrostatically attracting the light active semiconductor elements to a transfer member. Then, transferring the attracted light active semiconductor elements from the transfer member to the first substrate. The transfer member may include an opto-electric coating effective for holding a patterned electrostatic charge. The patterned electrostatic charge is effective for electrostatically attracting the light active semiconductor elements and forming the pattern of light active semiconductor elements. The optical patterning of the opto-electric coating can be done, for example, using a scanned laser beam and an LED light source, similar to the process used by laser or LED printers. Thus, the transfer member may comprise a drum.

An adhesive pattern can be formed on the first substrate for adhering the pattern of light active semiconductor elements to the first substrate. Alternatively, or additionally, an adhesive pattern can also be formed on the first substrate for adhering the second substrate to the first substrate.

A pattern of light active semiconductor elements can be formed by forming a first pattern of first light active semiconductor elements and forming a second pattern of second light active semiconductor elements. The first light active semiconductor elements emit light having a first color and the second light active semiconductor elements emit light having a second color. Alternatively, the first light active semiconductor elements emit light and the second light active semiconductor elements convert light to electrical energy.

The first conductive layer may be formed as a grid of x-electrodes, and the second conductive layer formed as a grid of y-electrodes, so that each respective light active semiconductor element is addressable for forming a sheet of light active material capable of functioning as a pixelated display component.

The pattern of light active semiconductor elements can be formed by forming a first pattern of first color light emitting semiconductor elements, forming a second pattern of second color light emitting semiconductor elements and forming a third pattern of third color light emitting semiconductor element. The first conductive layer may be formed as a grid of x-electrodes, and the second conductive layer formed as a grid of y-electrodes, so that each respective light active semiconductor is addressable for forming a sheet of light active material capable of functioning as a full-color pixelated display component.

In accordance with another aspect of the invention, a method is provided for forming a light-emitting device. A first substrate is provided. A first conductive surface is formed on the first substrate. A pattern of LED dice is formed on the conductive pattern. Each LED die has an anode and a cathode side. A second substrate is provided. A second conductive surface is formed on the second substrate. The first substrate is fixed to the second substrate so that either of the anode and the cathode side of the LED die is in electrical communication with the first conductive surface, and the other of the anode and the cathode side of the LED dice is in electrical communication with the second conductive surface.

The first conductive surface may be formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

An adhesive layer may be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer includes at least one of a re-emitter, a light-scatterer, an adhesive, and a conductor.

The pattern of LED dice can be formed by electrostatically attracting the LED dice to a transfer member, and then transferring the attracted LED dice from the transfer member to the first conductive surface. The transfer member may include an opto-electric coating effective for holding a patterned electrostatic charge, the patterned electrostatic charge being effective for electrostatically attracting and forming the pattern of LED dice. The the opto-electric coating can be patterned using at least one of a scanned laser beam and an LED light source. The transfer member may be a drum, a flat planar member, or other shape.

In accordance with another aspect of the invention, a method is provided for forming a light-to-energy device. A first substrate is provided. A first conductive surface is formed on the first substrate. A pattern of semiconductor elements is formed on the conductive pattern. Each semiconductor element comprises a charge donor side and a charge acceptor side. A second substrate is provided. A second conductive surface is formed on the second substrate. The first substrate is fixed to the second substrate so that either of the charge donor and the charge acceptor side of the semiconductor elements is in electrical communication with the first conductive surface and the other of the charge donor and the charge acceptor side of the semiconductor elements is in electrical communication with the second conductive surface.

The first conductive surface is formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface may be formed using a printing method. The printing method may comprise at least one of an inkjet printing method, a laser printing method, a silk-screen printing method, a gravure printing method and a donor transfer sheet printing method.

An adhesive layer can be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer, wherein the function-enhancing layer includes at least one of a re-emitter, a light-scatterer, an adhesive, and a conductor.

The pattern of LED dice can be formed by electrostatically attracting the LED dice to a transfer member, and then transferring the attracted LED dice from the transfer member to the first conductive surface. The transfer member may include an opto-electric coating effective for holding a patterned electrostatic charge, the patterned electrostatic charge being effective for electrostatically attracting and forming the pattern of LED dice. The opto-electric coating can be patterned using at least one of a scanned laser beam and an LED light source. The transfer member may be shaped as a drum, a flat planar member, or other shape.

In accordance with another aspect of the invention, device structures are provided for sheets of light active material. A first substrate has a transparent first conductive layer. A pattern of light active semiconductor elements fixed to the first substrate. The light active semiconductor elements have an n-side and a p-side. Each light active semiconductor element has either of the n-side or the p-side in electrical communication with the transparent conductive layer. A second substrate has a second conductive layer. An adhesive secures the second substrate to the first substrate so that the other of the n-side or the p-side of each light active semiconductor element is in electrical communication with the second conductive layer. Thus, a solid-state light active device is formed.

The transparent first conductive layer may comprise a transparent coating preformed on the first substrate. The transparent coating can be a conductive ink or conductive adhesive. An adhesive pattern may be formed on the first substrate for adhering the pattern of light active semiconductor elements to the first substrate. Alternatively, or additionally, an adhesive pattern may be formed on the first substrate for adhering the second substrate to the first substrate.

The pattern of light active semiconductor elements may comprise a first pattern of first light active semiconductor elements and a second pattern of second light active semiconductor elements. The first light active semiconductor elements may emit light having a first color and the second light active semiconductor elements emit light having a second color. Alternatively, the first light active semiconductor elements may emit light and the second light active semiconductor elements convert light to electrical energy.

The first conductive layer may be formed as a grid of x-electrodes, and the second conductive layer formed as a grid of y-electrodes. Each respective light active semiconductor element is disposed at the respective intersections of the x and y grid and are thus addressable for forming a sheet of light active material capable of functioning as a pixelated display component.

The pattern of light active semiconductor elements may comprise a first pattern of first color light emitting semiconductor elements, a second pattern of second color light emitting semiconductor elements and a third pattern of third color light emitting semiconductor element. The first conductive layer may be formed as a grid of x-electrodes, and the second conductive layer being formed as a grid of y-electrodes. The respective first, second and third color light emitting elements may be disposed at the intersections of the x and y grid so that each respective light active semiconductor is addressable. Thus, a sheet of light active material is formed capable of functioning as a full-color pixelated display component.

In accordance with another aspect of the invention, a light-emitting device comprises a first substrate. A first conductive surface is formed on the first substrate. A pattern of LED dice is formed on the conductive pattern. Each LED die has an anode and a cathode side. A second substrate has a second conductive surface formed on it. An adhesive fixes the first substrate to the second substrate so that either of the anode and the cathode side of the LED die is in electrical communication with the first conductive surface, and the other of the anode and the cathode side of the LED dice is in electrical communication with the second conductive surface.

The first conductive surface can be formed as a conductive pattern comprised of at least one of a conductive coating, a conductive ink and a conductive adhesive. At least one of the first and the second conductive surface is a transparent conductor. At least one of the first and the second conductive surface can be preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

The adhesive layer is provided between the top substrate and the bottom substrate. The adhesive layer can comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer may include at least one of a re-emitter, a light-scatterer, an adhesive, and a conductor.

In accordance with another aspect of the invention, a light-to-energy device comprises a first substrate. A first conductive surface is formed on the first substrate. A pattern of semiconductor elements is formed on the conductive pattern. Each semiconductor element includes a charge donor layer side and a charge acceptor side. A second substrate is provided having a second conductive surface formed on it. An adhesive fixes the first substrate to the second substrate so that either of the charge donor and the charge acceptor side of the semiconductor elements is in electrical communication with the first conductive surface, and the other of the charge donor and the charge acceptor side of the semiconductor elements is in electrical communication with the second conductive surface.

The first conductive surface may be formed as a conductive pattern comprised of at least one of a conductive coating, a conductive ink and a conductive adhesive. At least one of the first and the second conductive surface is a transparent conductor. At least one of the first and the second conductive surface may be preformed on the respective first and second substrate. The adhesive may comprise at least one of the top substrate and the bottom substrate. The adhesive layer may comprise at least one of a conductive adhesive, a semi-conductive adhesive, an insulative adhesive, a conductive polymer, a semi-conductive polymer, and an insulative polymer.

In accordance with another aspect of the present invention, the photo-radiation source includes a first electrode with a second electrode disposed adjacent to the first electrode, and defining a gap therebetween. A photo-radiation emission layer is disposed in the gap. The photo-radiation emission layer includes a charge-transport matrix material and an emissive particulate dispersed within the charge-transport matrix material. The emissive particulate receives electrical energy through the charge-transport matrix material applied as a voltage to the first electrode and the second electrode photo-radiation. The emissive particulate generates photo-radiation in response to the applied voltage. This photo-radiation is effective for the selective polymerization of photo-radiation curable organic material.

The charge-transport matrix material may be an ionic transport material, such as a fluid electrolyte or a solid electrolyte, including a solid polymer electrolyte (SPE). The solid polymer electrolyte may be a polymer electrolyte including at least one of a polyethylene glycol, a polyethylene oxide, and a polyethylene sulfide. Alternatively or additionally, the charge-transport matrix material may be an intrinsically conductive polymer. The intrinsically conductive polymer may include aromatic repeat units in a polymer backbone. The intrinsically conductive polymer may be, for example, a polythiophene.

In accordance with another aspect of the present invention, a photo-radiation source is provided for the selective polymerization of photo-radiation-curable organic material. A plurality of light emitting diode dice generate a photo-radiation spectrum effective for the selective polymerization of photo-radiation-curable organic material. Each die has an anode and a cathode. A first electrode is in contact with each anode of the respective light emitting diode dice. A second electrode is in contact with each cathode of the respective light emitting diode dice. At least one of the first electrode and the second electrode comprises a transparent conductor. The plurality of dice are permanently fixed in a formation by being squeezed between the first electrode and the second electrode without the use of solder or wire bonding. The plurality of dice are permanently fixed in a formation by being adhered to at least one of the first electrode and the second electrode using a conductive adhesive, for example, the conductive adhesive can be a metallic/polymeric paste, an intrinsically conductive polymer, or other suitable material. The intrinsically conductive polymer may comprise a benzene derivative. The intrinsically conductive polymer may comprise a polythiophene. In accordance with this embodiment of the invention, ultra-high die packing density is obtained without the need for solder or wire bonding each individual die.

In accordance with the present invention, a method of making a photo-radiation source is provided. A first planar conductor is provided and a formation of light emitting dice formed on the first planar conductor. Each die has a cathode and an anode. One of the cathode and anode of each die is in contact with the first planar conductor. A second planar conductor is disposed on top of the formation of light emitting dice, so that the second planar conductor is in contact with the other of the cathode and anode of each die. The first planar conductor is bound to the second planar conductor to permanently maintain the formation of light emitting dice. In accordance with the present invention, the formation is maintained, and the electrical contact with the conductors is obtained, without the use of solder or wire bonding for making an electrical and mechanical contact between the dice and either of the first planar conductor and the second planar conductor.

BRIEF DESCRIPTION OF THE DRAWINGS

FIG. 26(a) illustrates an inventive light sheet configured as a heads-up-display (HUD) installed as an element of a vehicle windshield;

FIG. 26(b) is a block diagram showing a driving circuit for an inventive HUD with a collision avoidance system;

FIG. 27 is an exploded view of an inventive light sheet utilized as a thin, bright, flexible, energy efficient backlight component for an LCD display system;

FIG. 40 illustrates an embodiment of the inventive light sheet being cut, stamped or otherwise shaped into a desired configuration;

FIG. 41 illustrates a cut configuration of the inventive light sheet mounted on a backing board;

FIG. 42 illustrates the cut configuration of the inventive light sheet lighting up when voltage is applied;

FIG. 43 illustrates the cut configuration of the inventive light sheet employed for light emissive signage;

FIG. 46 shows an example of a light-pipe photo-polymerization system having an embodiment of the inventive photo-radiation source;

FIG. 47 shows an example of a three-dimensional scanned curing system having an embodiment of the inventive photo-radiation source;

FIG. 53 shows an isolated view of a substrate with an optical surface for controlling the focus of light emitted from an embodiment of the inventive photo-radiation source;

FIG. 54 shows an embodiment of the inventive photo-radiation source having a flat light sheet construction with a top substrate with an optical surface;

FIG. 55 shows the inventive photo-radiation source having a curved light sheet construction shaped with a light emission enhancing curvature;

FIG. 56 is a schematic side view of the curved light sheet construction illustrating the focal point of light emission;

FIG. 62 is a cross-sectional block diagram showing the constituent parts of the inventive light active sheet;

FIG. 63 is a cross-section block diagram of an embodiment of the inventive light active sheet having a cross-linked polymer (e.g., polysiloxane-g-oglio9ethylene oxide) matrix, UV semiconductor elements, and phosphor re-emitter;

FIG. 64 is a cross-sectional block diagram of an embodiment of the inventive light active sheet having a light diffusive and/or re-emitter coating on a transparent substrate;

FIG. 65 is a cross-sectional block diagram of an embodiment of the inventive light active sheet having blue and yellow semiconductor elements, and light diffusers (e.g., glass beads) within the matrix;

FIG. 81 shows a two-part step for stretching a release substrate to create a desired spacing between semiconductor elements diced from a wafer;

FIG. 82 is an exploded view of the sheet components used to embedded the semiconductor elements into an adhesive hotmelt sheet;

FIG. 83(a) is a cross sectional view of the hotmelt sheet with embedded semiconductor elements prior to removing the semiconductor elements from the release stretch substrate;

FIG. 83(b) is a cross sectional view of the hotmelt sheet with embedded semiconductor elements after removing the semiconductor elements from the release stretch substrate;

FIG. 88 is a cross sectional view of an embodiment of the inventive light sheet configured as a full-color display pixel;

FIG. 89 is an exploded view showing the main constituent components of an embodiment of the inventive light sheet configured as a full-color display;

FIG. 90 is an exploded view showing the main constituent components of an embodiment of the inventive light sheet configured as an egress EXIT sign;

FIG. 106 is a cross sectional view of another embodiment of the present invention utilizing an insulative hotmelt adhesive strips and conductive adhesive tape structure;

FIG. 107 is an exploded view of the main constituent components of the embodiment shown in FIG. 106;

FIG. 108 is a cross sectional view of another embodiment of the present invention utilizing an insulative hotmelt adhesive strips, top conductive strips and bottom conductive adhesive tape structure;

FIG. 109 is an exploded view of the main constituent components of the embodiment shown in FIG. 108;

FIG. 110 illustrates an inventive method for manufacturing a light active sheet using conductive strips and adhesive strips in a roll-to-roll manufacturing process;

FIG. 111 illustrates an inventive method of making the active layer of the inventive light active sheet using an electrostatic drum transfer system for orienting and patterning LED dice on a hotmelt sheet;

FIG. 112 shows a first step of an inventive adhesive transfer method for fixing semiconductor elements onto an adhesive transfer substrate;

FIG. 113 shows a second step of the inventive adhesive transfer method for fixing semiconductor elements onto the adhesive transfer substrate;

FIG. 114 shows a third step of the inventive adhesive transfer method for fixing semiconductor elements onto the adhesive transfer substrate;

FIG. 115 shows a first step of an electrostatic attraction transfer method for fixing semiconductor elements onto an adhesive transfer substrate;

FIG. 116 shows a second step of the electrostatic attraction transfer method for fixing semiconductor elements onto the adhesive transfer substrate;

FIG. 117 shows a third step of the electrostatic attraction transfer method for fixing semiconductor elements onto the adhesive transfer substrate;

FIG. 118 shows a fourth step of the electrostatic attraction transfer method for fixing semiconductor elements onto the adhesive transfer substrate;

FIG. 119 shows photographs of working prototypes constructed in accordance with the inventive method for manufacturing an inorganic light sheet;

FIG. 120 is a photograph demonstrating a LED die electrostatically attracted to a charged needle;

Figure 121:
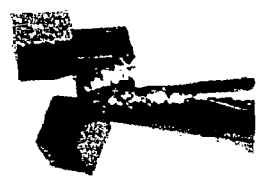
Figure 122:
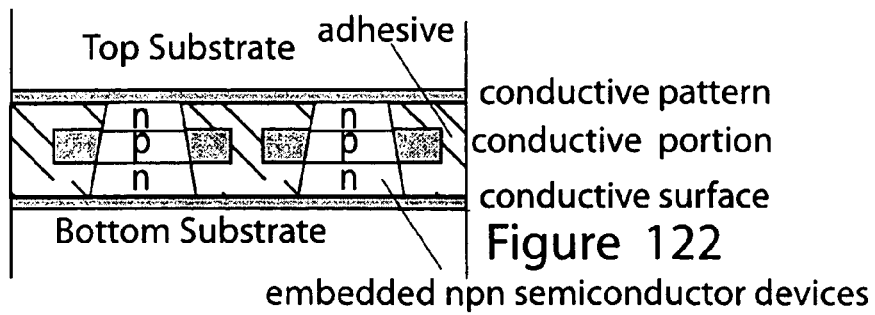
Figure 123:
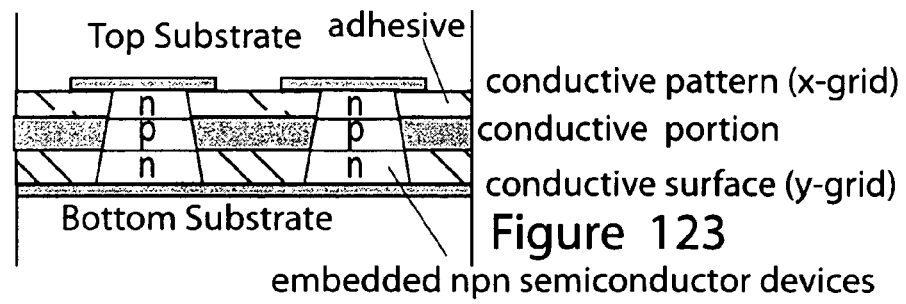
Figure 124A:
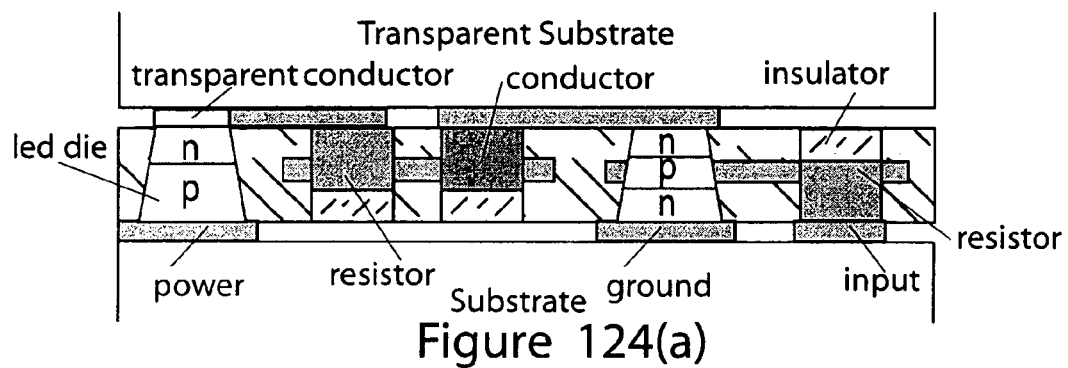
Figure 124B:
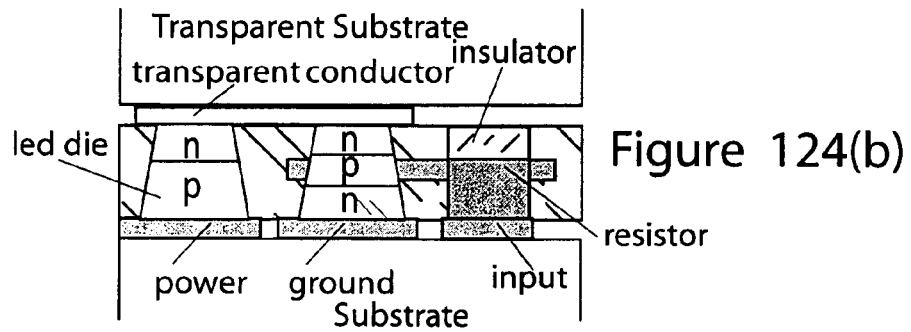
Figure 124C:
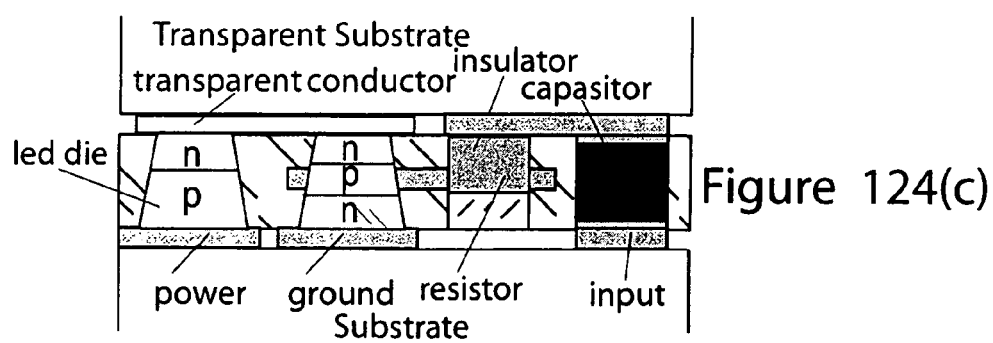

FIG. 121 is a photograph demonstrating three LED dice electrostatically attracted to a charged needle;

FIG. 122 is a cross sectional view of an inventive encapsulated semiconductor device wherein the semiconductor elements are npn-type devices, with an addressable middle p-layer;

FIG. 123 is a cross sectional view of an inventive encapsulated semiconductor device wherein the semiconductor elements are npn-type devices, with an addressable top n-layer;

FIG. 124(a) is a cross sectional view of an inventive encapsulated device electronic circuit, wherein an LED die, npn transistor, resistor and conductors are connected in an electronic circuit forming a pixel for a display device;

FIG. 124(b) is a cross sectional view of an alternative of the inventive encapsulated device electronic circuit shown in FIG. 124(a);

FIG. 124(c) is a cross sectional view of another alternative of the inventive encapsulated device electronic circuit shown in FIG. 124(a);

FIG. 124(d) is a cross sectional view of an alternative of the inventive encapsulated device electronic circuit shown in FIG. 124(a);

FIG. 125 is a circuit diagram illustrating the sub-pixel circuit shown in FIG. 124;

FIG. 126 is a cross sectional view of a pixel from an inventive display device, the pixel includes red, green and blue sub-pixel circuit and an optical lens element formed in the top substrate;

FIG. 127 is an exploded view of the inventive encapsulated semiconductor device showing a conductive sheet layer between insulative hotmelt adhesive layers;

FIG. 128(a) is a photograph showing a step of the proof-of-concept prototype construction, this photo shows an active layer sheet comprised of LED die embedded in a sheet of hotmelt adhesive, the LED die being red emitting and yellow emitting;

FIG. 128(b) is a photograph showing another step of the proof-of-concept prototype construction, this photo shows the three constituent layers—active layer sheet (LED die embedded in a sheet of hotmelt adhesive) a top substrate (ITO coated PET) and a bottom substrate (ITO coated PET);

FIG. 128(c) is a photograph showing another step of the proof-of-concept prototype construction, this photo shows the three constituent layers with the active layer between the substrates to form an assembly;

FIG. 128(d) is a photograph showing another step of the proof-of-concept prototype construction, this photo shows the assembled lamination being passed through a heat laminator to activate the hotmelt by melting between pressure rollers;

FIG. 128(e) is a photograph showing the just constructed proof-of-concept prototype being applied a voltage of a polarity and lighting up the yellow LED die; and FIG. 128(f) is a photograph showing the just constructed proof-of-concept prototype being applied a voltage of the opposite polarity and lighting up the red LED die.

DETAILED DESCRIPTION OF THE INVENTION

For purposes of promoting an understanding of the principles of the invention, reference will now be made to the embodiments illustrated in the drawings and specific language will be used to describe the same. It will nevertheless be understood that no limitation of the scope of the invention is thereby intended, there being contemplated such alterations and modifications of the illustrated device, and such further applications of the principles of the invention as disclosed herein, as would normally occur to one skilled in the art to which the invention pertains.

The various elements making up each embodiment of the inventive devices and the various steps performed in the inventive methods can be interchanged in a variety of iterations, not all of which are provided as specific embodiments or examples herein. For example, function-enhancing components, such as phosphors, described in one embodiment may be employed, although not specifically described, in an alternative construction of another embodiment. Such iterations are specifically included within the scope of the inventions described herein.

Figure 1:
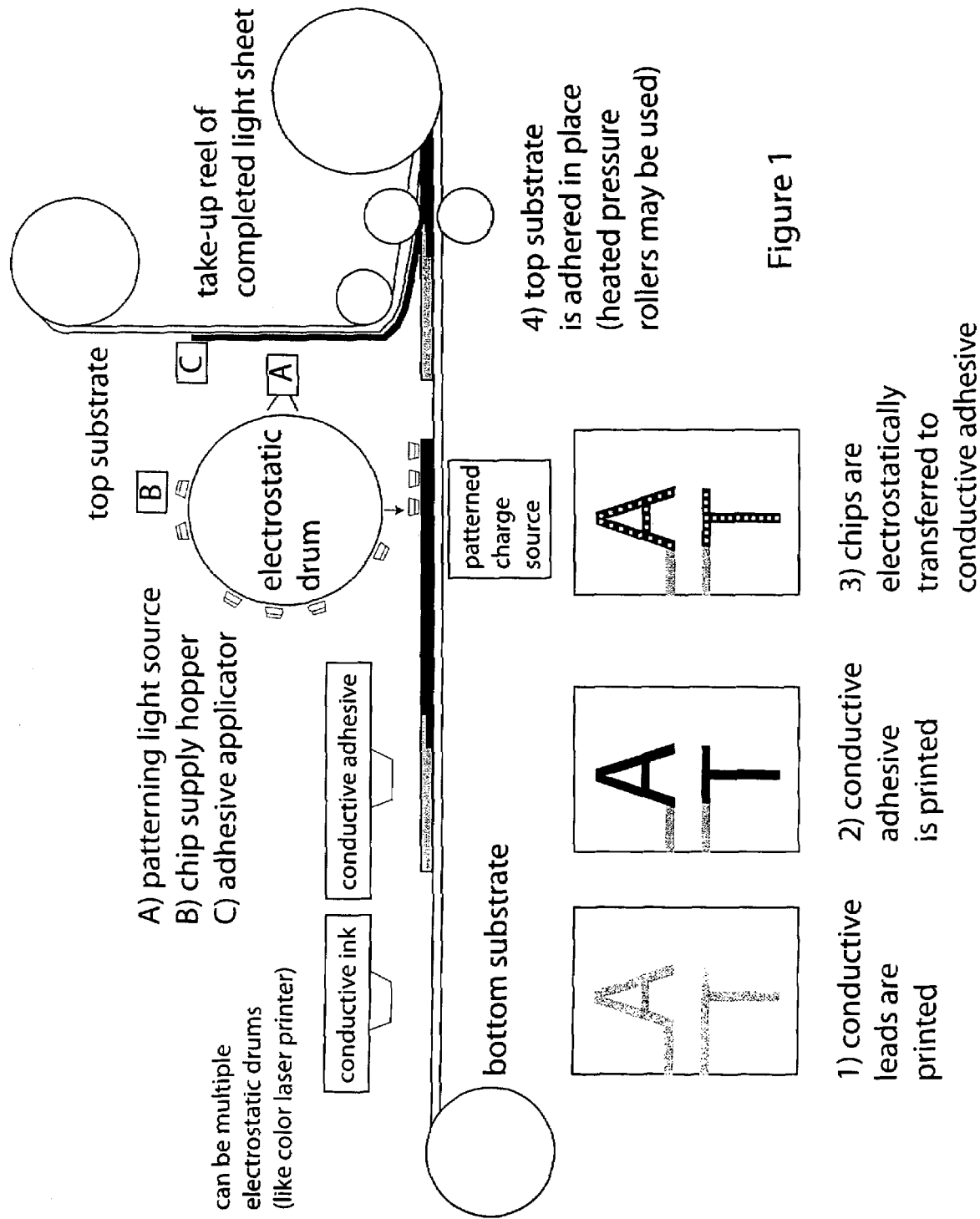
FIG. 1 illustrates the inventive method for manufacturing a patterned light active sheet.

FIG. 1 illustrates the inventive method for manufacturing a patterned light active sheet. In accordance with the present invention, a solid-state light active sheet, and a method for manufacturing the same, is provided. The solid-state light active sheet is effective for applications such as flexible solar panels and light sensors, as well as high efficiency lighting and display products. The inventive light sheet utilizes semiconductor elements, such as commercially available LED dice, to create a totally new form of solar panel, lighting, signage and display devices. The light sheet can be constructed to provide an even, diffuse solid-state lighting device that is ultra-thin, flexible and highly robust. An embodiment of the inventive manufacturing method is based on the well-known physics and mechanical and electrical components found in a conventional desktop laser printer. In essence, in accordance with this inventive embodiment, LED dice replace the toner of a laser printer. The result is a unique light sheet form factor adaptable to an extraordinarily broad range of applications. These applications range from interior tent lighting, to display backlighting, to commercial and municipal signage and traffic control signals to replacements for incandescent and fluorescent source lighting.

The inventive manufacturing process starts with a roll of flexible, plastic substrate. (1) A conductive electrode pattern is formed on the substrate through a variety of well-known printing techniques, such as inkjet printing. This electrode pattern is used to bring power to the dice. (2) Next, a conductive adhesive is printed at locations where the LED dice will be patterned. (3) Then, using an electrostatic drum and charge patterning mechanism similar to a laser printer engine, LED dice are patterned onto the electrostatic drum. The die pattern is then transferred to the adhesive areas that have been formed on the substrate. (4) A top substrate coated with a conductor is then brought in to complete the solid-state, ultra thin, flexible light sheet lamination. (5) Finally, the completed light sheet is rolled up on a take-up reel. This light sheet material can then be cut, stamped, thermoformed, bent and packaged into a wide range of new and useful solid-state lighting products.

In accordance with the invention, a method is provided for forming a sheet of light active material. A first substrate (bottom substrate, shown in FIG. 1) is provided having a transparent first conductive layer. The first substrate may be, for example, glass, flexible glass (available from Corning), PET, PAN, or other suitable polymer, Barrix (available from Vitrex) or other transparent or semi-transparent substrate material. The transparent first conductive layer may be, for example, sputter coated indium-tin-oxide (ITO), a conductive polymer, a thin metal film, or the like.

A pattern of light active semiconductor elements are formed. The light active semiconductor elements may be, for example, LED dice having an n-side and a p-side and/or light-to-energy semiconductor layered particles wherein the n- and p-side correspond to charge donor and charge acceptor layers. Each light active semiconductor element has either of the n-side or the p-side in electrical communication with the transparent conductive layer. The electrical communication may be direct (i.e., surface to surface contact) or indirect (i.e., through a conductive or semi-conductive medium). A second substrate having a second conductive layer is provided. The second substrate may be, for example, a metal foil, a metal coated polymer sheet, a conductive polymer coated metal foil or polymer sheet, or the like. The second substrate is secured to the first substrate so that the other of the n-side or said p-side of each the light active semiconductor element in electrical communication with the second conductive layer. Again, the electrical communication can be direct or indirect. Thus, in accordance with the present invention, a solid-state sheet of light active material is formed.

The transparent first conductive layer may comprise a transparent coating preformed on the first substrate. For example, the substrate may be a sheet or roll of a polymer film, such as PET or PAN, with a sputter coated conductor comprised of ITO. Alternatively, as shown in FIG. 1, the transparent coating can be applied as a conductive ink or conductive adhesive.

The pattern of light active semiconductor elements can be formed by electrostatically attracting the light active semiconductor elements to a transfer member. Then, the attracted light active semiconductor elements are transferred from the transfer member to the first substrate. The transfer member may include an opto-electric coating effective for holding a patterned electrostatic charge. The patterned electrostatic charge is effective for electrostatically attracting the light active semiconductor elements and forming the pattern of light active semiconductor elements. The optical patterning of the opto-electric coating can be done, for example, using a scanned laser beam and an LED light source, similar to the process used by laser or LED printers. Thus, the transfer member may comprise an opto-electric coated drum, and the patterning mechanism may be similar to the well-know mechanism employed for patterning toner in a laser or LED printer.

An adhesive pattern can be formed on the first substrate for adhering the pattern of light active semiconductor elements to the first substrate. Alternatively, or additionally, an adhesive pattern can also be formed on the first substrate for adhering the second substrate to the first substrate.

A pattern of light active semiconductor elements can be formed by forming a first pattern of first light active semiconductor elements and forming a second pattern of second light active semiconductor elements. The first light active semiconductor elements emit light having a first color and the second light active semiconductor elements emit light having a second color. Alternatively, the first light active semiconductor elements emit light and the second light active semiconductor elements convert light to electrical energy.

The first conductive layer may be formed as a grid of x-electrodes, and the second conductive layer formed as a grid of y-electrodes, so that each respective light active semiconductor element is addressable for forming a sheet of light active material capable of functioning as a pixelated display component.

The pattern of light active semiconductor elements can be formed by forming a first pattern of first color light emitting semiconductor elements, forming a second pattern of second color light emitting semiconductor elements and forming a third pattern of third color light emitting semiconductor element. The first conductive layer may be formed as a grid of x-electrodes, and the second conductive layer formed as a grid of y-electrodes, so that each respective light active semiconductor is addressable for forming a sheet of light active material capable of functioning as a full-color pixelated display component.

Figure 2:
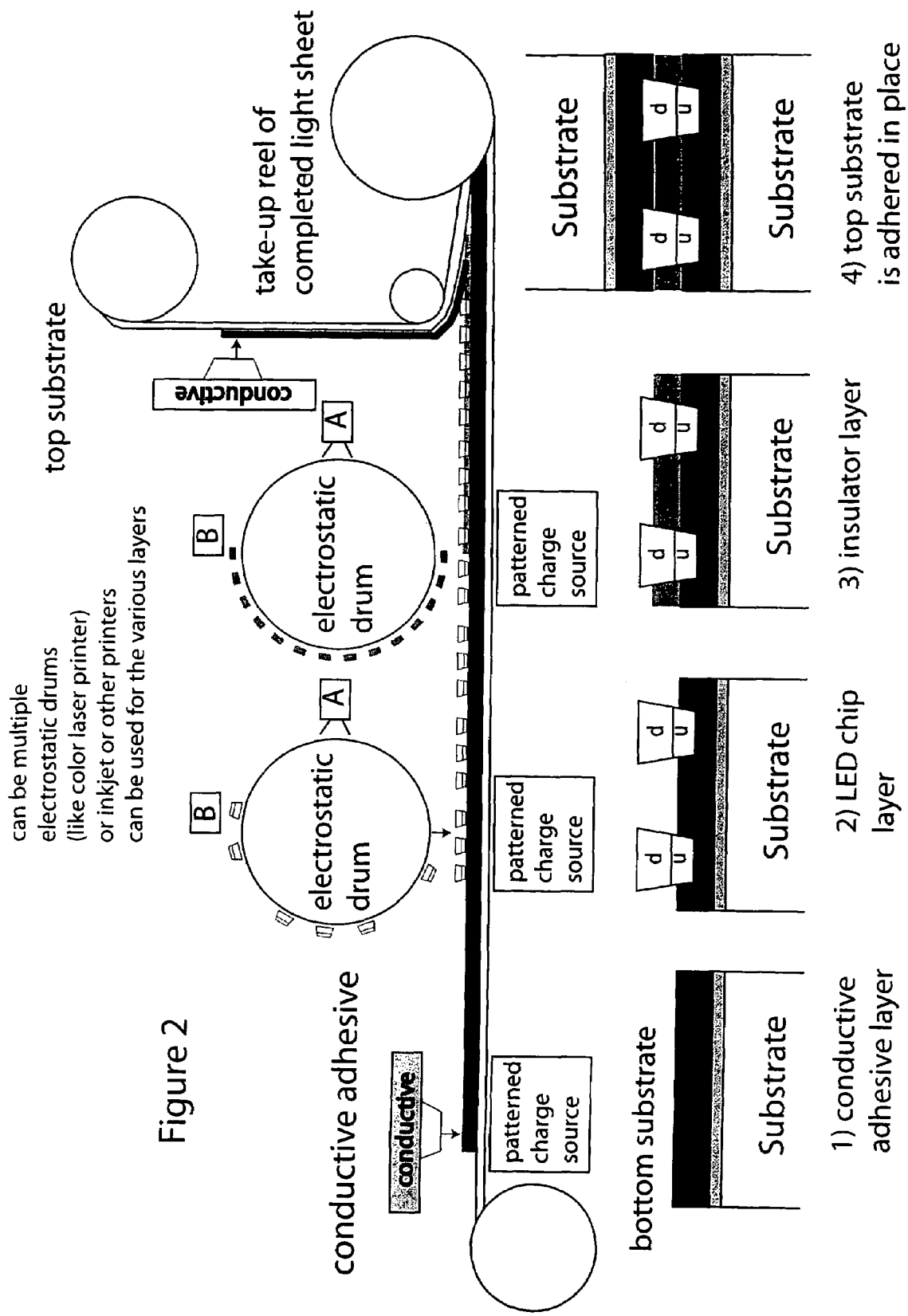
FIG. 2 illustrates another inventive method for manufacturing a light active sheet.

FIG. 2 illustrates another inventive method for manufacturing a light active sheet. In each example of the mechanism employed for forming the inventive light active sheet, the components and processes can be mixed in a number of iterations. The examples herein depict a selection of such iterations, but represent just a few of the possible process and material combinations contemplated by the inventive methods and device structures. As shown in FIG. 2, a first substrate is provided. A first conductive surface is formed on the first substrate. A pattern of LED dice is formed on the conductive surface. In the example shown, the conductive surface is provided as a conductive adhesive. However, the conductive surface may be, for example an ITO coating pre-formed on the bottom substrate. Each LED die has an anode and a cathode side. A second substrate is provided. A second conductive surface is formed on the second substrate. The first substrate is fixed to the second substrate so that either of the anode and the cathode side of the LED die is in electrical communication with the first conductive surface, and the other of the anode and the cathode side of the LED dice is in electrical communication with the second conductive surface. As shown, the LED dice may be encased within a conductive adhesive applied to the top and bottom substrate, with an insulator adhesive applied between the dice. Alternatively, only an insulator adhesive may be applied between the dice for fixing the top and bottom substrate together. The dice are then held in electrical contact with the top and bottom substrate conductive surfaces through the clamping force applied by the insulator adhesive. As other alternatives, only one or both of the substrates may have a conductive or non-conductive adhesive applied to it (through inkjet, silkscreen, doctor blade, slot-die coating, electrostatic coating, etc.), and the dice adhered directly or clamped between the substrates.

The first conductive surface may be formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

An adhesive layer may be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer includes at least one of a re-emitter, a light-scatterer, an adhesive, and a conductor.

The pattern of LED dice can be formed by electrostatically attracting the LED dice to a transfer member, and then transferring the attracted LED dice from the transfer member to the first conductive surface. The transfer member may include an opto-electric coating effective for holding a patterned electrostatic charge, the patterned electrostatic charge being effective for electrostatically attracting and forming the pattern of LED dice. The opto-electric coating can be patterned using at least one of a scanned laser beam and an LED light source. The transfer member may be a drum, a flat planar member, or other shape. The method of transferring the dice may also include a pick-and-place robotic method, or simple sprinkling of the semiconductor elements (i.e., the dice) onto an adhesive surface applied to the substrate.

Figure 3:
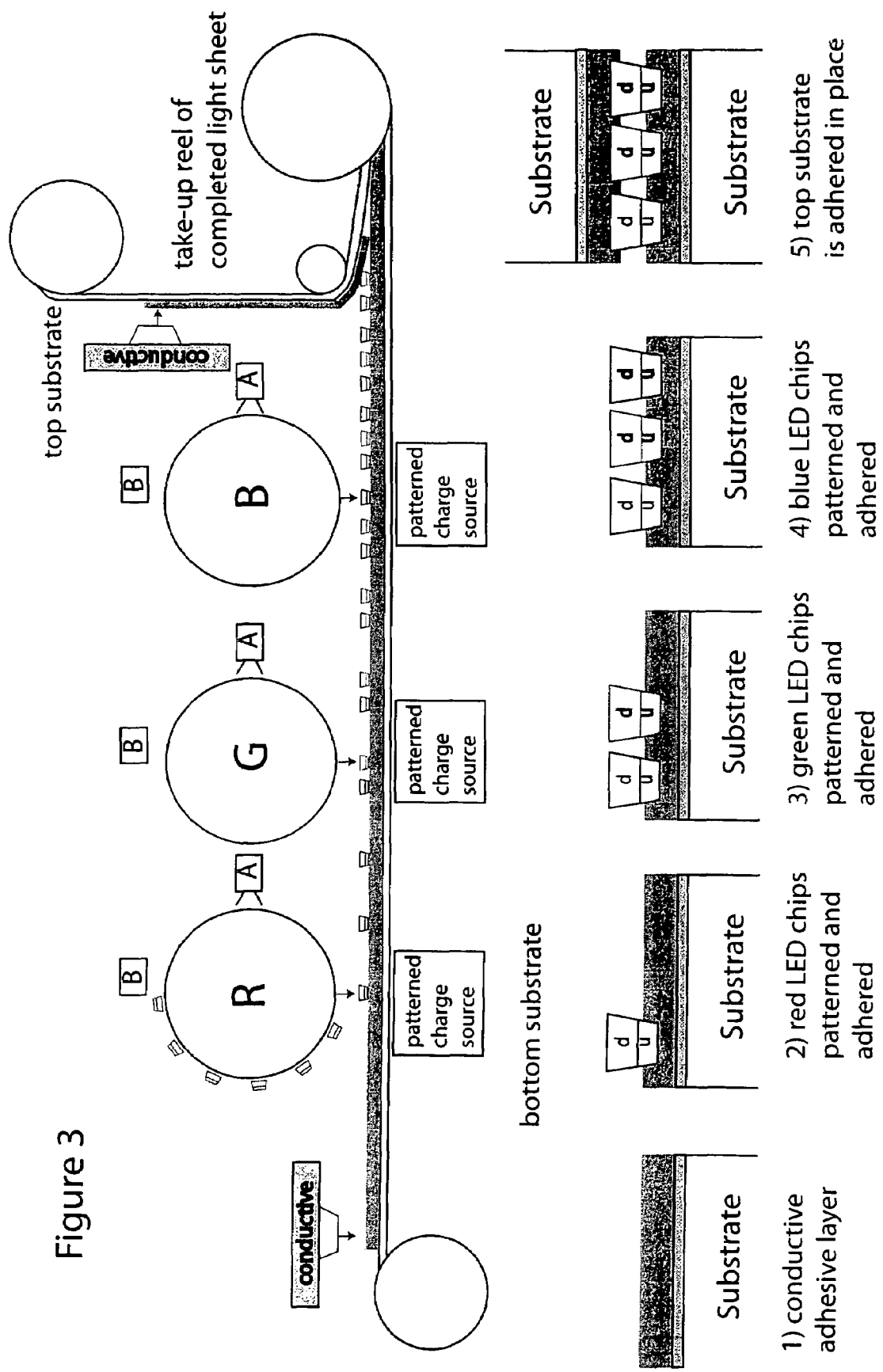
FIG. 3 illustrates another inventive method for manufacturing a light active sheet having two or more different types of light active semiconductor elements.

FIG. 3 illustrates another inventive method for manufacturing a light active sheet having two or more different types of light active semiconductor elements. A pattern of light active semiconductor elements can be formed by forming a first pattern of first light active semiconductor elements and forming a second pattern of second light active semiconductor elements. The first light active semiconductor elements emit light having a first color and the second light active semiconductor elements emit light having a second color. Alternatively, the first light active semiconductor elements emit light and the second light active semiconductor elements convert light to electrical energy.

The first conductive layer may be formed as a grid of x-electrodes, and the second conductive layer formed as a grid of y-electrodes, so that each respective light active semiconductor element is addressable for forming a sheet of light active material capable of functioning as a pixelated display component.

The pattern of light active semiconductor elements can be formed by forming a first pattern of first color light emitting semiconductor elements, forming a second pattern of second color light emitting semiconductor elements and forming a third pattern of third color light emitting semiconductor element. The first conductive layer may be formed as a grid of x-electrodes, and the second conductive layer formed as a grid of y-electrodes, so that each respective light active semiconductor is addressable for forming a sheet of light active material capable of functioning as a full-color pixelated display component.

The inventive methods shown by way of example in FIGS. 1-3 can be employed for creating a roll-to-roll or sheet manufacturing process for making light emitting sheet material or light-to-energy sheet material. In accordance with another aspect of the invention, a method is provided for forming a light-to-energy device. A first substrate is provided. A first conductive surface is formed on the first substrate. A pattern of semiconductor elements is formed on the conductive pattern. Each semiconductor element comprises a charge donor side and a charge acceptor side. For example, the semiconductor elements may comprise a crystalline silicone-based solar panel-type semiconductor layered structure. Alternatively, other semiconductor layered structures can be used for the semiconductor elements, including but not limited to, various thin film amorphous silicon semiconductor systems known in the art that have been particulated.

In accordance with the inventive method, a second conductive surface is formed on a second substrate. The first substrate is fixed to the second substrate so that either of the charge donor and the charge acceptor side of the semiconductor elements is in electrical communication with the first conductive surface and the other of the charge donor and the charge acceptor side of the semiconductor elements is in electrical communication with the second conductive surface.

The first conductive surface is formed as a conductive pattern comprised of at least one of a conductive coating, a conductive ink and a conductive adhesive. At least one of the first and the second conductive surface is a transparent conductor. At least one of the first and the second conductive surface is preformed on the respective first and second substrate. The first conductive surface may be formed using a printing method. The printing method may comprise at least one of an inkjet printing method, a laser printing method, a silk-screen printing method, a gravure printing method and a donor transfer sheet printing method.

An adhesive layer can be formed between the top substrate and the bottom substrate. The adhesive layer may comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer, wherein the function-enhancing layer includes at least one of a re-emitter, a light-scatterer, an adhesive, and a conductor.

The pattern of LED dice can be formed by electrostatically attracting the LED dice to a transfer member, and then transferring the attracted LED dice from the transfer member to the first conductive surface. The transfer member may include an opto-electric coating effective for holding a patterned electrostatic charge, the patterned electrostatic charge being effective for electrostatically attracting and forming the pattern of LED dice. The opto-electric coating can be patterned using at least one of a scanned laser beam and an LED light source. The transfer member may be shaped as a drum, a flat planar member, or other shape.

Figure 4:
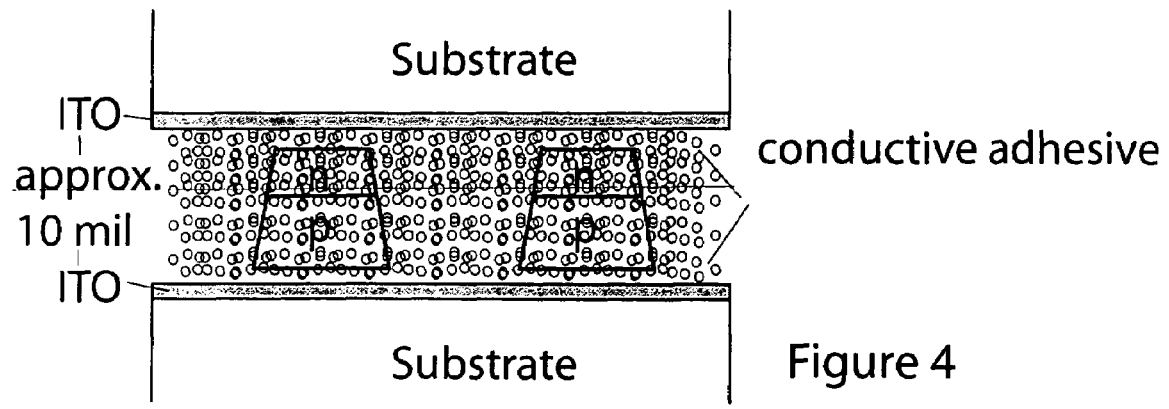
FIG. 4 is a cross-sectional view of an inventive light active sheet having a conductive adhesive for fixing the substrates and/or the light active semiconductor elements in place.

FIG. 4 is a cross-sectional view of an inventive light active sheet having a conductive adhesive for fixing the substrates and/or the light active semiconductor elements in place. In accordance with this aspect of the invention, device structures are provided for sheets of light active material. The examples shown herein are illustrative of various iterations of the device structure, and constituent parts in each example can be mixed in additional iterations not specifically described herein.

A first substrate has a transparent first conductive layer. A pattern of light active semiconductor elements fixed to the first substrate. The light active semiconductor elements have an n-side and a p-side. Each light active semiconductor element has either of the n-side or the p-side in electrical communication with the transparent conductive layer. A second substrate has a second conductive layer. An adhesive secures the second substrate to the first substrate so that the other of the n-side or said p-side of each light active semiconductor element is in electrical communication with the second conductive layer. Thus, a solid-state light active device is formed.

The transparent first conductive layer may comprise a transparent coating preformed on the first substrate. The transparent coating can be a conductive ink or conductive adhesive. An adhesive pattern may be formed on the first substrate for adhering the pattern of light active semiconductor elements to the first substrate. Alternatively, or additionally, an adhesive pattern may be formed on the first substrate for adhering the second substrate to the first substrate.

Figure 5:
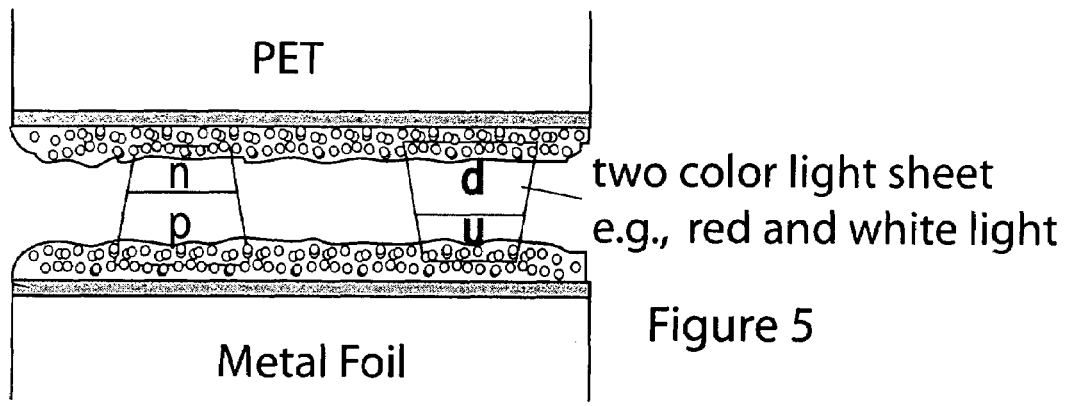
FIG. 5 is a cross-sectional view of an inventive light active sheet having two different types of light active semiconductor elements oriented to be driven with opposite polarity electrical energy.

FIG. 5 is a cross-sectional view of an inventive light active sheet having two different types of light active semiconductor elements oriented to be driven with opposite polarity electrical energy. The pattern of light active semiconductor elements may comprise a first pattern of first light active semiconductor elements and a second pattern of second light active semiconductor elements. The first light active semiconductor elements may emit light having a first color and the second light active semiconductor elements emit light having a second color. Alternatively, the first light active semiconductor elements may emit light and the second light active semiconductor elements convert light to electrical energy.

Figure 6:
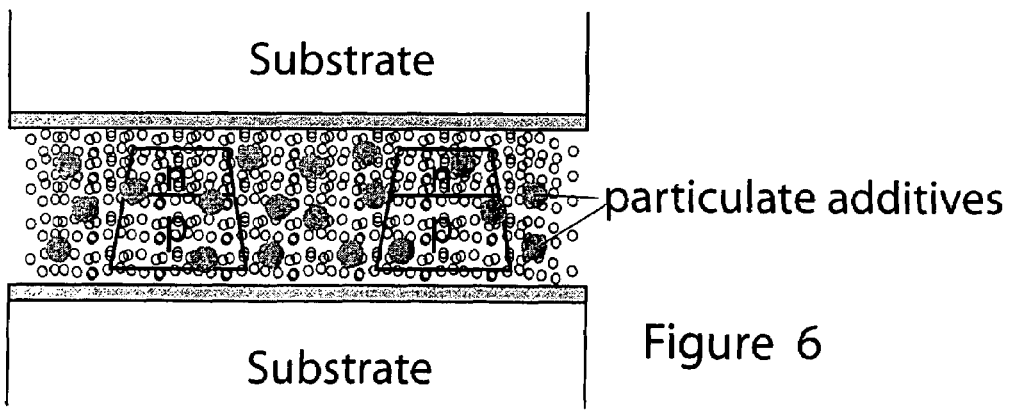
FIG. 6 is a cross-sectional view of an inventive light active sheet having additives included between the substrates to improve the desired light active sheet properties.

FIG. 6 is a cross-sectional view of an inventive light active sheet having additives included between the substrates to improve the desired light active sheet properties. The inventive light-emitting device comprises a first substrate. A first conductive surface is formed on the first substrate. A pattern of LED dice is formed on the conductive pattern. Each LED die has an anode and a cathode side. A second substrate has a second conductive surface formed on it. An adhesive fixes the first substrate to the second substrate so that either of the anode and the cathode side of the LED die is in electrical communication with the first conductive surface, and the other of the anode and the cathode side of the LED dice is in electrical communication with the second conductive surface.

The first conductive surface can be formed as a conductive pattern comprised of at least one of a conductive coating, a conductive ink and a conductive adhesive. At least one of the first and the second conductive surface is a transparent conductor. At least one of the first and the second conductive surface can be preformed on the respective first and second substrate. The first conductive surface can be formed using a printing method. The printing method may comprise at least one of an inkjet printing method, a laser printing method, a silk-screen printing method, a gravure printing method and a donor transfer sheet printing method.

The adhesive layer can comprise at least one of the top substrate and the bottom substrate. The adhesive layer can comprise at least one of a conductive adhesive, a semi-conductive adhesive, an insulative adhesive, a conductive polymer, a semi-conductive polymer, and an insulative polymer. A function-enhancing layer can be formed between the top substrate layer and the bottom substrate layer. The function-enhancing layer may include at least one of a re-emitter, a light-scatterer, an adhesive, and a conductor.

Figure 7:
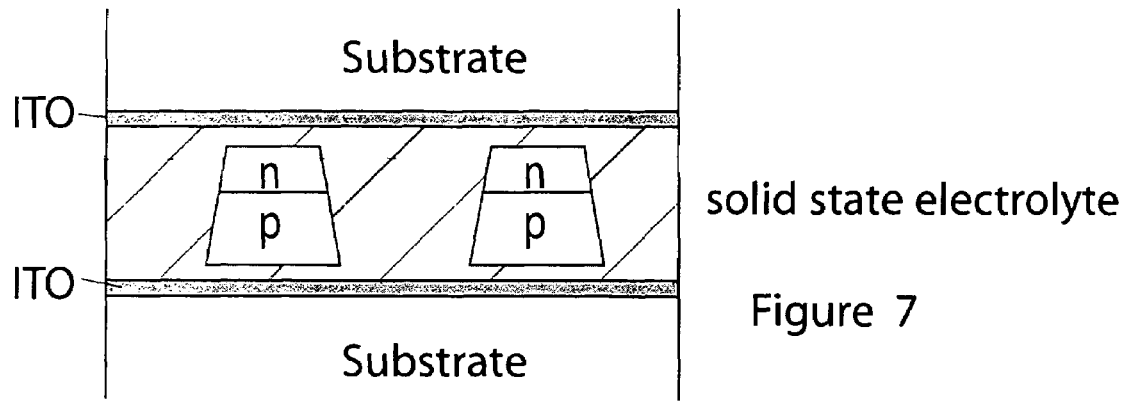
FIG. 7 is a cross-sectional view of an inventive light active sheet having the light active semiconductor elements disposed within a solid-state electrolyte.

FIG. 7 is a cross-sectional view of an inventive light active sheet having the light active semiconductor elements disposed within a solid-state electrolyte. In accordance with an embodiment of the inventive light active sheet, a top PET substrate has a coating of ITO, acting as the top electrode. A bottom PET substrate can be ITO PET, metal foil, metalized mylar, etc., depending on the intended application of the light sheet (e.g., transparent HUD element, light source, solar panel, etc.). The matrix (carrier) material may be a transparent photopolymerizable solid polymer electrolyte (SPE) based on cross-linked polysiloxane-g-oglio9ethylene oxide (see, for example, *Solid polymer electrolytes based on cross-linked polysiloxane-g-oligo(ethylene oxide): ionic conductivity and electrochemical properties*, Journal of Power Sources 119-121 (2003) 448-453, which is incorporated by reference herein). The emissive particulate may be commercially available LED dice, such as an AlGaAs/AlGaAs Red LED Die—TK 112UR, available from Tyntek, Taiwan). Alternatively the particulate may be comprised of light-to-energy particles, having charge donor and charge acceptor semiconductor layers, such as found in typical silicon-based solar panels. In the case of an energy-to-light device (i.e., a light sheet), it may be preferable for the matrix material to be less electrically conductive than the semiconductor elements so that the preferred path of electrical conductivity is through the light emitting elements. In the case of a light-to-energy device (i.e., a solar panel), it may be preferable for the matrix material to be more electrically conductive than the semiconductor element so that charges separated at the donor/acceptor interface effectively migrate to the top and bottom substrate electrodes.

Figure 8:
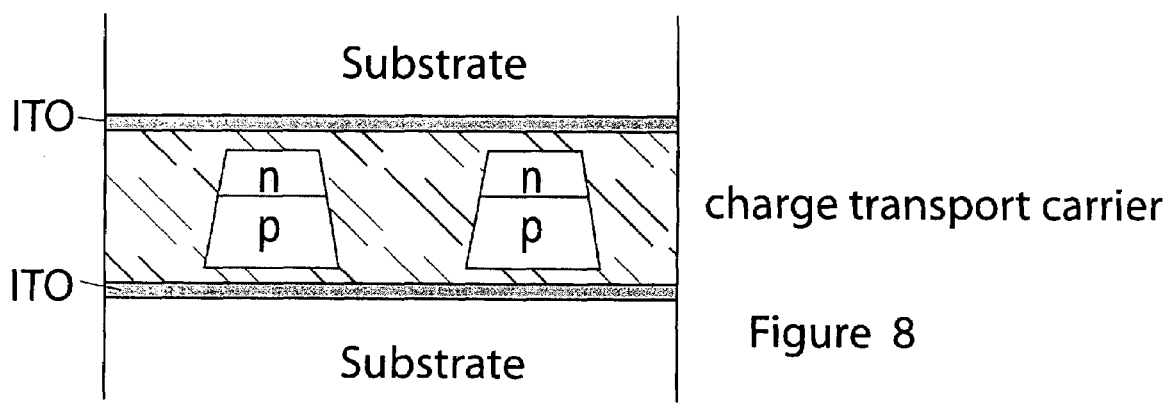
FIG. 8 is a cross-section view of an inventive light active sheet having the light active semiconductor elements disposed within a solid-state charge transport carrier.

FIG. 8 is a cross-section view of an inventive light active sheet having the light active semiconductor elements disposed within a solid-state charge transport carrier. As an example of a candidate solid-state charge transport carrier, an intrinsically conductive polymer, Poly(thieno[3,4-b]thiophene), has been shown to exhibit the necessary electronic, optical and mechanical properties. (see, for example, Poly(thieno[3,4-b]thiophene): A p- and n-Dopable Polythiophene Exhibiting High Optical Transparency in the Semiconducting State, Gregory A. Sotzing and Kyunghoon Lee, 7281 *Macromolecules* 2002, 35, 7281-7286, which is incorporated by reference herein).

Figure 9:
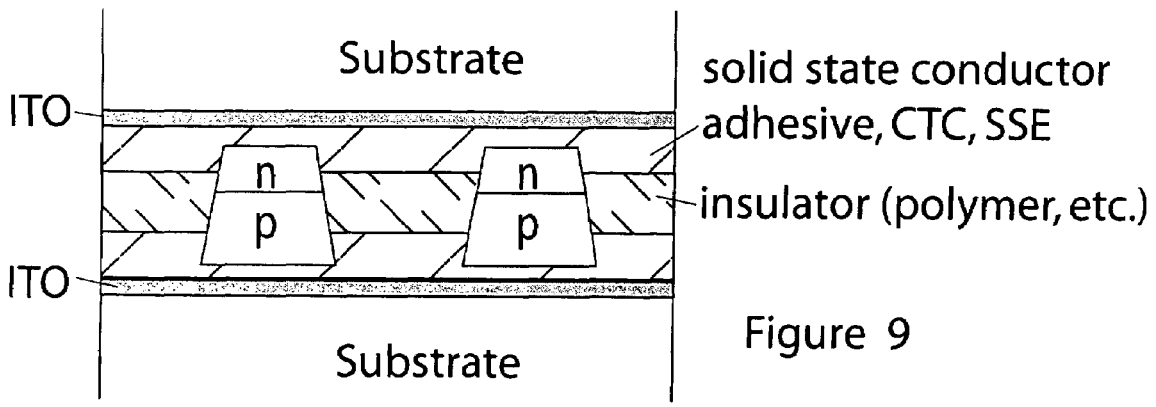
FIG. 9 is a cross-section view of an inventive light active sheet having an insulator material disposed between the top and bottom substrates.

FIG. 9 is a cross-section view of an inventive light active sheet having an insulator material disposed between the top and bottom substrates. The insulator may be an adhesive, such as an epoxy, heat-meltable polymer, etc. As shown, the semiconductor elements (e.g., LED dice) are fixed to the top and bottom substrates through a solid-state conductive adhesive, charge transport carrier or solid-state electrolyte. Alternatively, the semiconductor elements may be in direct contact with the top and bottom conductors disposed on the top and bottom substrates, and the adhesive provided between the LED dice to secure the top and substrates together and clamp the dice in electrical contact with the top and bottom conductors.

Figure 10:
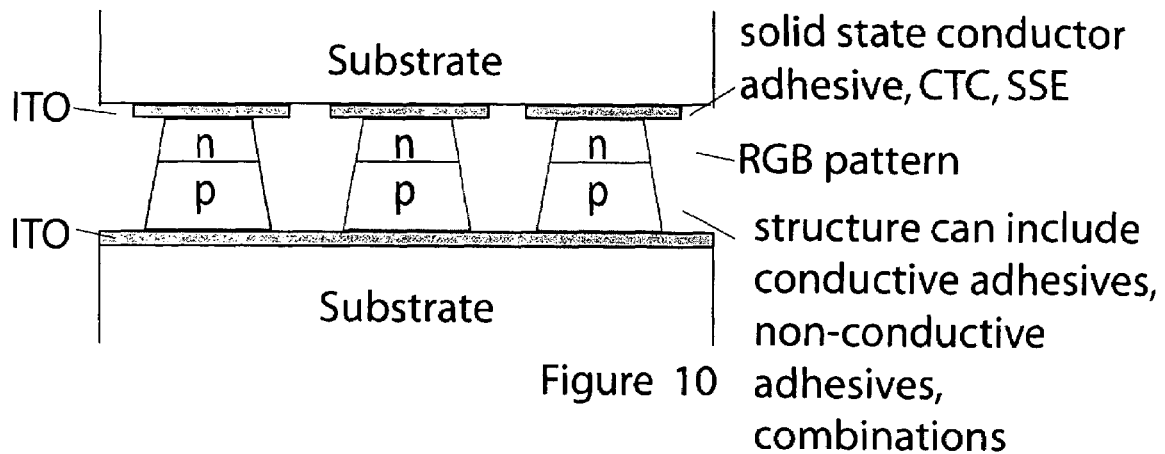
FIG. 10 is a cross-sectional view of the inventive light active sheet having an RGB semiconductor element pattern for forming a full-color light emissive display.

FIG. 10 is a cross-sectional view of the inventive light active sheet having an RGB semiconductor element pattern for forming a full-color light emissive display. The first conductive layer may be formed as a grid of x-electrodes, and the second conductive layer formed as a grid of y-electrodes. Each respective light active semiconductor element is disposed at the respective intersections of the x and y grid and are thus addressable for forming a sheet of light active material capable of functioning as a pixelated display component.

The pattern of light active semiconductor elements may comprise a first pattern of first color light emitting semiconductor elements, a second pattern of second color light emitting semiconductor elements and a third pattern of third color light emitting semiconductor element. The first conductive layer may be formed as a grid of x-electrodes, and the second conductive layer being formed as a grid of y-electrodes. The respective first, second and third color light emitting elements may be disposed at the intersections of the x and y grid so that each respective light active semiconductor is addressable. Thus, a sheet of light active material is formed capable of functioning as a full-color pixelated display component.

Figure 11:
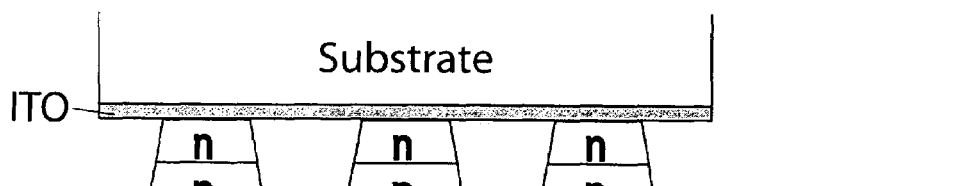
FIG. 11 is a cross-sectional view of the inventive light active sheet having a transparent substrate with a convex lens system.
Figure 12:
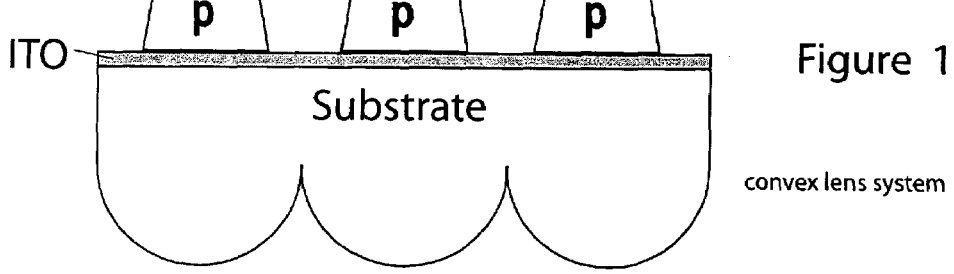
FIG. 12 is a cross-sectional view of the inventive light active sheet having a transparent substrate with a concave lens system.

FIG. 11 is a cross-sectional view of the inventive light active sheet having a transparent substrate with a convex lens system. The substrate may be formed having a lens element disposed adjacent to each point-source light emitter (LED die), or an additional lens layer be fixed to the substrate. The lens system may be concave for concentrating the light output from each emitter (as shown in FIG. 11) or convex for creating a more diffuse emission from the inventive light sheet (as shown in FIG. 12).

The devices shown, for example, in FIG. 4-12, illustrate various configurations of a light emitting sheet material. The LED dice shown are typical dice having top and bottom metal electrodes. However, in accordance with the present invention, the proper selection of materials (conductive adhesives, charge transport materials, electrolytes, conductors, etc.) may enable LED dice to be employed that do not require either or both the top and bottom metal electrodes. In this case, since the metal electrode in a typical device blocks the light output, the avoidance of the metal electrodes will effectively increase the device efficiency.

These devices may also be configured as a light to energy device. In this case, a first conductive surface is formed on the first substrate. A pattern of semiconductor elements is formed on the conductive pattern. Each semiconductor element includes a charge donor layer side and a charge acceptor side. A second substrate is provided having a second conductive surface formed on it. An adhesive fixes the first substrate to the second substrate so that either of the charge donor and the charge acceptor side of the semiconductor elements is in electrical communication with the first conductive surface, and the other of the charge donor and the charge acceptor side of the semiconductor elements is in electrical communication with the second conductive surface.

The first conductive surface may be formed as a conductive pattern comprised of at least one of a conductive coating, a conductive ink and a conductive adhesive. At least one of the first and the second conductive surface is a transparent conductor. At least one of the first and the second conductive surface may be preformed on the respective first and second substrate. The adhesive may comprise at least one of the top substrate and the bottom substrate. The adhesive layer may comprise at least one of a conductive adhesive, a semi-conductive adhesive, an insulative adhesive, a conductive polymer, a semi-conductive polymer, and an insulative polymer.

Figure 13:
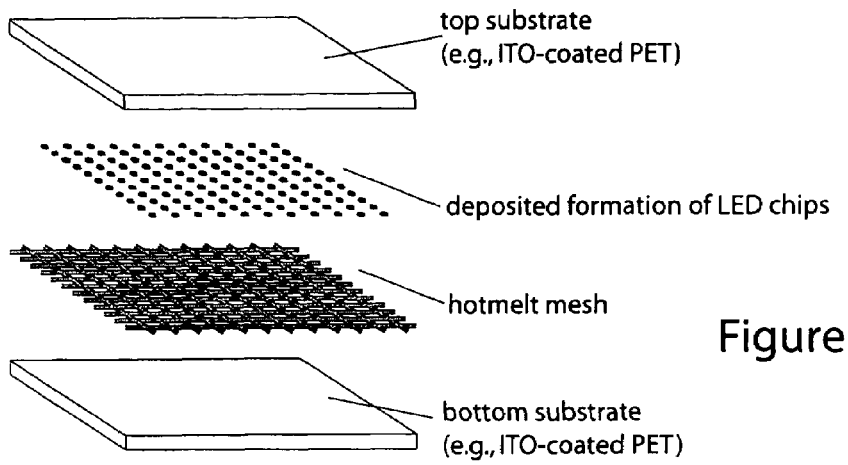
FIG. 13 is an exploded view of the inventive light active sheet having a melt adhesive mesh.
Figure 14:
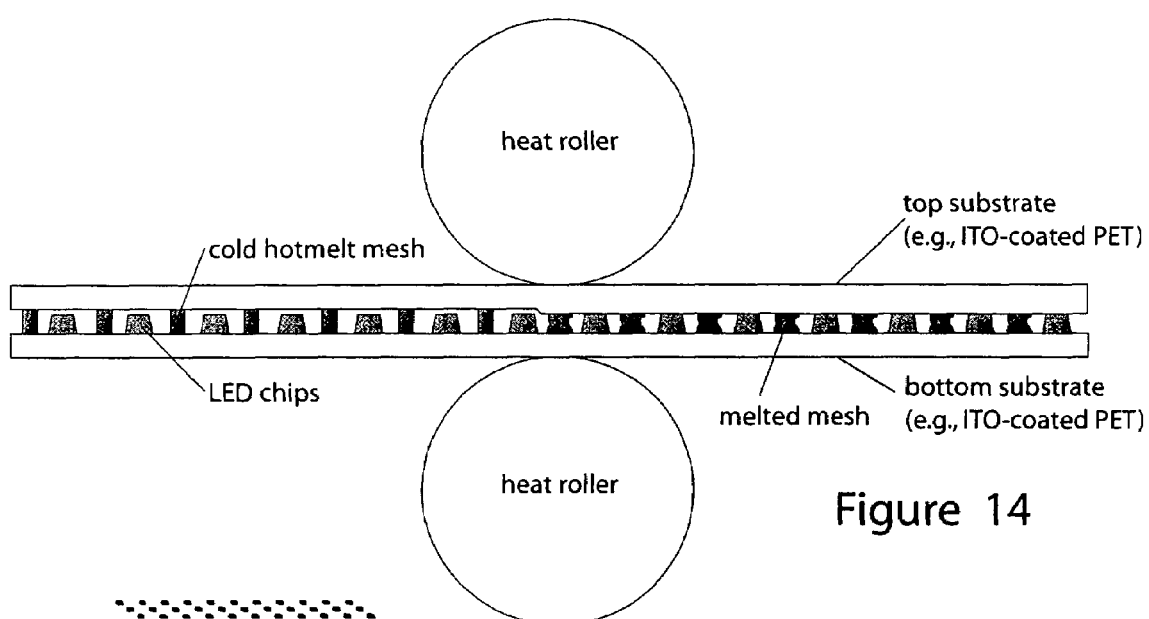
FIG. 14 is a schematic view of a method of manufacturing a light active sheet utilizing the melt adhesive mesh.

FIG. 13 is an exploded view of the inventive light active sheet having a melt adhesive mesh. The melt adhesive sheet may be incorporated during the manufacture of the light active sheet at any suitable point. For example, it may be preformed on the bottom substrate before the LED dice are transferred, and then after the dice are transferred to the spaces between the mesh, the top substrate applied. FIG. 14 is a schematic view of a method of manufacturing a light active sheet utilizing the melt adhesive mesh. In this case, heated pressure rollers melt the melt adhesive mesh and compress the top and bottom substrates together to effectively claim the LED dice into electrical contact with the substrate conductors. Conductive adhesives, electrolytes, charge transport materials, etc., as described herein may or may not be necessary, depending on the desired functional properties of the fabricated light active sheet.

Figure 15:
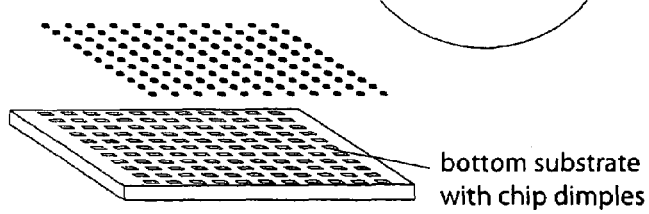
FIG. 15 is an exploded view of the inventive light active sheet comprising a substrate having position-facilitating die dimples.
Figure 16:
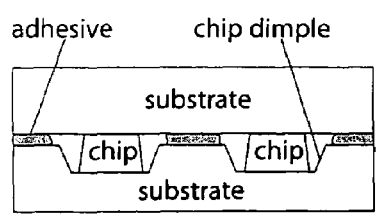
FIG. 16 is a cross-sectional view of the inventive light active sheet showing the position-facilitating die dimples.

FIG. 15 is an exploded view of the inventive light active sheet comprising a substrate having position-facilitating die dimples. FIG. 16 is a cross-sectional view of the inventive light active sheet showing the position-facilitating die dimples. In this case, the position-facilitating die dimples may be provided to help locate and maintain the positioning of the semiconductor elements.

Figure 17:
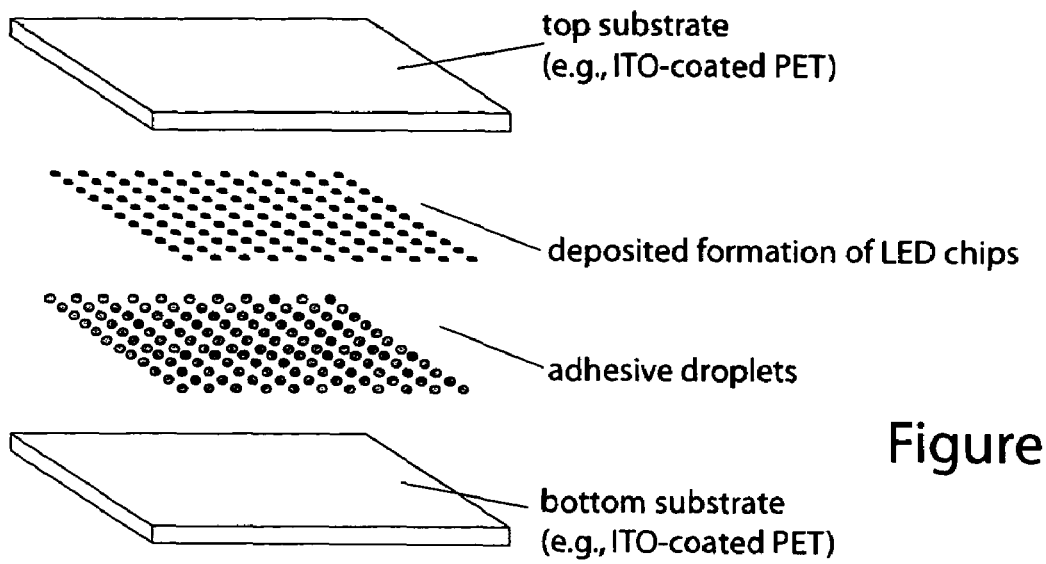
FIG. 17 is an exploded view of the light active sheet having adhesive droplets for fixing the semiconductor elements (dice) to the substrate and/or for adhering the top substrate to the bottom substrate.

FIG. 17 is an exploded view of the light active sheet having adhesive droplets for fixing the semiconductor elements (dice) to the substrate and/or for adhering the top substrate to the bottom substrate. The adhesive droplets can be preformed on the substrate(s) and may be heat melt adhesive, epoxy, pressure sensitive adhesive, or the like. Alternatively, the adhesive droplets may be formed during the roll-to-roll or sheet fabrication process using, for example, inkjet print heads, silkscreen printing, or the like. The adhesive droplets are provided to hold the dice in place, and/or to secure the top substrate and the bottom substrate together.

Figure 18:
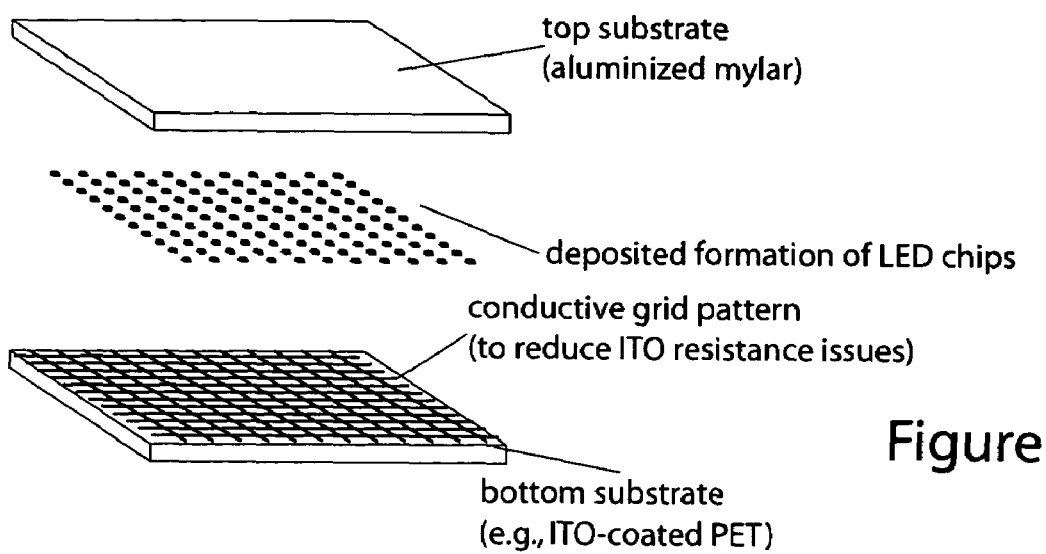
FIG. 18 is an exploded view of the light active sheet having an electrical resistance-reducing conductive grid pattern.

FIG. 18 is an exploded view of the light active sheet having an electrical resistance-reducing conductive grid pattern. The conductive grid pattern can be provided to reduce sheet resistance and improve the electrical characteristics of the fabricated light active sheet material.

Figure 19:
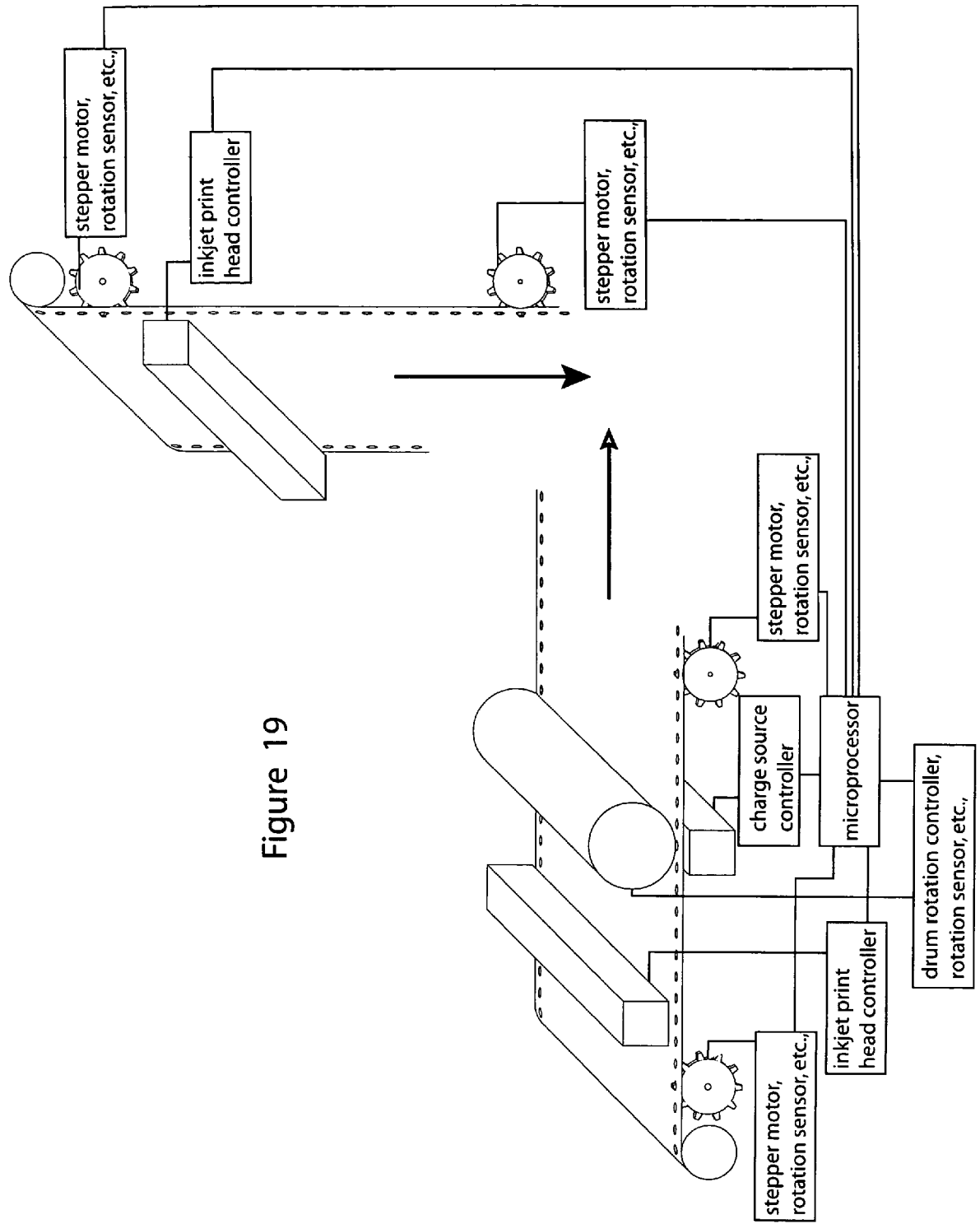
FIG. 19 is a schematic view of an inventive method of manufacturing a light active sheet wherein a hole-and-sprocket system is employed to ensure registration of the constituent parts of the inventive light sheet during the manufacturing process.

FIG. 19 is a schematic view of an inventive method of manufacturing a light active sheet wherein a hole-and-sprocket system is employed to ensure registration of the constituent parts of the inventive light sheet during the manufacturing process. The holes in the substrates (or a transfer sheet carrying the substrates) line up with the sprockets that may either be driven to move the substrates, and/or that may be driven by the movement of the substrates. In either case, rotational position detection of the sprockets is used to control the various active elements of the manufacturing system to ensure accurate registration between the constituent parts of the inventive light active sheet material.

Figure 20:
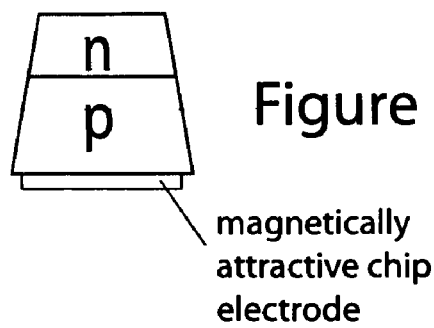
FIG. 20 is an isolated view of an inventive semiconductor element (e.g., LED die) having a magnetically-attractive element to facilitate die orientation and transfer.
Figure 21:
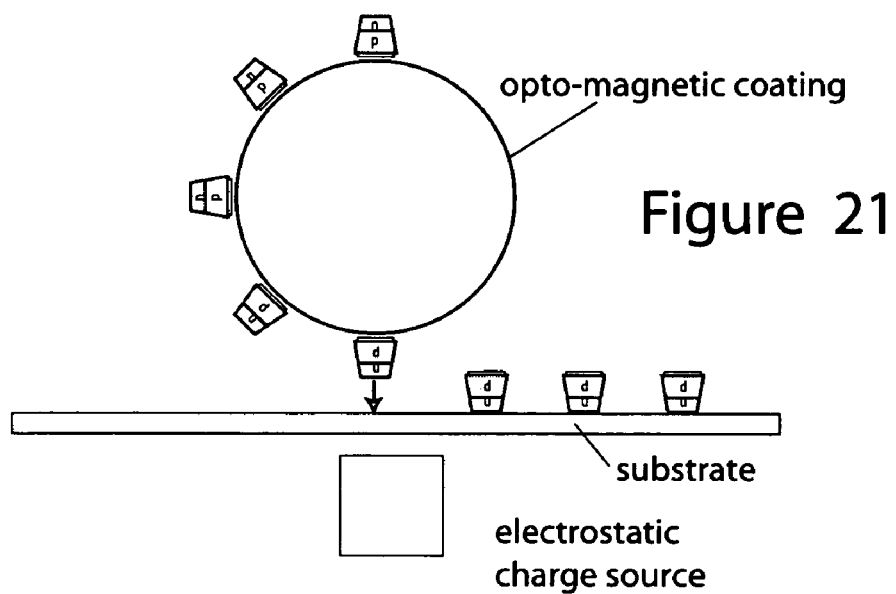
FIG. 21 illustrates the use of a magnetic drum and electrostatic charge source for orienting and transferring a pattern of semiconductor elements onto a substrate.
Figure 22:
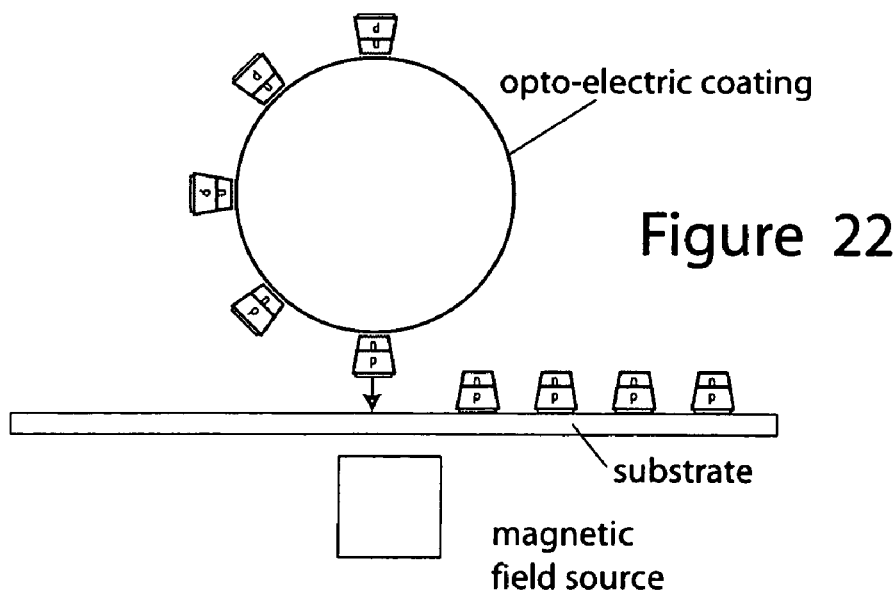
FIG. 22 illustrates the use of an electrostatic drum and magnetic attraction source for orienting and transferring a pattern of semiconductor elements onto a substrate.

FIG. 20 is an isolated view of an inventive semiconductor element (e.g., LED die) having a magnetically-attractive element to facilitate die orientation and transfer. The dice may include a magnetically active electrode component, or an additional magnetically active component. The magnetically active component enables the dice to be positioned and orient in response to an applied magnetic field. FIG. 21 illustrates the use of a magnetic drum and electrostatic charge source for orienting and transferring a pattern of semiconductor elements onto a substrate. FIG. 22 illustrates the use of an electrostatic drum and magnetic attraction source for orienting and transferring a pattern of semiconductor elements onto a substrate.

Figure 23:
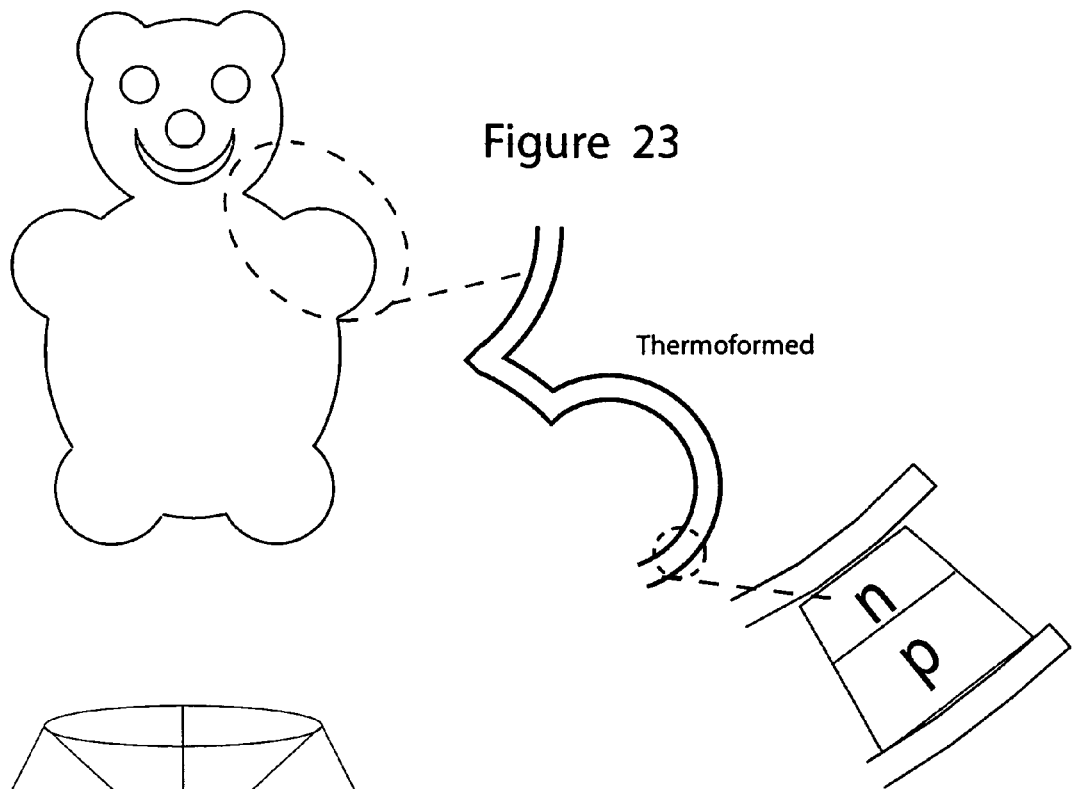
FIG. 23 illustrates an inventive light active sheet thermoformed into a three-dimensional article.
Figure 24A:
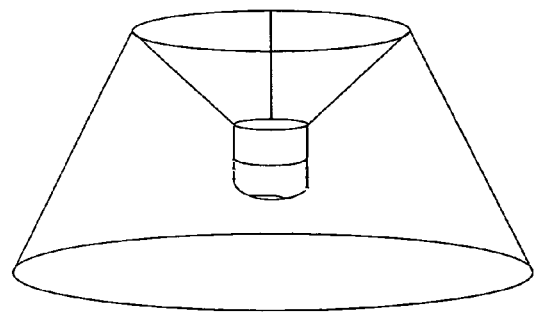
FIG. 24(a) illustrates an inventive light active sheet fabricated into a lampshade form-factor having a voltage conditioner for conditioning available electrical current.
Figure 24B:
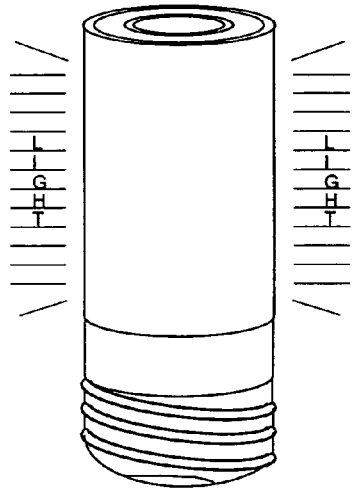
FIG. 24(b) illustrates an inventive light active sheet fabricated into a light-bulb form-factor having a voltage conditioner for conditioning available electrical current.
Figure 25:
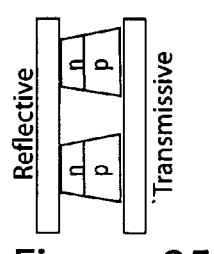
FIG. 25 is a cross-sectional view of an inventive light sheet employed in the light bulb form factor show in FIG. 24.

The inventive light sheet can be configured into a wide range of applications. FIG. 23 illustrates an inventive light active sheet thermoformed into a three-dimensional article. FIG. 24(a) illustrates an inventive light active sheet fabricated into a lampshade form-factor having a voltage conditioner for conditioning available electrical current. FIG. 24(b) illustrates an inventive light active sheet fabricated into a light-bulb form-factor having a voltage conditioner for conditioning available electrical current. FIG. 25 is a cross-sectional view of an inventive light sheet employed in the light bulb and lampshade form factor show in FIGS. 24(a) and (b). FIG. 26(a) illustrates an inventive light sheet configured as a heads-up-display (HUD) installed as an element of a vehicle windshield. FIG. 26(b) is a block diagram showing a driving circuit for an inventive HUD with a collision avoidance system. FIG. 27 is an exploded view of an inventive light sheet utilized as a thin, bright, flexible, energy efficient backlight component for an LCD display system.

Figure 28:
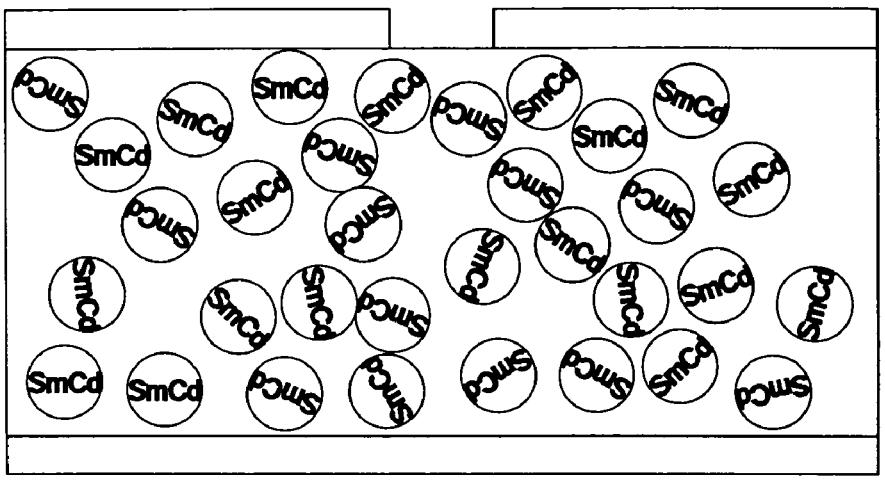
FIG. 28 schematically illustrates an embodiment of the inventive photo-radiation source showing a semiconductor particulate randomly dispersed within a conductive carrier matrix.

FIG. 28 illustrates an embodiment of the inventive photo-radiation source showing a semiconductor particulate randomly dispersed within a conductive carrier matrix. A light active device includes a semiconductor particulate dispersed within a carrier matrix material.

The carrier matrix material may be conductive, insulative or semiconductor and allows charges to move through it to the semiconductor particulate. The charges of opposite polarity moving into the semiconductor material combine to form charge carrier matrix pairs. The charge carrier matrix pairs decay with the emission of photons, so that light radiation is emitted from the semiconductor material. Alternatively, the semiconductor material and other components of the inventive photo-radiation source may be selected so that light received in the semiconductor particulate generates a flow of electrons. In this case, the photo-radiation source acts as a light sensor.

A first contact layer or first electrode is provided so that on application of an electric field charge carrier matrix having a polarity are injected into the semiconductor particulate through the conductive carrier matrix material. A second contact layer or second electrode is provided so that on application of the electric field to the second contact layer charge carrier matrix having an opposite polarity are injected into the semiconductor particulate through the conductive carrier matrix material. To form a display device, the first contact layer and the second contact layer can be arranged to form an array of pixel electrodes. Each pixel includes a portion of the semiconductor particulate dispersed within the conductive carrier matrix material. Each pixel is selectively addressable by applying a driving voltage to the appropriate first contact electrode and the second contact electrode.

The semiconductor particulate comprises at least one of an organic and an inorganic semiconductor. The semiconductor particulate can be, for example, a doped inorganic particle, such as the emissive component of a conventional LED. The semiconductor particulate can be, for another example, an organic light emitting diode particle. The semiconductor particulate may also comprise a combination of organic and inorganic materials to impart characteristics such as voltage control emission, aligning field attractiveness, emission color, emission efficiency, and the like.

The electrodes can be made from any suitable conductive material including electrode materials that may be metals, degenerate semiconductors, and conducting polymers. Examples of such materials include a wide variety of conducting materials including, but not limited to, indium-tin-oxide ("ITO"), metals such as gold, aluminum, calcium, silver, copper, indium and magnesium, alloys such as magnesium-silver, conducting fibers such as carbon fibers, and highly-conducting organic polymers such as highly-conducting doped polyaniline, highly-conducting doped polypyrole, or polyaniline salt (such as PAN-CSA) or other pyridyl nitrogen-containing polymer, such as polypyridylvinylene. Other examples may include materials that would allow the devices to be constructed as hybrid devices through the use of semiconductor materials, such as n-doped silicon, n-doped polyacetylene or n-doped polyparaphenylene.

Figure 29:
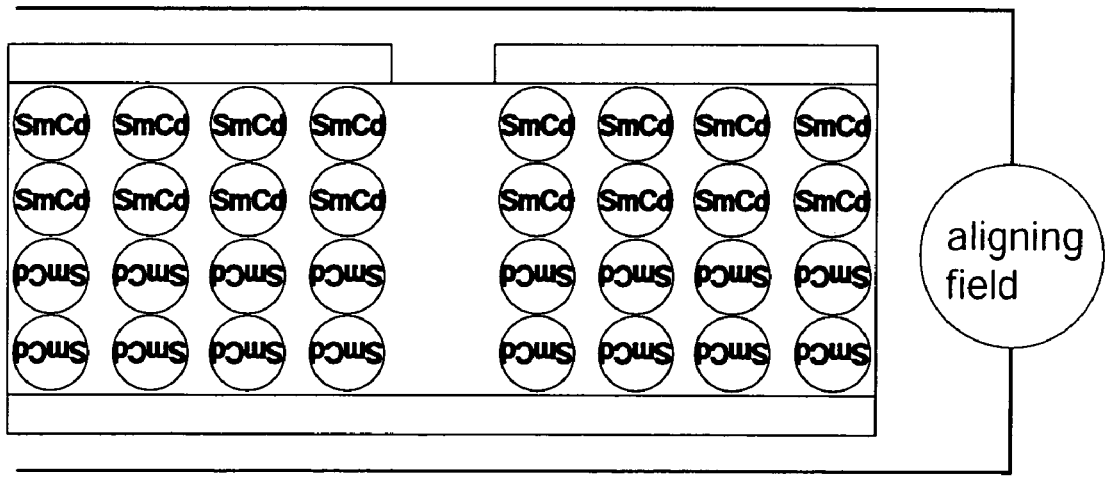
FIG. 29 illustrates an embodiment of the inventive photo-radiation source showing the semiconductor particulate aligned between electrodes.

As shown in FIG. 29, an embodiment of the inventive photo-radiation source may have the semiconductor particulate aligned between electrodes. The emissive particulate acts as point light sources within the carrier matrix material when holes and electrons are injected and recombine forming excitons. The excitons decay with the emission of radiation, such as light energy. In accordance with the present invention, the emissive particulate can be automatically aligned so that a significant majority of the point light sources are properly oriented and disposed between the electrodes (or array of electrodes in a display). This maximizes the light output from the device, greatly reduces cross-talk between pixels, and creates a protected emissive structure within the water, oxygen and contamination boundary provided by the hardened carrier matrix material.

In this case, the mixture disposed within the gap between the top and bottom electrodes includes a field reactive OLED particulate that is randomly dispersed within a fluid carrier matrix. An aligning field is applied between the top electrode and the bottom electrode. The field reactive OLED particulate moves within the carrier matrix material under the influence of the aligning field. Depending on the particulate composition, carrier matrix material and aligning field, the OLED particulates form chains between the electrodes (similar to the particulate in an electrical or magnetic rheological fluid in an electric or magnetic field), or otherwise becomes oriented in the aligning field. The aligning field is applied to form a desired orientation of the field reactive OLED particulate within the fluid carrier matrix. The fluid carrier matrix comprises a hardenable material. It can be organic or inorganic. While the desired orientation of the field reactive OLED particulate is maintained by the aligning field, the carrier matrix is hardened to form a hardened support structure within which is locked in position the aligned OLED particulate.

Figure 30:
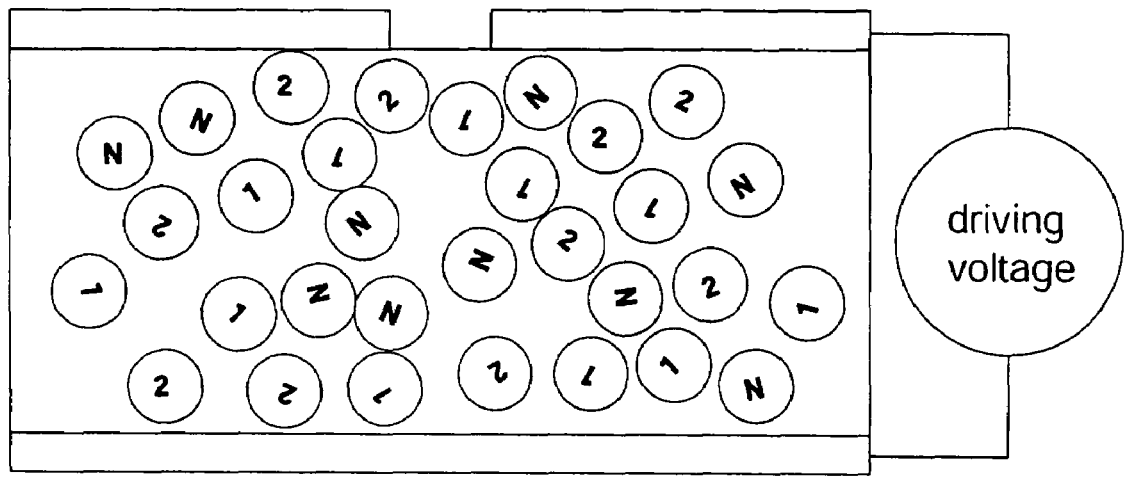
FIG. 30 illustrates an embodiment of the inventive photo-radiation source showing semiconductor particulate and other performance enhancing particulate randomly dispersed within the conductive carrier matrix material.

FIG. 30 illustrates an embodiment of the inventive photo-radiation source showing semiconductor particulate and other performance enhancing particulate randomly dispersed within the conductive carrier matrix material. The semiconductor particulate may comprise an organic light active particulate that includes at least one conjugated polymer. The conjugated polymers having a sufficiently low concentration of extrinsic charge carrier matrix. An electric field applied between the first and second contact layers causes holes and electrons to be injected into the semiconductor particulate through the conductive carrier matrix material. For example, the second contact layer becomes positive relative to the first contact layer and charge carrier matrix of opposite polarity is injected into the semiconductor particulate. The opposite polarity charge carrier matrix combine to form in the conjugated polymer charge carrier matrix pairs or excitons, which emit radiation in the form of light energy.

Depending on the desired mechanical, chemical, electrical and optical characteristics of the photo-radiation source, the conductive carrier matrix material can be a binder material with one or more characteristic controlling additives. For example, the binder material may be a cross-linkable monomer, or an epoxy, or other material into which the semiconductor particulate can be dispersed. The characteristic controlling additives may be in a particulate and/or a fluid state within the binder. The characteristic controlling additives may include, for example, a desiccant, a scavenger, a conductive phase, a semiconductor phase, an insulative phase, a mechanical strength enhancing phase, an adhesive enhancing phase, a hole injecting material, an electron injecting material, a low work metal, a blocking material, and an emission enhancing material. A particulate, such as an ITO particulate, or a conductive metal, semiconductor, doped inorganic, doped organic, conjugated polymer, or the like can be added to control the conductivity and other electrical, mechanical and optical characteristics. Color absorbing dyes can be included to control the output color from the device. Fluorescent and phosphorescent components can be incorporated. Reflective material or diffusive material can be included to enhance the absorption of received light (in the case, for example, of a display or photodetector) or enhance the emitted light qualities. In the case of a solar collector, the random dispersal orientation of the particulate may be preferred because it will enable a solar cell to have light receiving particulate that are randomly oriented and the cell can receive light from the sun efficiently as it passes over head. The orientation of the particulate may also be controlled in a solar cell to provide a bias for preferred direction of captured light.

The characteristic controlling additives may also include materials that act as heat sinks to improve the thermal stability of the OLED materials. The low work metal additives can be used so that more efficient materials can be used as the electrodes. The characteristic controlling additives can also be used to improve the mobility of the carrier matrix in the organic materials and help improve the light efficiency of the light-emitting device.

Figure 31:
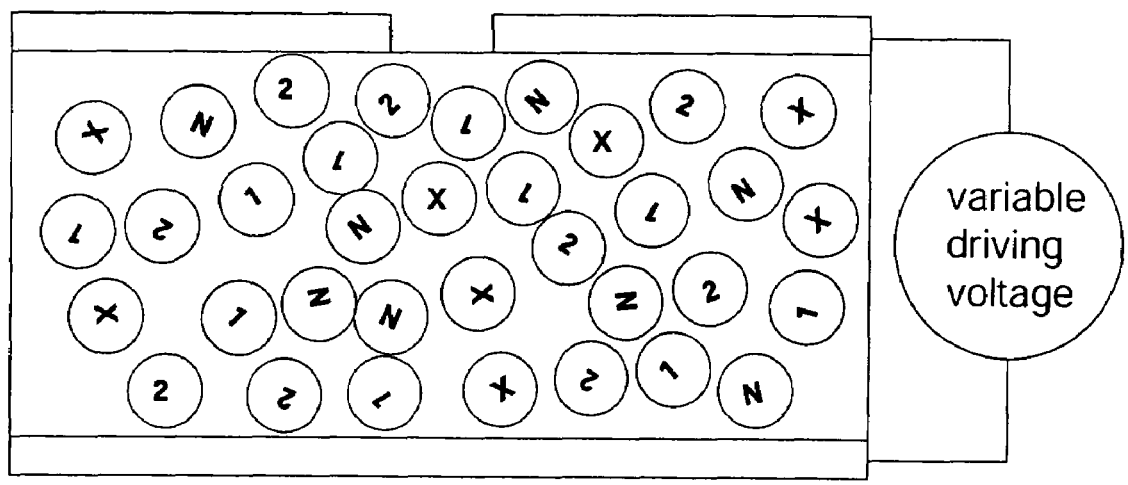
FIG. 31 illustrates an embodiment of the inventive photo-radiation source showing different species of organic light active particulate dispersed within a carrier matrix material.

FIG. 31 illustrates an embodiment of the inventive photo-radiation source showing different species of organic light active particulate dispersed within a carrier matrix material. This structure has significant advantages over other full color or multicolor light devices, and can also be configured as a wide spectrum photodetector for applications such as cameras. The organic light active particulate can include organic and inorganic particle constituents including at least one of hole transport material, organic emitters, electron transport material, magnetic and electrostatic material, insulators, semiconductors, conductors, and the like. As is described herein, a multi-layered organic light active particulate can be formed so that its optical, chemical, mechanical and electrical properties are controlled by the various particle constituents.

Figure 32:
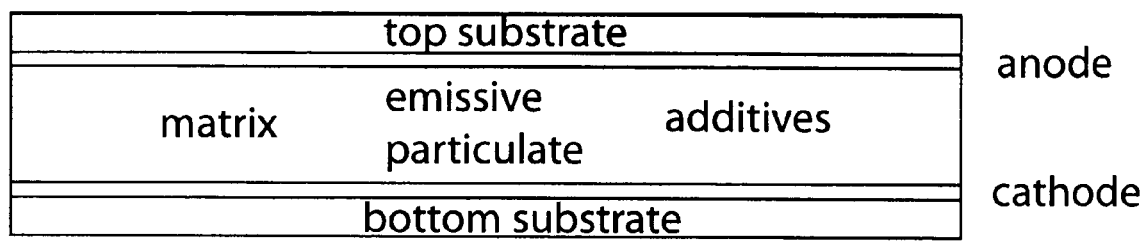
FIG. 32 schematically illustrates the cross-section of an embodiment of the inventive photo-radiation source.

FIG. 32 schematically illustrates the cross-section of an embodiment of the inventive photo-radiation source. The inventive photo-radiation source for the selective polymerization of photo-radiation-curable organic material includes a first electrode, and a second electrode disposed adjacent to the first electrode and defining a gap therebetween. The electrodes are disposed on top and bottom substrates, respectively. The substrates may be a flexible material, such as polyester, PAN, or the like. One substrate may be transparent while the other is reflective.

A photo-radiation emission layer is disposed in the gap. The photo-radiation emission layer includes a charge-transport matrix material and an emissive particulate dispersed within the charge-transport matrix material. The emissive particulate receives electrical energy through the charge-transport matrix material. The energy is applied as a voltage to the first electrode, which may be an anode, and the second electrode, which may be a cathode. The emissive particulate generates photo-radiation in response to the applied voltage. This photo-radiation is effective for the selective polymerization of photo-radiation curable organic material.

In accordance with the present invention, a photo-radiation source is obtained that is effective for the photo-polymerization of a polymerizable organic material. The charge-transport matrix material may be an ionic transport material, such as a fluid electrolyte or a solid electrolyte, including a solid polymer electrolyte (SPE). The solid polymer electrolyte may be a polymer electrolyte including at least one of a polyethylene glycol, a polyethylene oxide, and a polyethylene sulfide. Alternatively or additionally, the charge-transport matrix material may be an intrinsically conductive polymer. The intrinsically conductive polymer may include aromatic repeat units in a polymer backbone. The intrinsically conductive polymer may be, for example, a polythiophene.

The charge-transport matrix material can be transparent to photo-radiation in a photo-radiation spectrum effective for the selective polymerization of photo-radiation-curable organic material. The photo-radiation spectrum may comprise a range between and including UV and blue light. The photo-radiation spectrum may include a range between and including 365 and 405 nm. In a specific embodiment of the invention, the photo-radiation spectrum emitted from the photo-radiation source is in a range centered at around 420 nm.

The charge transport material transports electrical charges to the emissive particulate when a voltage is applied to the first electrode and the second electrode. These charges cause the emission of photo-radiation from the emissive particulate, this photo-radiation being effective for the selective polymerization of photo-radiation-curable organic material.

The emissive particulate is capable of emitting photo-radiation in a photo-radiation spectrum effective for the selective polymerization of photo-radiation-curable organic material. The photo-radiation spectrum may comprise a range between and including UV and blue light. The photo-radiation spectrum may include a range between and including 365 and 405 nm. In a specific embodiment of the invention, the photo-radiation spectrum emitted from the emissive particulate is in a range centered at around 420 nm.

One of the first and the second electrode can be transparent to at least a portion of photo-radiation emitted by the emissive particulate and the other of the first and the second electrode can be reflective of at least a portion of the photo-radiation emitted by the emissive particulate.

The emissive particulate may comprise a semiconductor material, such as an organic and/or an inorganic multilayered semiconductor material. The semiconductor particulate can include an organic light active particulate including at least one conjugated polymer. The conjugated polymer has a sufficiently low concentration of extrinsic charge carriers so that on applying an electric field between the first and second contact layers to the semiconductor particulate through the conductive carrier material the second contact layer becomes positive relative to the first contact layer and charge carriers of first and second types are injected into the semiconductor particulate. The charge carriers combine to form in the conjugated polymer charge carrier pairs which decay radiatively so that radiation is emitted from the conjugated polymer. The organic light active particulate may comprise particles including at least one of hole transport material, organic emitters, and electron transport material.

The organic light active particulate may comprise particles including a polymer blend, the polymer blend including an organic emitter blended with at least one of a hole transport material, an electron transport material and a blocking material. The organic light active particulate may comprise microcapsules including a polymer shell encapsulating an internal phase comprised of a polymer blend including an organic emitter blended with at least one of a hole transport material, an electron transport material and a blocking material.

The conductive carrier material may comprise a binder material with one or more characteristic controlling additives. The characteristic controlling additives are at least one of a particulate and a fluid include a desiccant; a conductive phase, a semiconductor phase, an insulative phase, a mechanical strength enhancing phase, an adhesive enhancing phase, a hole injecting material, an electron injecting material, a low work metal, a blocking material, and an emission enhancing material.

Figure 33:
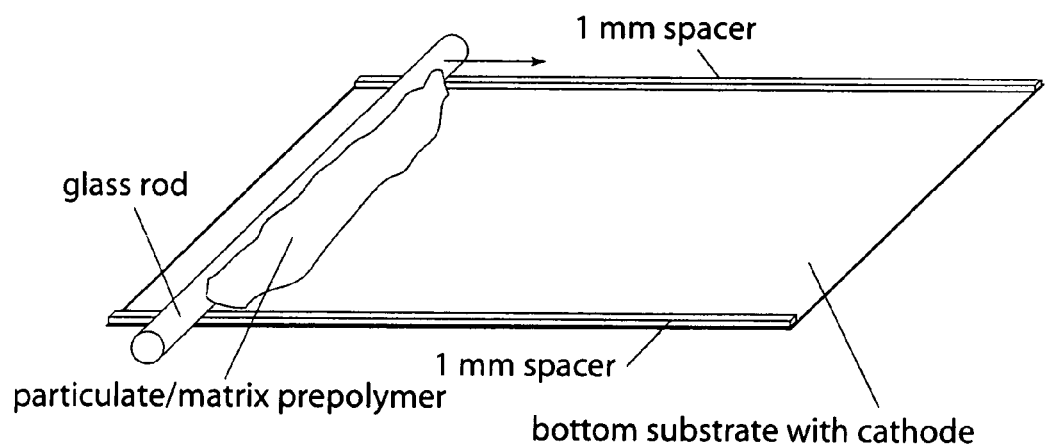
FIG. 33 illustrates a step in an embodiment of the inventive method of making a photo-radiation source, showing the step of the addition of an emissive particulate/matrix mixture onto a bottom substrate with bottom electrode.

FIG. 33 illustrates a step in an embodiment of the inventive method of making a photo-radiation source. In this step, an emissive particulate/matrix mixture is applied onto a bottom substrate with bottom electrode. The particulate/matrix mixture can be applied onto the surface of the bottom electrode through a slot-die coating stage, or as shown herein, using a glass rod. At least one of the first electrode and the second electrode may be transparent to photo-radiation in a photo-radiation spectrum effective for the selective polymerization of photo-radiation-curable organic material. The first electrode and the second electrode can be planar and disposed on flexible substrates.

Figure 34:
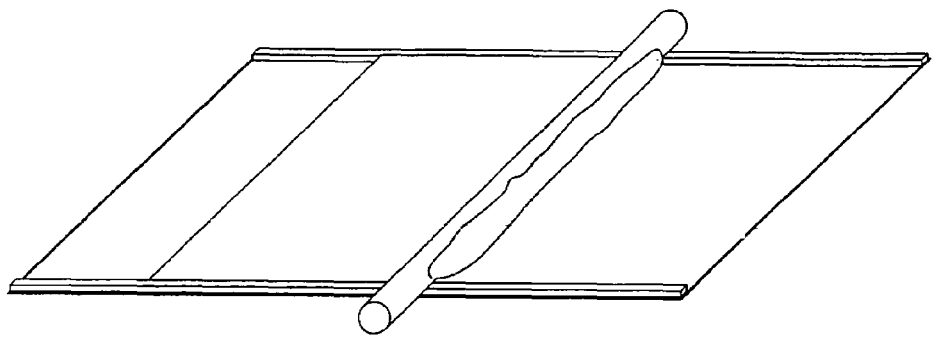
FIG. 34 illustrates a step in the inventive method of making a photo-radiation source, showing the step of uniformly spreading the emissive particulate/matrix mixture onto the bottom electrode.

FIG. 34 illustrates a step in the inventive method of making a photo-radiation source, showing the step of uniformly spreading the emissive particulate/matrix mixture onto the bottom electrode. In this case, the glass rod is pulled across the surface of the bottom electrode to spread a uniformly thick layer of the emissive particulate/matrix material. Spacers may be provided along the edges of the bottom electrode to promote the uniformity of the spread mixture layer.

Figure 35:
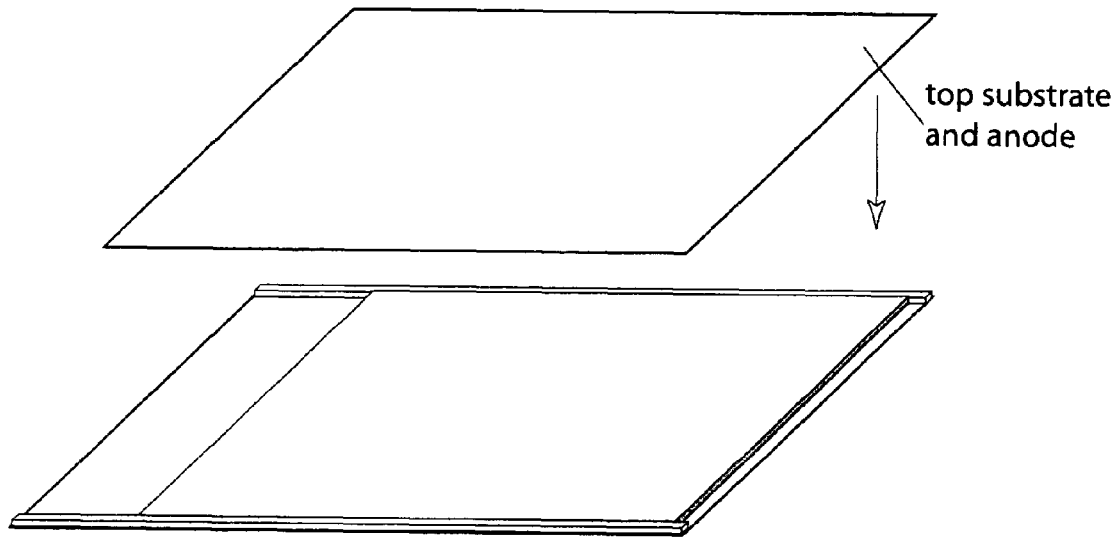
FIG. 35 illustrates a step in the inventive method of making a photo-radiation source, showing the addition of a transparent top substrate with transparent top electrode over the emissive particulate/matrix mixture.

FIG. 35 illustrates a step in the inventive method of making a photo-radiation source, showing the addition of a transparent top substrate with transparent top electrode over the emissive particulate/matrix mixture. At least one of the first electrode and the second electrode may be transparent to photo-radiation in a photo-radiation spectrum effective for the selective polymerization of photo-radiation-curable organic material. The first electrode and the second electrode can be planar and disposed on flexible substrates. The top substrate and the top electrode may be transparent, with the electrode material being indium tin oxide, a conjugated polymer, or other transparent conductor. The top substrate material can be polyester, glass or other transparent substrate material.

Figure 36:
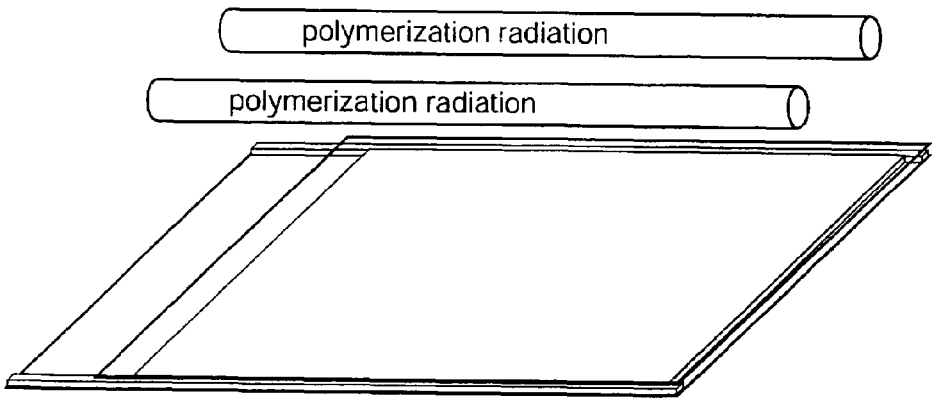
FIG. 36 illustrates a step in the inventive method of making a photo-radiation source, showing the step of photo-curing the matrix to form a solid-state emissive particulate/hardened matrix on the bottom substrate.

FIG. 36 illustrates a step in the inventive method of making a photo-radiation source, showing the step of photo-curing the matrix to form a solid-state emissive particulate/hardened matrix on the bottom substrate. Once the top substrate and top electrode are in place the matrix material can be hardened to form a solid-state device. The matrix material can be a photo-polymerizable organic material, a two-part system such as a two-part epoxy, a thermally hardenable material, or the like.

Figure 37:
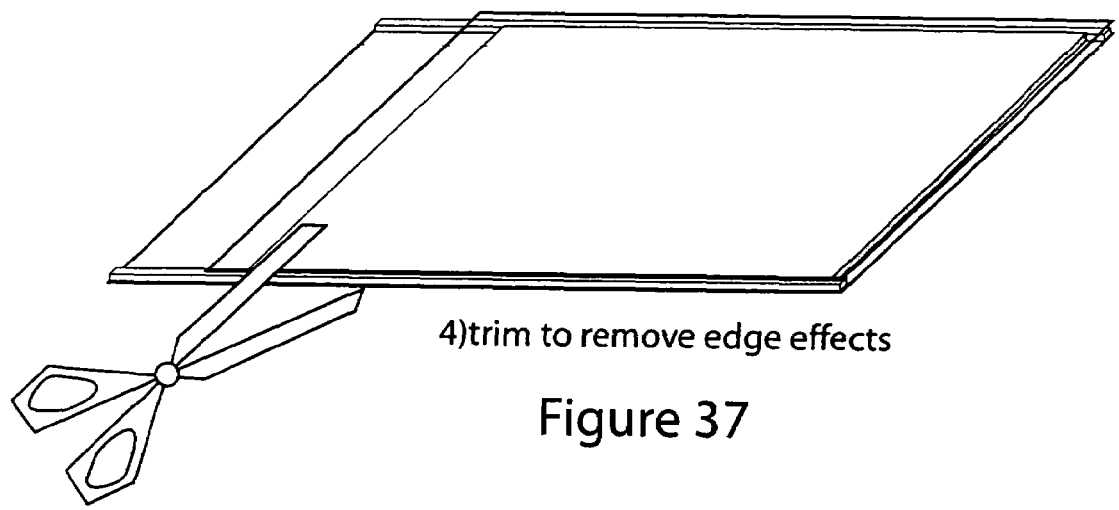
FIG. 37 illustrates a step in the inventive method of making a photo-radiation source, showing the step of trimming the solid-state photo-radiation source sheet.
Figure 38:
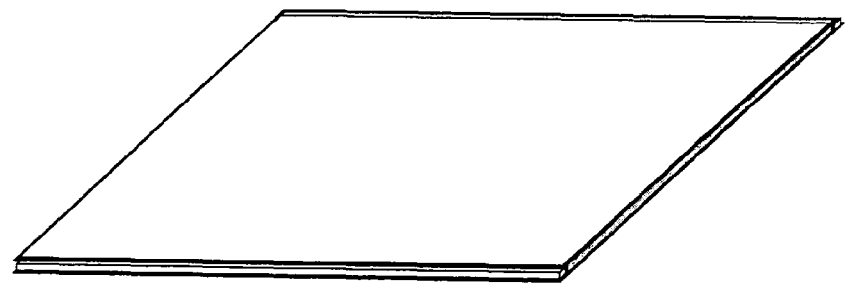
FIG. 38 illustrates the completed solid-state photo-radiation source sheet.
Figure 39:
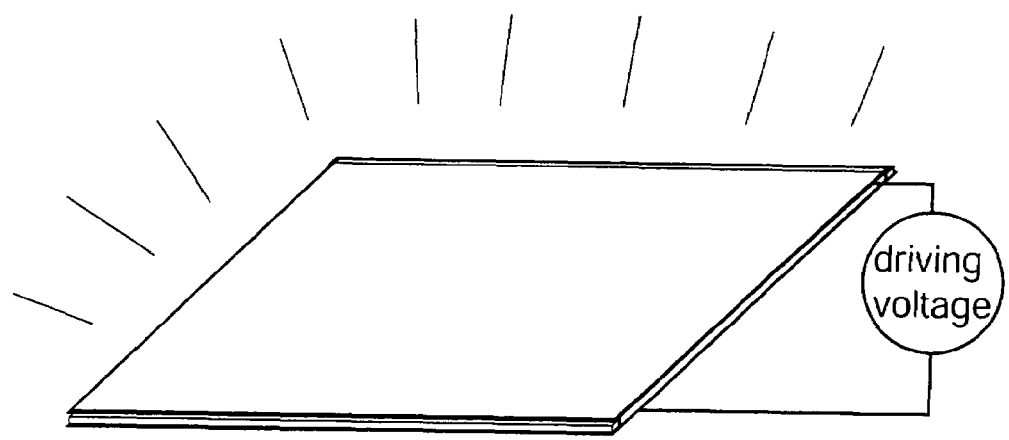
FIG. 39 illustrates the completed solid-state photo-radiation source sheet being driven with a driving voltage to light up.

FIG. 37 illustrates a step in the inventive method of making a photo-radiation source, showing the step of trimming the solid-state photo-radiation source sheet. Once the solid-state device structure has been obtained, the ends and edges can be trimmed as necessary or desired. FIG. 38 illustrates the completed solid-state photo-radiation source sheet and FIG. 39 illustrates the completed solid-state photo-radiation source sheet being driven with a driving voltage to light up.

Figure 44:
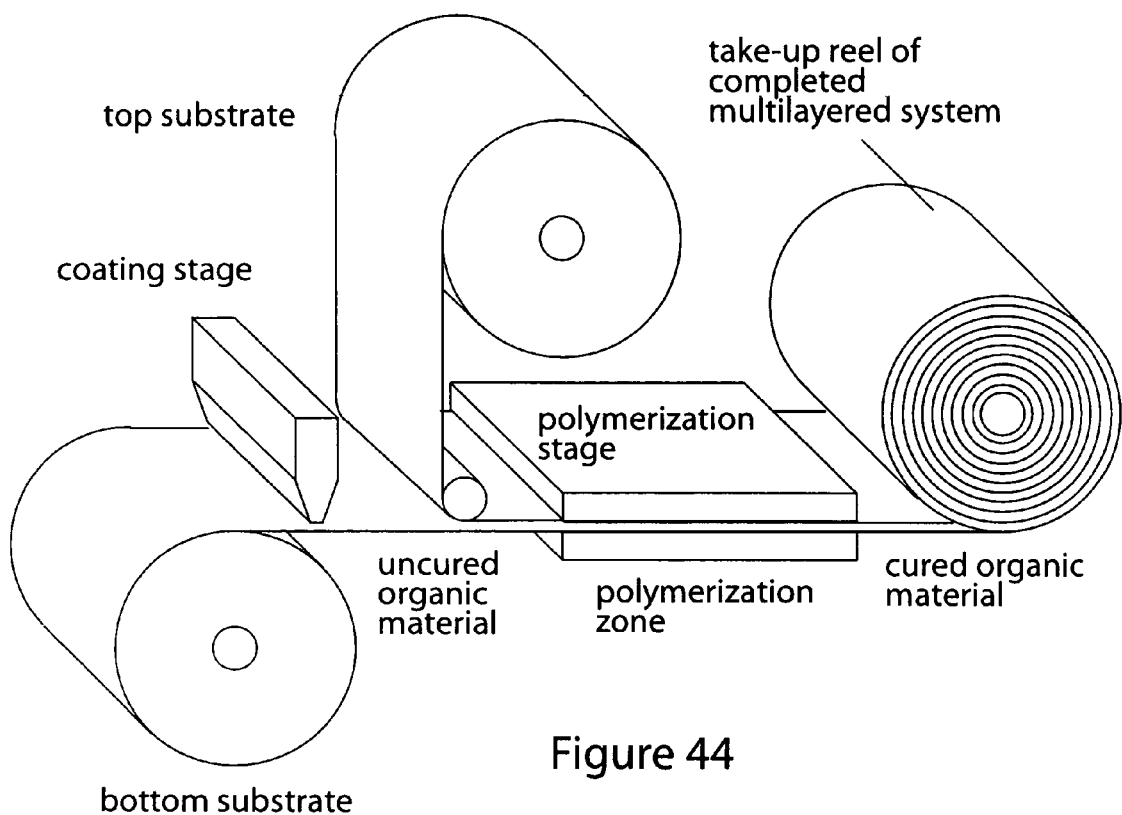
FIG. 44 shows an example of a roll-to-roll manufacturing process utilizing the inventive photo-radiation source for curing a photo-polymerizable organic material disposed between two continuous sheets of top and bottom substrates.
Figure 45:
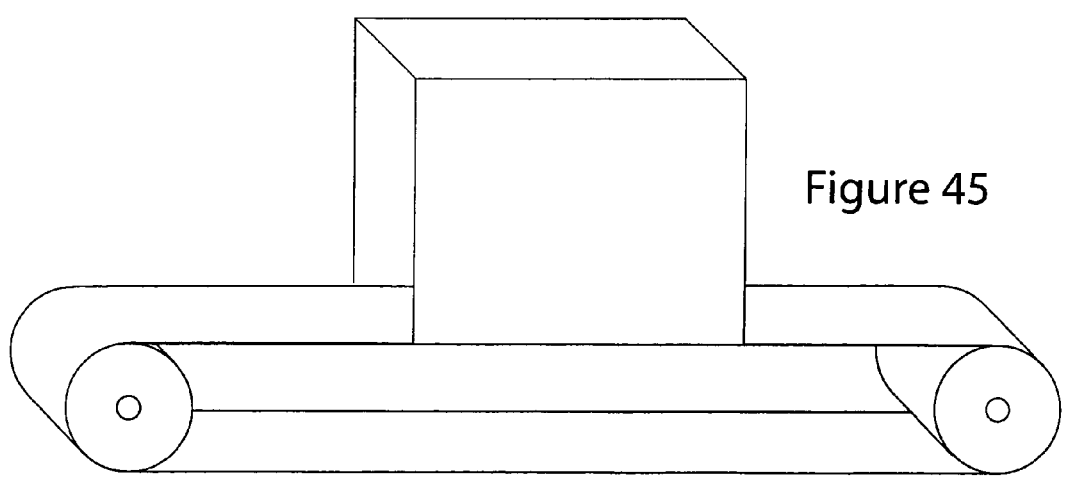
FIG. 45 shows an example of a conveyor continuous processing system utilizing a curing booth having the inventive photo-radiation source.

FIG. 44 shows an example of a roll-to-roll manufacturing process utilizing the inventive photo-radiation source for curing a photo-polymerizable organic material disposed between two continuous sheets of top and bottom substrates. FIG. 45 shows an example of a conveyor continuous processing system utilizing a curing booth having the inventive photo-radiation source. FIG. 46 shows an example of a light-pipe photo-polymerization system having an embodiment of the inventive photo-radiation source.

FIG. 47 shows an example of a three-dimensional scanned curing system having an embodiment of the inventive photo-radiation source. In this case, the inventive photo-radiation source is used to create a focused beam of light. Mirrors are used to scan the light beam over the surface of a pool of light-polymerizable organic material. As the light is scanned over the surface, the organic material that is impinged by the scanned light beam hardens. With each successive two-dimensional scan, the stage is lowered. Over multiple successive beam scanning and stage lowering passes, a three-dimensional solid object is built up.

Figure 48:
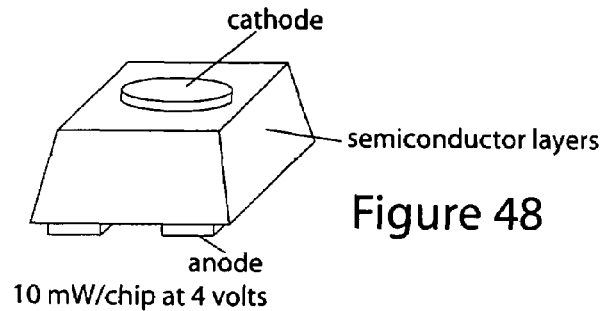
FIG. 48 illustrates a conventional inorganic light emitting diode die.

FIG. 48 illustrates a conventional inorganic light emitting diode die. A conventional inorganic light emitting diode die consists of semiconductor layers disposed between a cathode and an anode. When a voltage is applied to the cathode and anode, electrons and holes combine within the semiconductor layers and decay radiatively to produce light.

Figure 49:
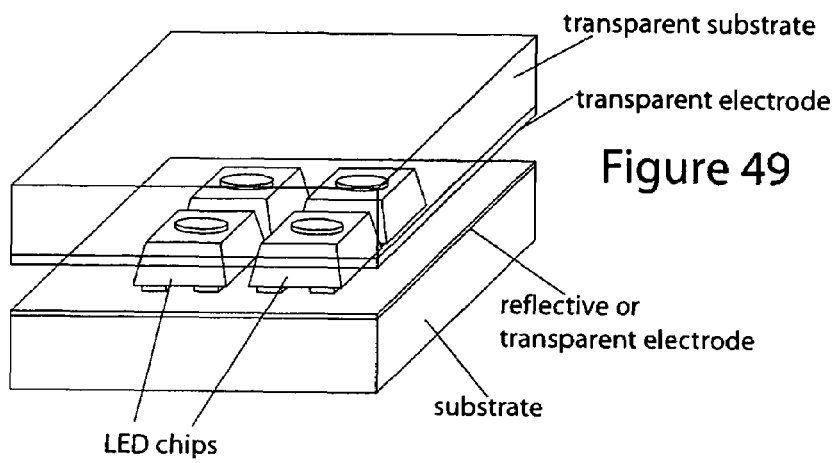
FIG. 49 illustrates an inventive photo-radiation (light active) source or sensor having a formation of light emitting diode dice connected without solder or wire bonding to a common anode and cathode.
Figure 50:
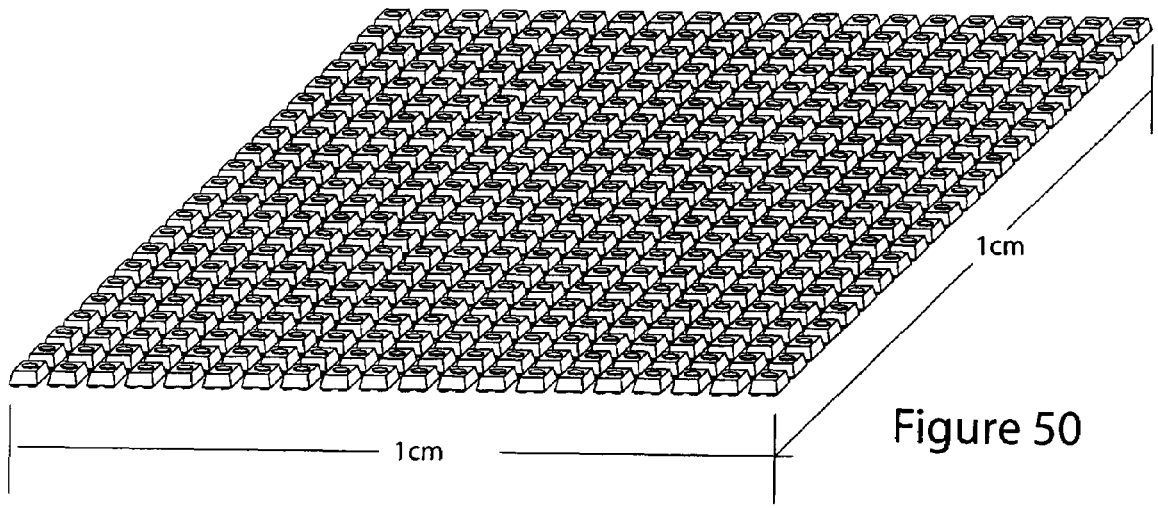
FIG. 50 illustrates the high packing density of the formation of light emitting diode dice obtainable in accordance with an embodiment of the inventive photo-radiation source.

In accordance with the present invention, a photo-radiation source is provided for the selective polymerization of photo-radiation-curable organic material. FIG. 49 illustrates an inventive photo-radiation source having a formation of light emitting diode dice connected without solder or wire bonding to a common anode and cathode. A plurality of light emitting diode dice generates a photo-radiation spectrum effective for the selective polymerization of photo-radiation-curable organic material. Each die has an anode and a cathode. A first electrode is in contact with each anode of the respective light emitting diode dice. A second electrode is in contact with each cathode of the respective light emitting diode dice. At least one of the first electrode and the second electrode comprises a transparent conductor. FIG. 50 illustrates the high packing density of the formation of light emitting diode dice obtainable in accordance with an embodiment of the inventive photo-radiation source. The plurality of dice can be permanently fixed in a formation by being squeezed between the first electrode and the second electrode without the use of solder or wire bonding. The plurality of dice can be permanently fixed in a formation by being adhered to at least one of the first electrode and the second electrode using an intrinsically conductive polymer. The intrinsically conductive polymer may comprise a benzene derivative. The intrinsically conductive polymer may comprise a polythiophene.

Figure 51:
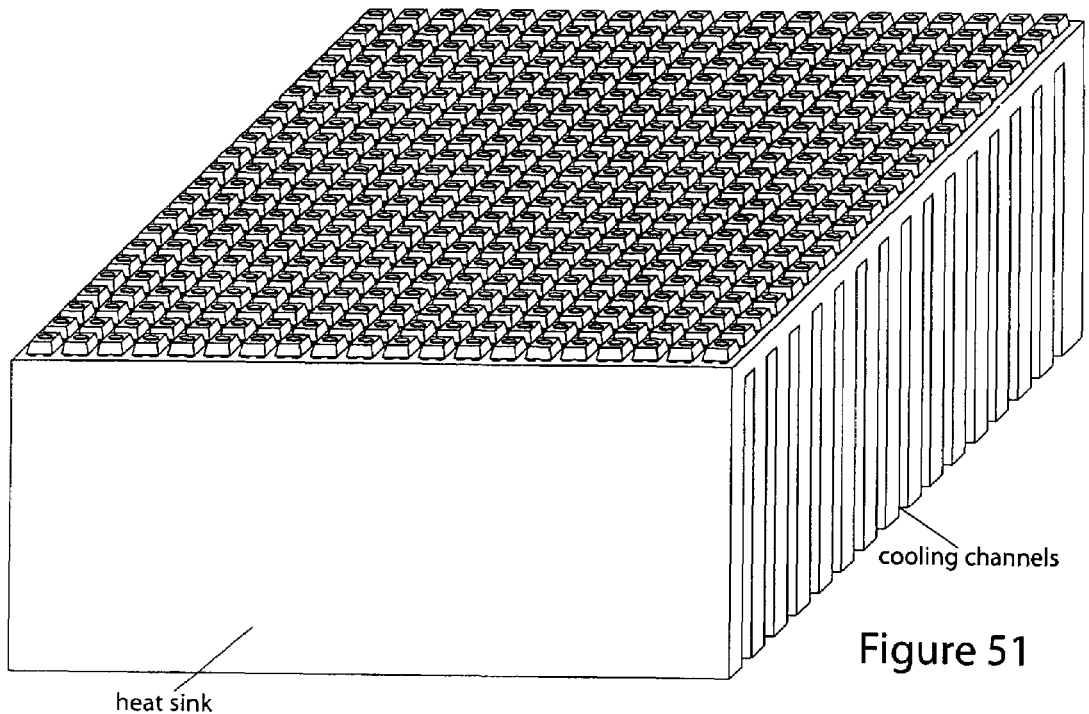
FIG. 51 is an embodiment of the inventive photo-radiation source showing a heat sink electrode base having cooling channels.

FIG. 51 is an embodiment of the inventive photo-radiation source showing a heat sink electrode base having cooling channels. In accordance with this embodiment of the present invention, the bottom electrode can be constructed of a metal, such as aluminum. A cooling system, such as cooling fins can be provided to dissipate heat that is generated when driving the tightly packed formation of inorganic light emitting diode dice. The system can be cooling channels through which a fluid material, such as forced air, water, or other liquid flows. The heated liquid can be passed through a radiator or other system for removing heat from it, and the cooling system can be a self-contained, closed apparatus. By this construction, an extremely high die packing density is obtained allowing for very high light intensity to be emitted. This very high light intensity enables the effective photo-polymerization of a photo-polymerizable organic material.

The photo-radiation spectrum emitted by the dice may be in a range between and including UV and blue light. The photo-radiation spectrum may include a range between and including 365 and 405 nm. In a specific embodiment of the invention, the photo-radiation spectrum emitted from the dice is in a range centered at around 420 nm.

In accordance with the present invention, a method of making a photo-radiation source is provided. A first planar conductor is provided and a formation of light emitting dice formed on the first planar conductor. Each die has a cathode and an anode. One of the cathode and anode of each die is in contact with the first planar conductor. A second planar conductor is disposed on top of the formation of light emitting dice, so that the second planar conductor is in contact with the other of the cathode and anode of each die. The first planar conductor is bound to the second planar conductor to permanently maintain the formation of light emitting dice. In accordance with the present invention, the formation is maintained, and the electrical contact with the conductors is obtained, without the use of solder or wire bonding for making an electrical and mechanical contact between the dice and either of the first planar conductor and the second planar conductor.

At least one of the first planar electrode and the second planar electrode is transparent. The first planar electrode and the second planar electrode can be bound together by an adhesive disposed between the first and second electrode. The formation of light emitting dice can be fixed to at least one of the first planar electrode and the second planar electrode by a binder material. This binder material may be an intrinsically conductive polymer. The first planar electrode and the second planar electrode can be bound together by the binder material that also fixes the formation of light emitting dice. In accordance with this embodiment of the invention, ultra-high die packing density is obtained without the need for solder or wire bonding each individual die.

Figure 52:
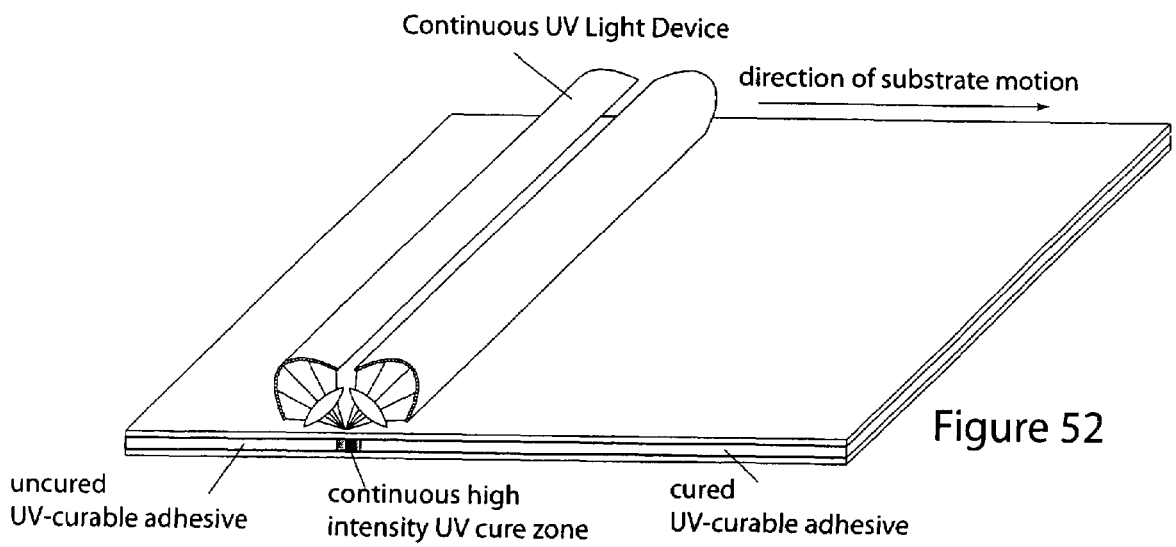
FIG. 52 illustrates an embodiment of the inventive photo-radiation source having a geometry and optical system for concentrating the light output for photo-curing an organic material in a continuous fabrication method.

FIG. 52 illustrates an embodiment of the inventive photo-radiation source having a geometry and optical system for concentrating the light output for photo-curing an organic material in a continuous fabrication method. The curved geometry is obtained by forming the substrates, the first electrode and the second electrode as being planar and flexible. The flexible substrates can thus be shaped into an optical geometry effective for controlling light emitted from the plurality of light emitting diode dice, or for controlling the light emitted from the radiation source light sheet described above.

Figure 57:
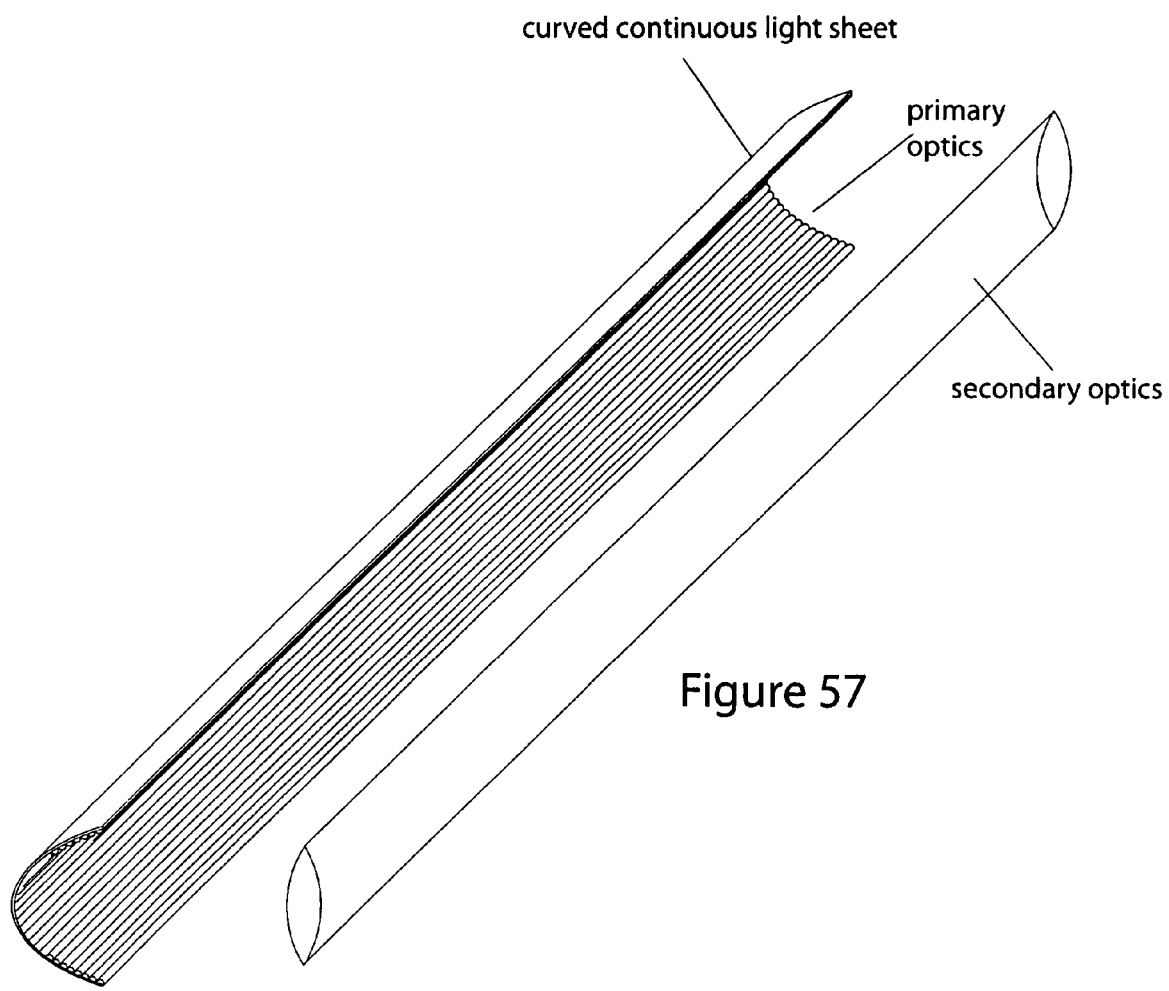
FIG. 57 is a view of the curved light sheet construction having a secondary optical system for controlling the focus of light emission.
Figure 58:
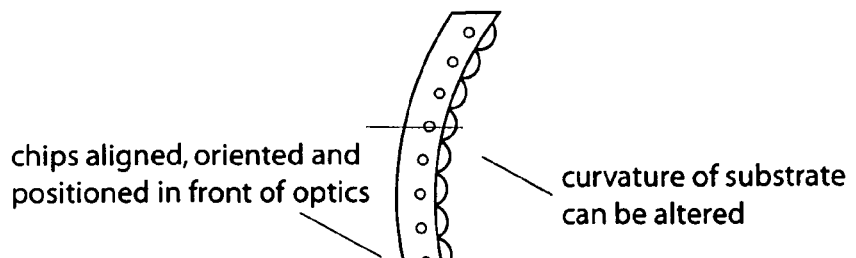
FIG. 58 is a schematic side view showing light emitting diode dice disposed adjacent to respective optical lenses.
Figure 59:
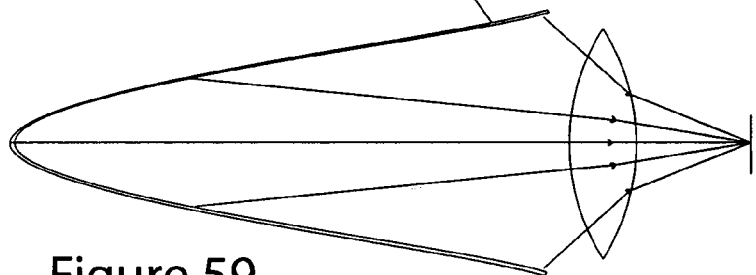
FIG. 59 is a schematic side view showing how the light output intensity can be increased by changing the shape of the curved light sheet construction.
Figure 60:
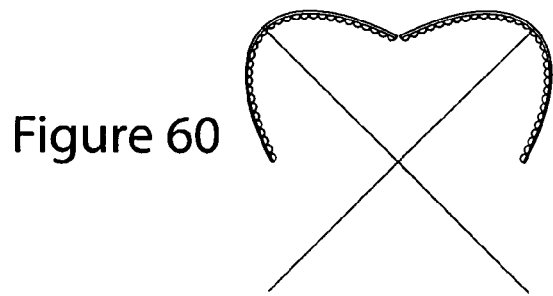
FIG. 60 is a schematic side view showing two curved light sheets having a common light emission focal point.
Figure 61:
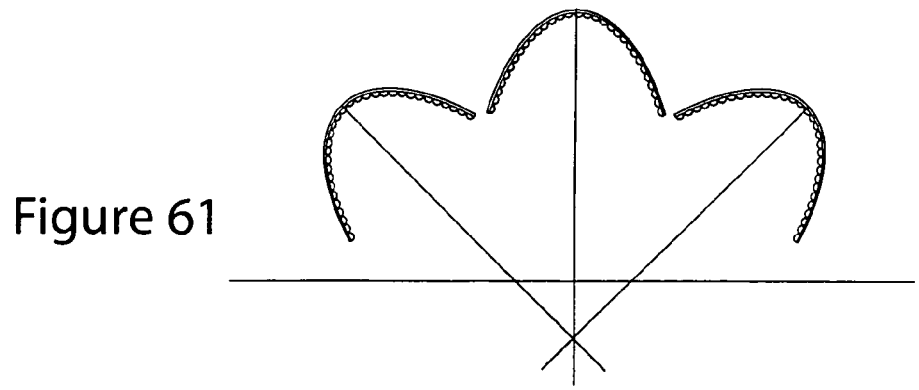
FIG. 61 is a schematic side view showing three curved light sheets having a common light emission focal point.

FIG. 53 shows an isolated view of a substrate with an optical surface for controlling the focus of light emitted from an embodiment of the inventive photo-radiation source. FIG. 54 shows an embodiment of the inventive photo-radiation source having a flat light sheet construction with a top substrate with an optical surface. FIG. 55 shows the inventive photo-radiation source having a curved light sheet construction shaped with a light emission enhancing curvature. FIG. 56 is a schematic side view of the curved light sheet construction illustrating the focal point of light emission. FIG. 57 is a view of the curved light sheet construction having a secondary optical system for controlling the focus of light emission. FIG. 58 is a schematic side view showing light emitting diode dice disposed adjacent to respective optical lenses. FIG. 59 is a schematic side view showing how the light output intensity can be increased by changing the shape of the curved light sheet construction. FIG. 60 is a schematic side view showing two curved light sheets having a common light emission focal point. FIG. 61 is a schematic side view showing three curved light sheets having a common light emission focal point. As shown in these drawings, at least one of the flexible substrates can include a first optical system associated with it for controlling light emitted from the plurality of light emitting diode dice. A second optical system can be disposed adjacent to one of the substrates for controlling light emitted from the plurality of light emitting diode dice.

FIG. 62 is a cross-sectional block diagram showing the constituent parts of the inventive light active sheet. In accordance with an embodiment of the inventive light active sheet, a top PET substrate has a coating of ITO, acting as the top electrode. A bottom PET substrate can be ITO PET, metal foil, metalized mylar, etc., depending on the intended application of the light sheet (e.g., transparent HUD element, light source, solar panel, etc.). The matrix (carrier) material may be a transparent photopolymerizable solid polymer electrolyte (SPE) based on cross-linked polysiloxane-g-oglio9ethylene oxide (see, for example, *Solid polymer electrolytes based on cross-linked polysiloxane-g-oligo(ethylene oxide): ionic conductivity and electrochemical properties*, Journal of Power Sources 119-121 (2003) 448-453, which is incorporated by reference herein). The emissive particulate may be commercially available LED dice, such as an AlGaAs/AlGaAs Red LED Die—TK 112UR, available from Tyntek, Taiwan).

Alternatively the particulate may be comprised of light-to-energy particles, having charge donor and charge acceptor semiconductor layers, such as found in typical silicon-based solar panels. In the case of an energy-to-light device (i.e., a light sheet), it may be preferable for the matrix material to be less electrically conductive than the semiconductor elements so that the preferred path of electrical conductivity is through the light emitting elements. In the case of a light-to-energy device (i.e., a solar panel), it may be preferable for the matrix material to be more electrically conductive than the semiconductor element so that charges separated at the donor/acceptor interface effectively migrate to the top and bottom substrate electrodes.

FIG. 63 is a cross-section block diagram of an embodiment of the inventive light active sheet having a cross-linked polymer (e.g., polysiloxane-g-oglio9ethylene oxide) matrix, UV semiconductor elements, and phosphor re-emitter. In this case, a white-light solid-state light sheet is obtained through the stimulated re-emission of light in the visible sprectrum via UV stimulation of a phosphore re-emitter additive dispersed in the matrix between the substrates. In this case, the UV semiconductor elements may be LED dice (for example, UV LED dice C405-MB290-S0100, available from Cree of North Carolina) and the phosphor may be a YAG (yttrium aluminum garnet) phosphor.

FIG. 64 is a cross-sectional block diagram of an embodiment of the inventive light active sheet having a light diffusive and/or re-emitter coating on a transparent substrate. In accordance with this embodiment, the additives in the matrix may be, for example, light diffusers, adhesive enhancers, matrix conductivity enhancers, etc. The re-emitter coating can be a YAG phosphor coating (with a multi-layered substrate). Further, the light diffusion can be obtained through the substrate composition or through substrate surface effects, such as calendaring and/or embossing.

FIG. 65 is a cross-sectional block diagram of an embodiment of the inventive light active sheet having blue and yellow semiconductor elements, and light diffusers (e.g., glass beads) within the matrix. The blue and yellow semiconductor elements can be LED dice that are selected to create a white light emission, or an RGB combination.

Figure 66:
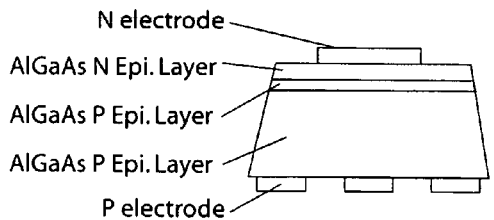
FIG. 66 is a side view of a commercially available inorganic LED die.
Figure 67:
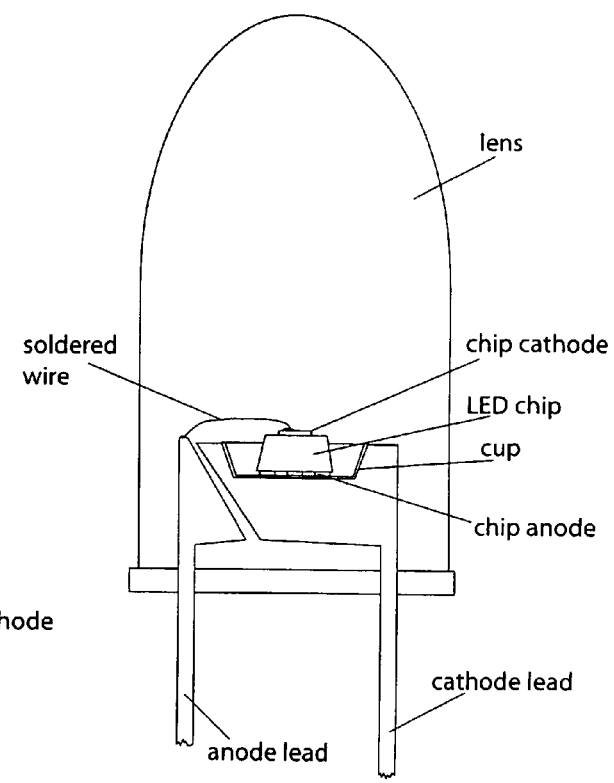
FIG. 67 is a cross-sectional view of a conventional LED lamp.

FIG. 66 is a side view of a commercially available inorganic LED die. A conventional inorganic LED die is available from many manufacturers, typically has a relatively narrow radiation emission spectrum, is relatively energy efficient, has a long service life and is solid-state and durable. The die shown is an example of an AlGaAs/AlGaAs red die, obtained from Tyntek Corporation, Taiwan. These dice have dimensions roughly 12 mil×12 mil×8 mil, making them very small point light sources. As shown in FIG. 67, in a conventional LED lamp, this die is held in a metal cup so that one electrode of the die (e.g., the anode) is in contact with the base of the cup. The metal cup is part of an anode lead. The other electrode of the die (e.g., the cathode) has a very thin wire solder or wire bonded to it, with the other end of the wire solder or wire bonded to an anode lead. The cup, die, wire and portions of the anode and cathode leads are encased in a plastic lens with the anode and cathode leads protruding from the lens base. These leads are typically solder or wire bonding to a circuit board to selectively provide power to the die and cause it to emit light. It is very difficult to manufacture these conventional lamps due to the very small size of the die, and the need to solder or wire bond such a small wire to such a small die electrode. Further, the plastic lens material is a poor heat conductor and the cup provides little heat sink capacity. As the die heats up its efficiency is reduced, limiting the service conditions, power efficiency and light output potential of the lamp. The bulkiness of the plastic lens material and the need to solder or wire bond the lamp leads to an electrical power source limits emissive source packing density and the potential output intensity per surface area.

Figure 68:
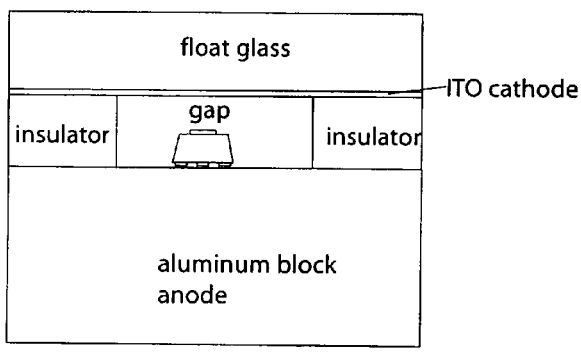
FIG. 68 is a cross-sectional view of an experimental prototype of the inventive photo-radiation source having a gap between the N electrode of an LED die and an ITO cathode.

FIG. 68 is a cross-sectional view of an experimental prototype of the inventive photo-radiation source having a gap between the N electrode of an LED die and an ITO cathode. When voltage is applied to the aluminum anode and the ITO cathode, the air gap between the N electrode and the ITO prevents electricity from getting to the die.

Figure 69:
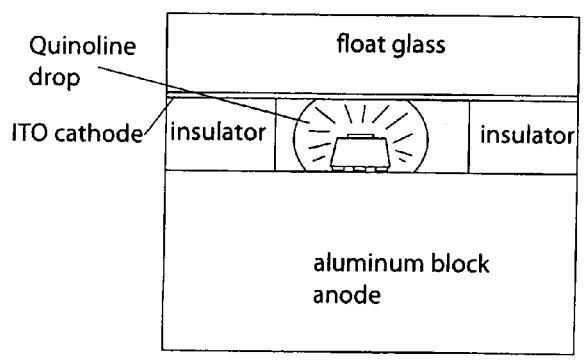
FIG. 69 is a cross-sectional view of the experimental prototype of the inventive photo-radiation source having a drop of quinoline as a conductive matrix material completing the electrical contact between the N electrode of the LED die and the ITO cathode.

FIG. 69 is a cross-sectional view of the experimental prototype of the inventive photo-radiation source having a drop of quinoline as a conductive matrix material completing the electrical contact between the N electrode of the LED die and the ITO cathode.

When voltage is applied to the aluminum anode and the ITO cathode, the quinoline completes the electrical connection, and the die lights up brightly. This inventive device structure allows a connection that does not require solder or wire bonding between the die and the current source from the anode and cathode electrodes (the ITO and the aluminum). The aluminum block acts as an effective heat sink, and the quinoline surrounding the die provides very efficient heat transfer from the die to the aluminum block. The result is that the die can be driven at higher voltage and bright intensity. Also, since the connection to the die does not require a tedious and expensive solder or wire bonding operation, it is much easier to fabricate the inventive structure than the conventional LED lamp construction (shown, for example, in FIG. 67). Further, the avoidance of solder or wire bonding connections directly to the die, and the heat transfer and dissipation provided by the conductive medium and the metallic heat sink, allows for extremely high die packing densities to be realized (as shown, for example, in FIG. 51). The result is an effective photo-radiation source having superior radiation intensity, durability, lifetime, cost and spectrum as compared with any of the conventional art.

Figure 70:
FIG. 70 is a photograph of an experiment prototype demonstrating a light active particle (LED die) connected to a top and/or bottom electrode through a charge transport material (quinoline)

FIG. 70 is a photograph of an experiment prototype demonstrating a light active particle (LED die) connected to a top and/or bottom electrode through a charge transport material (quinoline). This photograph shows a conventional LED die suspended in a drop of quinoline, a benzene derivative. The quinoline drop and LED die are disposed between a top and bottom conductive substrate comprised of ITO-coated float glass. When voltage is applied to the respective top and bottom conductors (the ITO), the electrical connection to the die is made through the quinoline, and the die brightly lights up.

Figure 71:
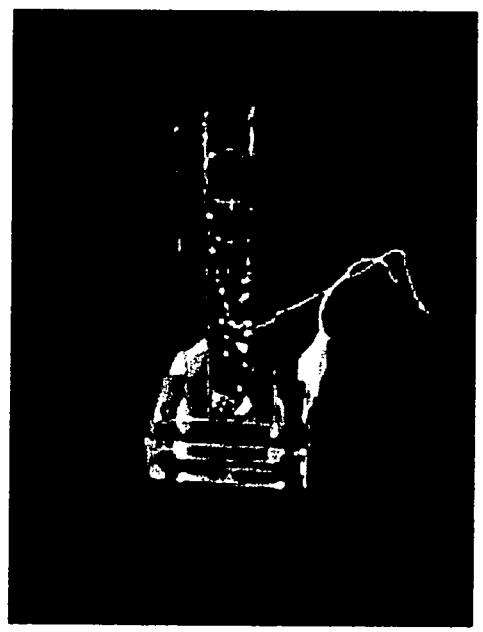
FIG. 71 is a photograph of an experimental prototype demonstrating a free-floating light emissive particulate (miniature LED lamps) dispersed within a conductive fluid carrier (salt-doped polyethylene oxide)

FIG. 71 is a photograph of an experimental prototype demonstrating a free-floating light emissive particulate (miniature LED lamps) dispersed within a conductive fluid carrier (salt-doped polyethylene oxide). An emissive particulate/conductive carrier concept was demonstrated and proven viable using very small "particulated" inorganic LEDs suspended in an ionic conducting fluid composed of a fluid poly(ethylene glycol) (PEG) polymer doped with a room temperature molten salt. When connected to 110 v AC, these 3 v DC devices light up without burning out.

Figure 72:
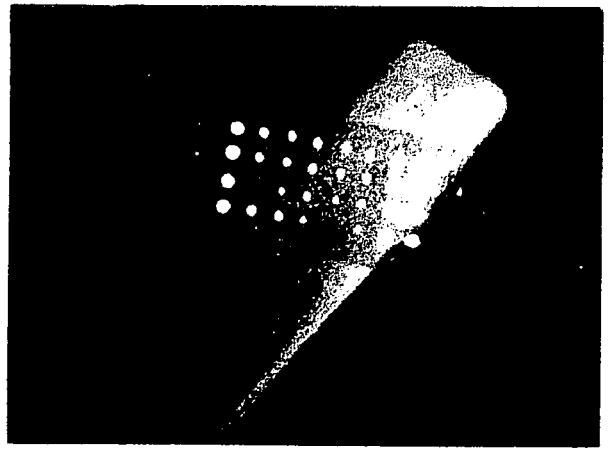
FIG. 72 is a photograph of an experiment prototype demonstrating an 8×4 element grid of light active semiconductor elements (LED dice) disposed between ITO-coated glass substrates.

FIG. 72 is a photograph of an experiment prototype demonstrating an 8×4 element grid of light active semiconductor elements (LED dice) disposed between ITO-coated glass substrates. This photograph shows a light sheet prototype comprised of an array of 32 inorganic light emitting diode dice, each die is about the size of a fine grain of salt. Unlike conventional LED lamps (shown, for example, in FIG. 67), in accordance with the present invention, there are no solder or wires connecting the LED dice to the power source. By avoiding the need for solder and wiring, the present invention provides a considerable cost savings as compared with the existing technologies. The inventive light sheet also has a unique, ultra-thin form factor and full spectrum of colors (including high brightness white light).

Figure 73:
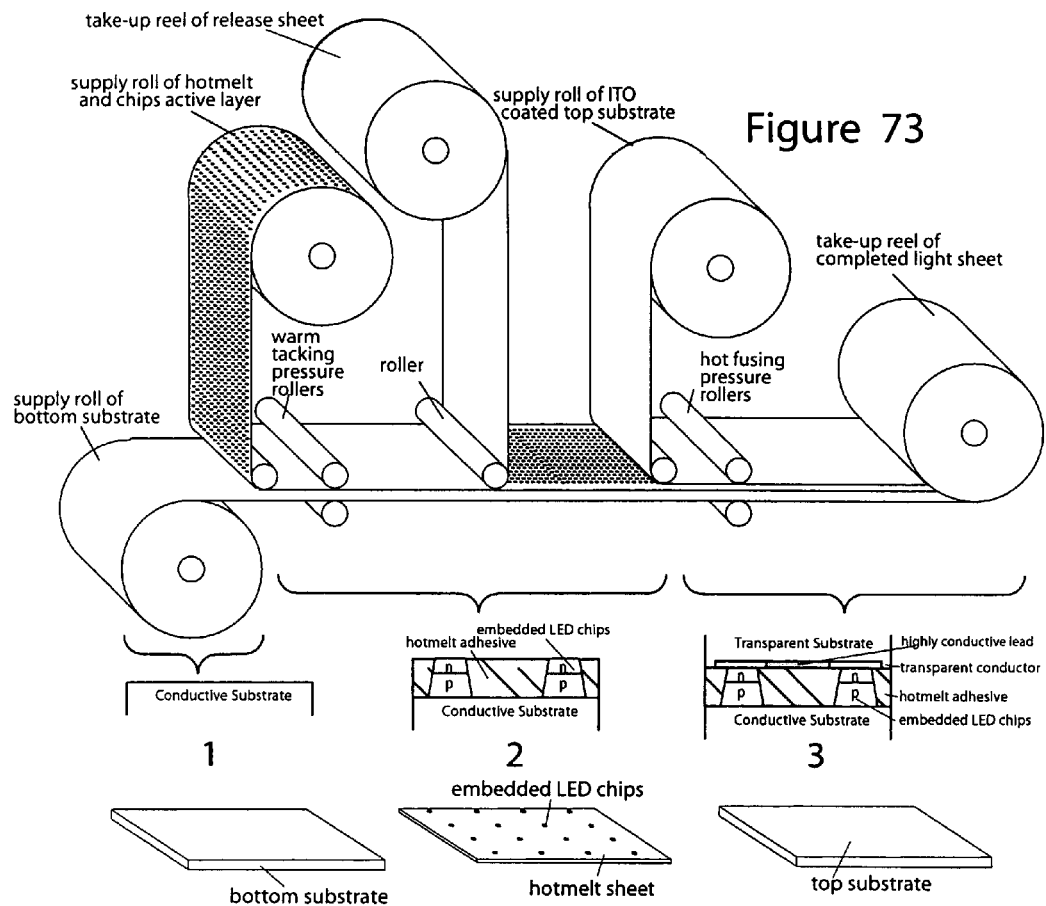
FIG. 73 illustrates an inventive method for manufacturing a light active sheet using a roll-to-roll fabrication process.

As shown in FIG. 73, in accordance with another aspect of the present invention, a method is provided of making a light active sheet. A bottom substrate having an electrically conductive surface is provided. A hotmelt adhesive sheet is provided. Light active semiconductor elements, such as LED die, are embedded in the hotmelt adhesive sheet. The LED die each have a top electrode and a bottom electrode. A top transparent substrate is provided having a transparent conductive layer. The hotmelt adhesive sheet with the embedded LED die is inserted between the electrically conductive surface and the transparent conductive layer to form a lamination. The lamination is run through a heated pressure roller system to melt the hotmelt adhesive sheet and electrically insulate and bind the top substrate to the bottom substrate. As the hotmelt sheet is softened, the LED die breakthrough so that the top electrode comes into electrical contact with the transparent conductive layer of the top substrate and the bottom electrode comes into electrical contact with the electrically conductive surface of the bottom substrate. Thus, the p and n sides of each LED die are automatically connected to the top conductive layer and the bottom conductive surface. Each LED die is encapsulated and secured between the substrates in the flexible, hotmelt adhesive sheet layer. The bottom substrate, the hotmelt adhesive (with the embedded LED die) and the top substrate can be provided as rolls of material. The rolls are brought together in a continuous roll fabrication process, resulting in a flexible sheet of lighting material.

FIG. 73 illustrates an inventive method for manufacturing a light active sheet using a roll-to-roll fabrication process. The inventive light sheet has a very simple device architecture including a bottom substrate, a hotmelt adhesive (with embedded LED die) and a top substrate. The bottom substrate, the hotmelt adhesive (with the embedded LED die) and the top substrate can be provided as rolls of material. The rolls are brought together in a continuous roll fabrication process, resulting in a flexible sheet of lighting material.

The inventive roll-to-roll fabrication process enables a high yield, lower cost manufacturing of light active and semiconductor electronic circuits. Also, the present invention results in devices with a unique, very thin form factor that is extremely flexible, waterproof and highly robust.

The present invention pertains to a method of making a light active sheet. The inventive roll-to-roll fabrication process starts with a supply roll of bottom substrate material having an electrically conductive surface (stage 1). As shown in stage 2, a supply roll of a hotmelt adhesive sheet is brought into contact with the electrically conductive surface of the bottom substrate. Light active semiconductor elements, such as LED die, are embedded in the hotmelt adhesive sheet. The LED die each has a top electrode and a bottom electrode. The LED die (or other semiconductor or electronic circuit elements) can be pre-embedded into the hotmelt adhesive sheet off-line in a separate operation, or in-line as described elsewhere herein. A warm tacking pressure roller system can be used to soften the hotmelt adhesive and secure it to the bottom substrate. The hotmelt adhesive sheet can include a release sheet that protects the embedded semiconductor elements and keeps the adhesive from sticking to itself in the roll. At stage 3, a top transparent substrate having a transparent conductive layer is provided. The hotmelt adhesive sheet with the embedded LED die is inserted between the electrically conductive surface and the transparent conductive layer to form a lamination. The lamination is run through hot fusing pressure rollers to melt the hotmelt adhesive sheet and electrically insulate and bind the top substrate to the bottom substrate. The rollers may be heated, or separate heating zones can be provided for heat activating the adhesive.

Applicants have discovered that as the hotmelt sheet is softened, the LED die breakthrough the adhesive so that the top electrode comes into electrical contact with the transparent conductive layer of the top substrate and the bottom electrode comes into electrical contact with the electrically conductive surface of the bottom substrate. Thus, the p and n sides of each LED die are automatically connected to the top conductive layer and the bottom conductive surface. Each LED die is completely encapsulated within the hotmelt adhesive and the substrates. In addition, the LED die is each permanently secured between the substrates fully encased within the flexible, hotmelt adhesive sheet layer and substrates.

Figure 74:
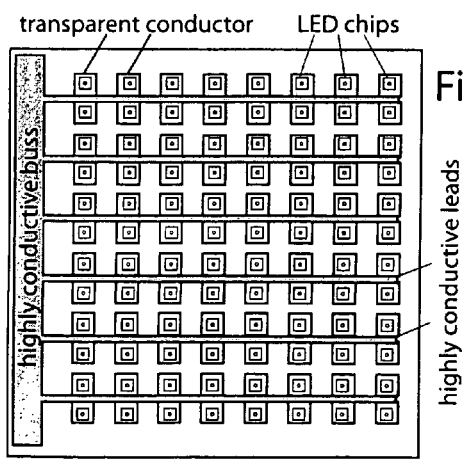
FIG. 74 is a top view of an inventive light active sheet showing transparent conductor windows and highly conductive leads.

FIG. 74 is a top view of an inventive light active sheet showing transparent conductor windows and highly conductive leads. In this embodiment, the transparent conductor windows are applied to a transparent substrate, such as PET, through a screen printing, sputtered through a mask, inkjet, gravure, offset, or other coating or printing process. The transparent conductive windows allow light generated by the LEDs to be emitted. In accordance with the present invention, conventional wirebonding or soldering of the LED die is not necessary. Instead, when the hotmelt sheet melts, the LED dice automatically make face-to-face electrically conductive contact with the top and bottom conductive surfaces on the substrates, and that contact is permanently maintained when the hotmelt sheet cools. This device architecture is readily adaptable to high yield manufacturing, and may avoid the need for metallic conductive pads formed on the LED die emitting face. The avoidance of the metallic conductive pad results in more effective light emission from the LED die, since the metallic conductive pads conventionally required for soldering or wirebonding are also light blocking. Thus, in addition to providing a lower manufacturing cost and unique very thin form factor, the inventive light sheet may also be a more energy efficient device.

Figure 75:
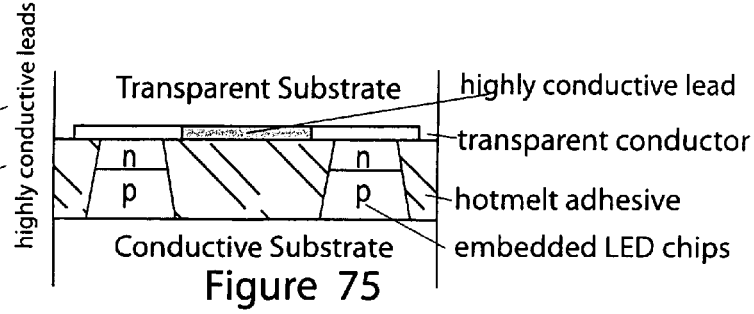
FIG. 75 is a cross sectional schematic view of the inventive light active sheet showing transparent conductor windows and highly conductive leads.

FIG. 75 is a cross sectional schematic view of the inventive light active sheet showing transparent conductor windows and highly conductive leads. The inventive light active sheet consists of a bottom substrate flexible sheet having an electrically conductive surface. A top transparent substrate flexible sheet has a transparent conductive layer disposed on it. An electrically insulative adhesive flexible sheet has light active semiconductor elements fixed to it. The light active semiconductor elements each have an n-side and a p-side. The electrically insulative adhesive sheet having the light active semiconductor elements fixed to it is inserted between the electrically conductive surface and the transparent conductive layer to form a lamination, The adhesive sheet is activated so that the electrically insulative adhesive electrically insulates and binds the top substrate sheet to the bottom substrate sheet. When the adhesive sheet is activated, one of the n-side or the p-side of the light active semiconductor elements is automatically brought into electrical communication with the transparent conductive layer of the top substrate sheet. The other of the n-side or the p-side is automatically brought into electrical communication with the electrically conductive surface of the bottom substrate sheet to form a light active device.

Figure 76:
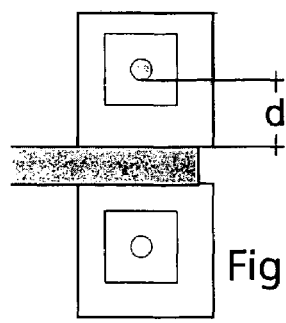
FIG. 76 is an isolated top view of a pair of LED devices connected to a highly conductive lead line through a more resistive transparent conductive window.
Figure 77:
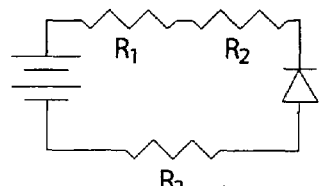
FIG. 77 is an equivalent electrical circuit diagram of the inventive semiconductor device circuit.

FIG. 76 is an isolated top view of a pair of LED devices connected to a highly conductive lead line through a more resistive transparent conductive window. FIG. 77 is an equivalent electrical circuit diagram of the inventive semiconductor device circuit. The transparent windows are composed of a conductive material that is not as conductive as a metal conductor, such as copper wire. Therefore, each transparent window acts as a resistor in electrical series connection with each respective LED die. This resistor protects the LED die from seeing too much electrical energy. Further, highly conductive leads are connected to each transparent window, and each highly conductive lead is connected to a highly conductive buss. Power is supplied to this buss, and each LED die is energized with the same electrical power so that a consistent light is generated across the entire light sheet.

Figure 78:
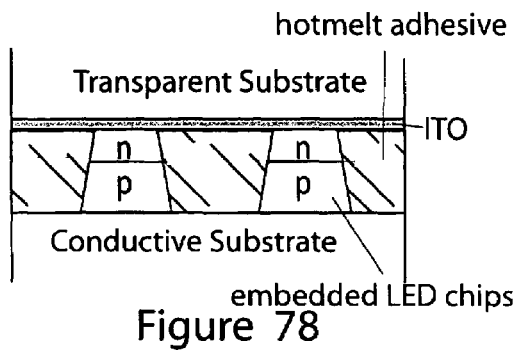
FIG. 78 is a cross sectional view of the light active sheet showing a transparent conductor layer on a transparent top substrate, LED dice embedded in a hotmelt adhesive layer, and a conductive bottom substrate.
Figure 79:
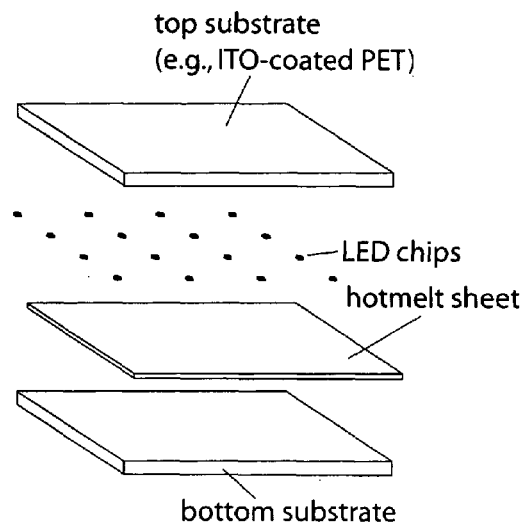
FIG. 79 is an exploded view of the component layers of the inventive light active sheet.

FIG. 78 is a cross sectional view of the light active sheet showing a transparent conductor layer on a transparent top substrate, LED dice embedded in a hotmelt adhesive layer, and a conductive bottom substrate. FIG. 79 is an exploded view of the component layers of the inventive light active sheet. In accordance with an aspect of the present invention, a method of making a light active sheet is provided. A bottom substrate having an electrically conductive surface is provided. An electrically insulative adhesive is provided. Light active semiconductor elements, such as LED die, are fixed to the electrically insulative adhesive. The light active semiconductor elements each have an n-side and a p-side. A top transparent substrate is provided having a transparent conductive layer.

The electrically insulative adhesive having the light active semiconductor elements fixed thereon is inserted between the electrically conductive surface and the transparent conductive layer to form a lamination. The electrically insulative adhesive is activated to electrically insulate and bind the top substrate to the bottom substrate. The device structure is thus formed so that either the n-side or the p-side of the light active semiconductor elements are in electrical communication with the transparent conductive layer of the top substrate, and so that the other of the n-side or the p-side of each the light active semiconductor elements are in electrical communication with the electrically conductive surface of the bottom substrate to form a light active device. In accordance with the present invention, p and n sides of each LED die are automatically connected and maintained to the respective top and bottom conductor, completely securing each LED die between the substrates in a flexible, hotmelt adhesive sheet layer.

The bottom substrate, the electrically insulative adhesive and the top substrate can be provided as respective rolls of material. This enables the bottom substrate, the electrically insulative adhesive (with the LED die embedded therein) and the top substrate together in a continuous roll fabrication process. It is noted that these three rolls are all that are necessary for forming the most basic working device structure in accordance with the present invention. This simple and uncomplicated structure makes it inherently adaptable to a high yield, continuous, roll-to-roll fabrication techniques that is not obtainable using prior art techniques. As shown in FIG. 78, the transparent conductor on the top substrate can be formed as a continuous surface, such as ITO (indium tin oxide), conductive polymer, or a thin metallic layer.

Figure 80A:
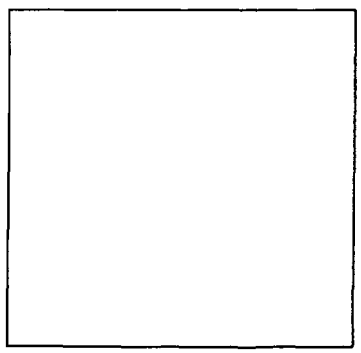
FIG. 80(a) is a top view of a transparent substrate sheet.
Figure 80B:
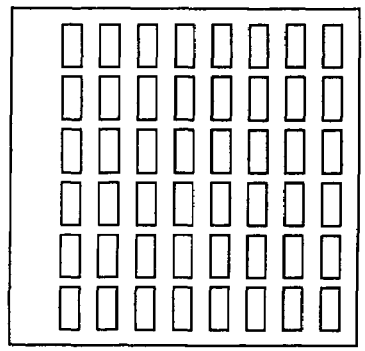
FIG. 80(b) is a top view of the transparent substrate sheet having transparent conductive windows formed on it.
Figure 80C:
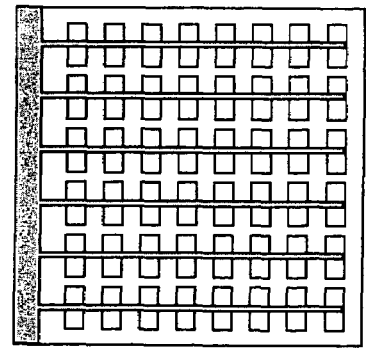
FIG. 80(c) is a top view of the transparent substrate sheet having transparent conductive widows, highly conductive lead lines and a conductive buss formed on it.

FIG. 80($a$) is a top view of a transparent substrate sheet. FIG. 80($b$) is a top view of the transparent substrate sheet having transparent conductive windows formed on it. FIG. 80($c$) is a top view of the transparent substrate sheet having transparent conductive widows, highly conductive lead lines and a conductive buss formed on it. In this case, the transparent conductive windows can be performed off-line on the top substrate and the substrate re-rolled, or the conductive windows can be in-line during the fabrication of the inventive light sheet or semiconductor device. The windows can be formed by inkjet, coating through a mask, screen printing or other technique. The transparent material can be a conductive paste, a conductive polymer, a sputtered layer, or other suitable material that enables light to be transmitted from the LED die.

FIG. 81 shows a two-part step for stretching a release substrate to create a desired spacing between semiconductor elements diced from a wafer. A predetermined pattern of the light active semiconductor elements can be formed using conventional pick and place machines. Also, in accordance with an inventive adhesive transfer method, the stretched substrate is used to create a desired spacing. The dice are provided from the foundry on an adhesive sheet that can be stretched for the pick and place equipment to remove the dice. In accordance with the present invention, a regular array can be formed by spreading the sheet to make an array of the right spacing and transfer it directly to the melt adhesive. There may need to be an intermediate step that transfers to a linear tape and then the linear tape is applied at a controlled rate to make wider or closer spacing, and with machine vision to identify the holes in the foundry sheet caused by the inspection and removal of defect dice.

FIG. 82 is an exploded view of the sheet components used to embed the semiconductor elements into an adhesive hotmelt sheet. A hotmelt sheet is placed on top of the stretched LED dice, and a Teflon release layer placed on top of the hotmelt sheet. The hotmelt sheet is heated, and pressure applied to embed the LED dice in the hotmelt sheet. When cooled, the hotmelt sheet can be removed from the stretch release substrate and the embedded LED dice lifted along with the hotmelt sheet. FIG. 83(*a*) is a cross sectional view of the hotmelt sheet with embedded semiconductor elements prior to removing the semiconductor elements from the release stretch substrate. FIG. 83(*b*) is a cross sectional view of the hotmelt sheet with embedded semiconductor elements after removing the semiconductor elements from the release stretch substrate.

In addition to lifting the LED dice from the release sheet in formation or using a pick and place machine, other inventive methods can be employed for forming a predetermined pattern of the light active semiconductor elements including the electrostatic, optomagnetic and adhesive transfer methods described herein.

Figure 84:
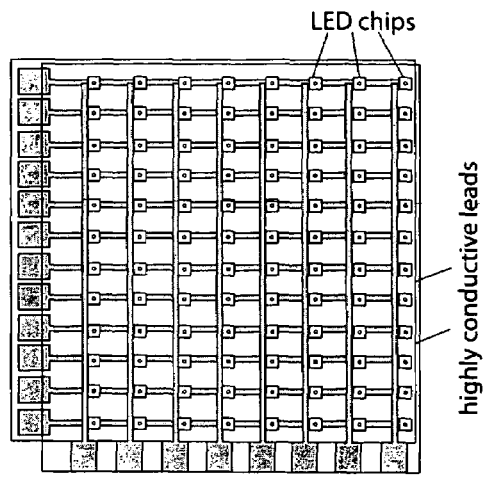
FIG. 84 is a top view of the inventive light sheet material configured with addressable LED elements.
Figure 85:
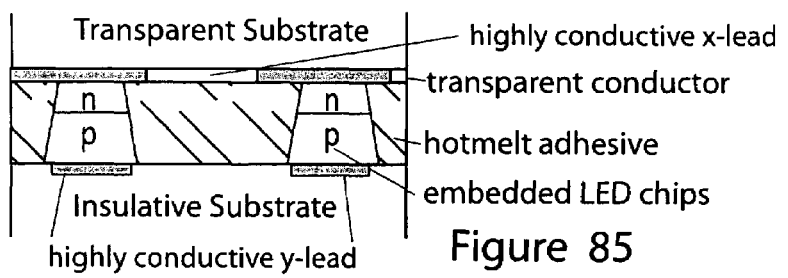
FIG. 85 is a cross sectional view of the inventive light sheet configured with addressable LED elements.
Figures 86A, 86B, 86C:
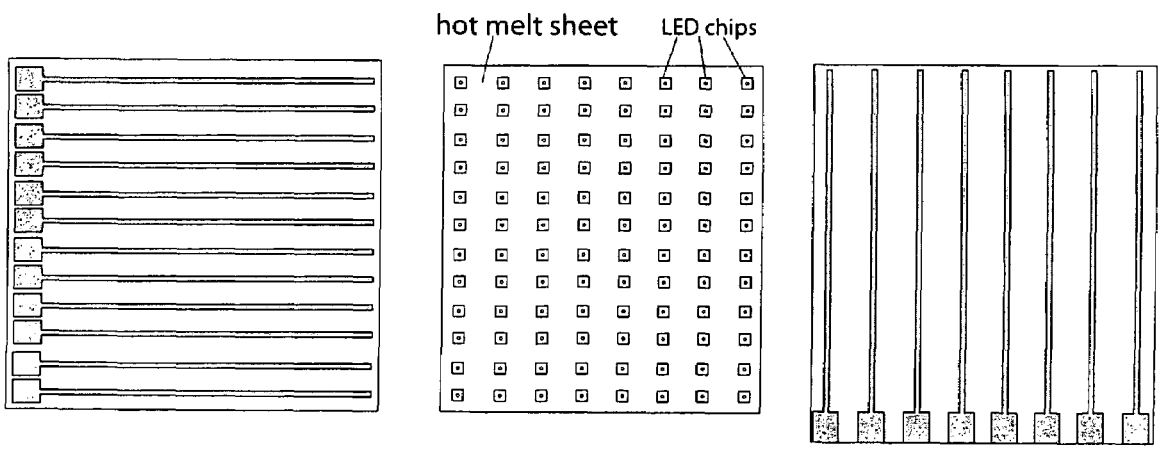
FIG. 86(a) is a top view of a bottom substrate sheet having a grid of x-electrodes.
FIG. 86(b) is a top view of an adhesive hotmelt sheet having embedded LED dice.
FIG. 86(c) is a top view of a transparent substrate sheet having a grid of y-electrodes.

FIG. 84 is a top view of the inventive light sheet material configured with addressable LED elements. FIG. 85 is a cross sectional view of the inventive light sheet configured with addressable LED elements. FIG. 86(*a*) is a top view of a bottom substrate sheet having a grid of x-electrodes. FIG. 86(*b*) is a top view of an adhesive hotmelt sheet having embedded LED dice. FIG. 86(*c*) is a top view of a transparent substrate sheet having a grid of y-electrodes. The transparent conductive layer can be formed by printing a transparent conductive material, such as ITO particles in a polymer binder, to form conductive light transmissive connecting lands. Each land is provided for connecting with a respective light active semiconductor. A relatively higher conducting line pattern can be formed on at least one of the top substrate and the bottom substrate for providing a relatively lower path of resistance from a power supply source to each light active semiconductor element. The electrically conductive surface and the electrically conductive pattern comprise a respective x and y wiring grid for selectively addressing individual light active semiconductor elements for forming a display.

Figure 87:
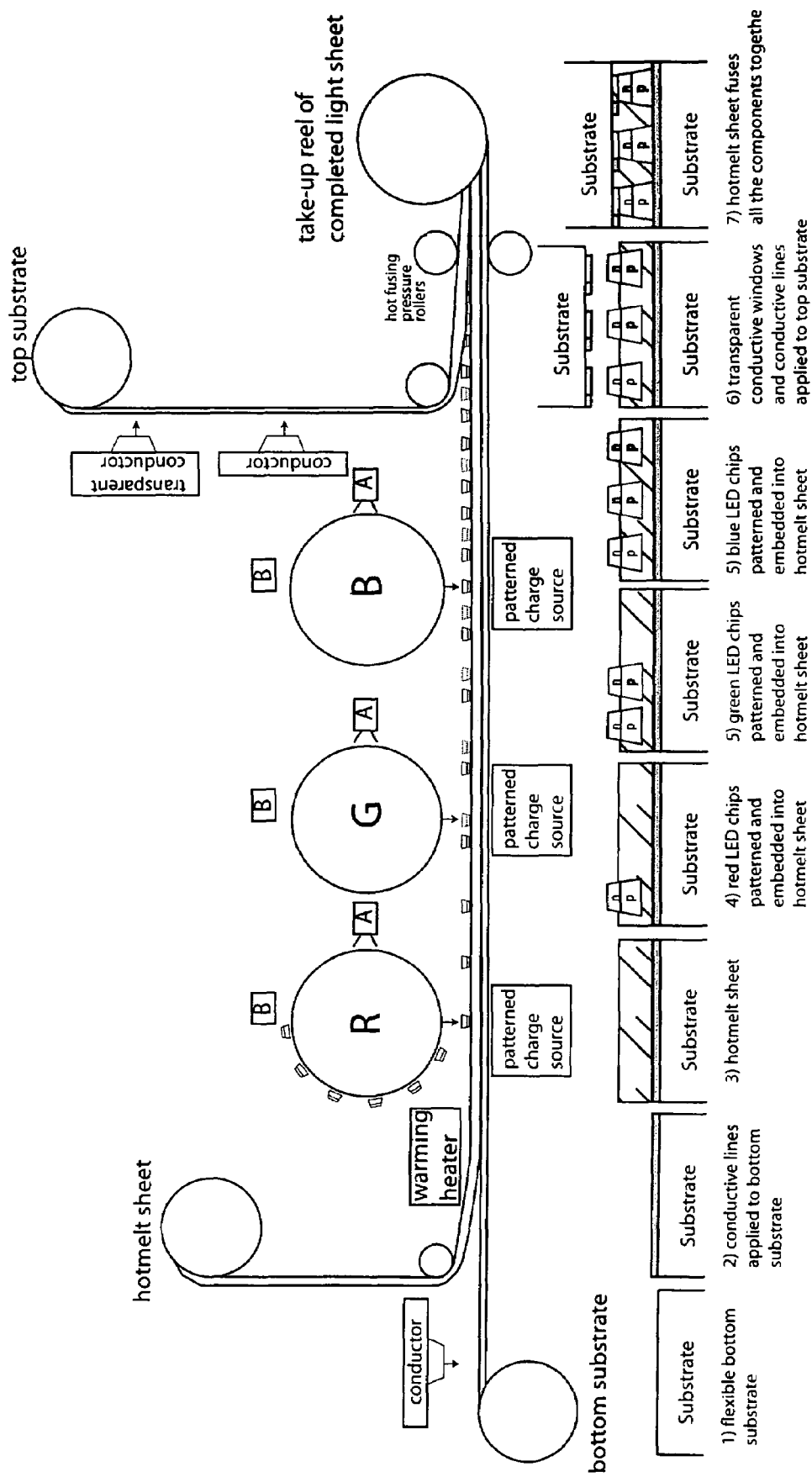
FIG. 87 shows an inventive method for manufacturing a multi-colored light active sheet using a roll-to-roll fabrication process, this multi-color light sheet has RGB sub-pixels composed of individual LED die, and may be driven as a display, white light sheet, variable color sheet, etc., depending on the conductive lead pattern and driving scheme.

FIG. 87 shows an inventive method for manufacturing a multi-colored light active sheet using a roll-to-roll fabrication process, this multi-color light sheet has RGB sub-pixels composed of individual LED die, and may be driven as a display, white light sheet, variable color sheet, etc., depending on the conductive lead pattern and driving scheme. FIG. 88 is a cross sectional view of an embodiment of the inventive light sheet configured as a full-color display pixel.

In accordance with the present invention, a method is provided for making an electronically active sheet. The electronically active sheet has a very thin and highly flexible form factor, and can be used to form an active display having a plurality of emissive pixels. Each pixel includes red, green and blue subpixel elements. It can be manufactured using the low cost, high yield continuous roll-to-roll fabrication method described herein. The electronically active sheet can also be used for making a lighting device, a light-to-energy device, a flexible electronic circuit, and many other electronic devices. The semiconductor elements can include resistors, transistors, diodes, and any other semiconductor element having a top and bottom electrode format. Other electronic elements can be provided in combination or separately and employed as components of the fabricated flexible electronic circuit.

The inventive steps for forming the electronically active sheet include providing a bottom planar substrate (stage 1) and forming an electrically conductive lines on the bottom substrate (stage 2). An adhesive is provided (stage 3) and at least one semiconductor element is fixed to the adhesive. Each semiconductor element has a top conductor and a bottom conductor. In the case of a display device, or multi-colored device, LED dice that are capable of being driven to emit different colors (e.g., RGB) can be applied to the adhesive (stages 4-5), thus forming separately addressable sub-pixel elements of a completed display. A top substrate is provided having an electrically conductive pattern disposed thereon (stage 6). The adhesive with the semiconductor element fixed thereto is inserted between the electrically conductive surface and the electrically conductive pattern to form a lamination. The adhesive is activated (stage 7) to bind the top substrate to the bottom substrate so that one of the top conductor and the bottom conductor of the semiconductor element is automatically brought into and maintained in electrical communication with the electrically conductive pattern of the top substrate and so that the other of the top conductor and the bottom conductor of each semiconductor element is automatically brought into and maintained in electrical communication with the electrically conductive surface of the bottom substrate. Thus, the invention can be used to fabricate a thin, flexible, emissive display using roll-to-roll fabrication methods.

As shown, in a preferred embodiment, the electrically insulative adhesive comprises a hotmelt material. The step of activating comprises applying heat and pressure to the lamination to soften the hotmelt material. At least one of the heat and pressure are provided by rollers. Alternatively, the adhesive may be composed so that activating it comprises at least one of solvent action (e.g., silicone adhesive), catalytic reaction (e.g., epoxy and hardner) and radiation curing (e.g., UV curable polymer adhesive).

The light active semiconductor elements can be light emitting diode die such as is readily commercially available from semiconductor foundries. The light active semiconductor elements may alternatively or additionally be light-to-energy devices, such as solar cell devices. To make white light, a first portion of the light active semiconductor elements emit a first wavelength of radiation and second portion of the light active semiconductor elements emit a second wavelength of radiation. Alternatively, yellow light emitting LED die and blue light emitting LED die can be provided in proper proportions to create a desired white light appearance. Diffusers can be included within the adhesive, substrates or as a coating on the substrates and/or the adhesive to create a more uniform glowing surface.

FIG. 89 is an exploded view showing the main constituent components of an embodiment of the inventive light sheet configured as a full-color display. The electrically insulative adhesive can be a hotmelt sheet material, such as that available from Bemis Associates. The light active semiconductor elements can be pre-embedded into the hotmelt sheet before the step of inserting the adhesive sheet between the substrates. In this way, the hotmelt sheet can have the semiconductor devices embedded off-line so that multiple embedding lines can supply a roll-to-roll fabrication line. A predetermined pattern of the light active semiconductor elements can be formed embedded in the hotmelt sheet. As shown in stages 4-6 of FIG. 87, the predetermined pattern can be formed by electrostatically attracting a plurality of light active semiconductor elements on a transfer member, similar to a laser printer electrostatic drum, and transferring the predetermined pattern onto the insulative adhesive.

FIG. 90 is an exploded view showing the main constituent components of an embodiment of the inventive light sheet configured as an egress EXIT sign. In this case, the light emitting elements can be formed as a predetermined pattern either off-line or in-line prior to the hotmelt sheet being inserted between the substrates.

Color light can be provided by including LED capable of emitting different wavelengths of light. For example, a red emitting LED combined with a yellow emitting LED when driven together and located near each other will be perceived by the human eye as generating an orange light. White light can be generated by combining yellow and blue LED dice, or red, green and blue dice. A phosphor can be provided in the lamination. The phosphor is optically stimulated by a radiation emission of a first wavelength (e.g., blue) from the light active semiconductor element (e.g., LED die) to emit light of a second wavelength (e.g., yellow).

Figure 91:
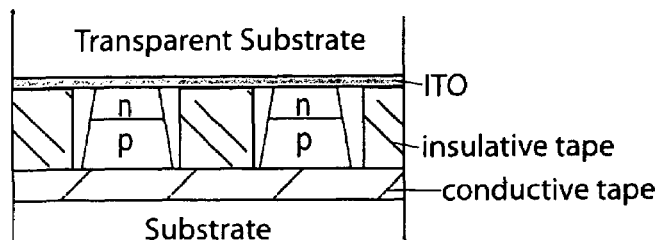
FIG. 91 is a cross sectional view of another embodiment of the present invention utilizing a double-faced insulative adhesive tape and a bottom conductive adhesive tape structure.
Figure 93:
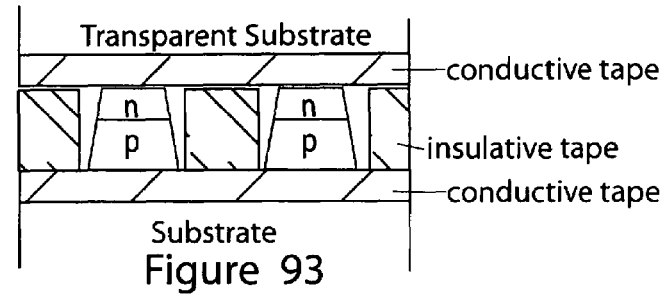
FIG. 93 is a cross sectional view of another embodiment of the present invention utilizing a top conductive adhesive tape, double-faced insulative adhesive tape and a bottom conductive adhesive tape structure.
Figure 92:
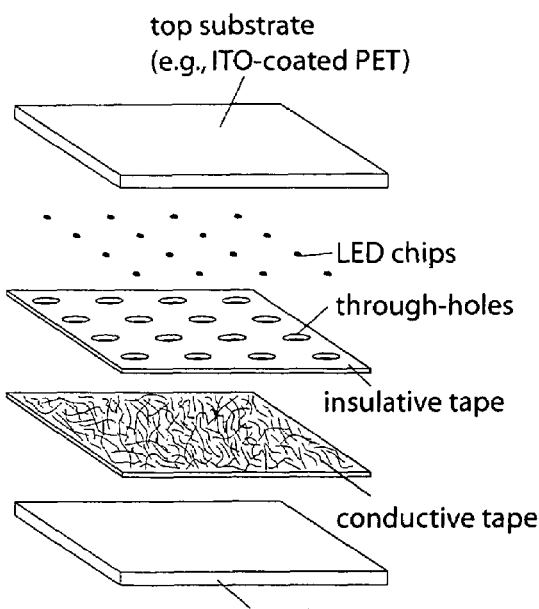
FIG. 92 is an exploded view of the main constituent components of the embodiment shown in FIG. 91.
Figure 94:
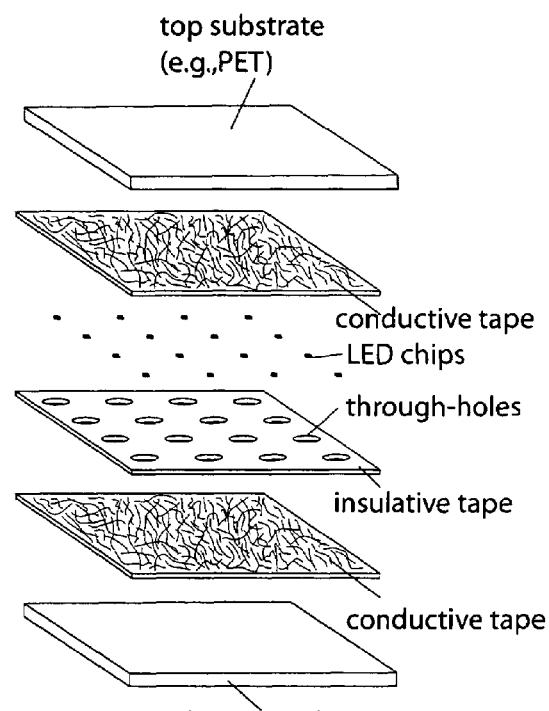
FIG. 94 is an exploded view of the main constituent components of the embodiment shown in FIG. 93.
Figure 95:
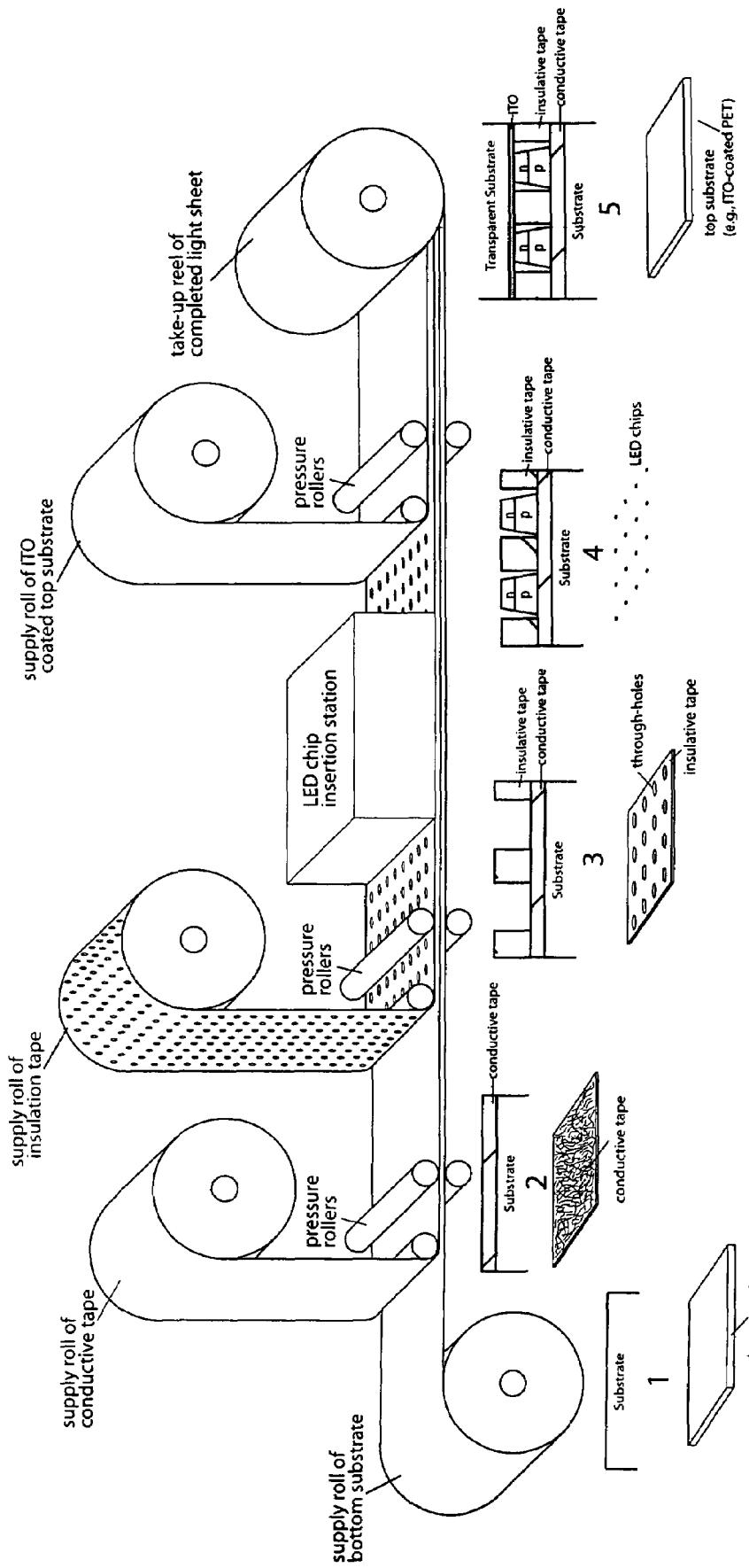
FIG. 95 illustrates an inventive method for manufacturing a light active sheet using a roll-to-roll fabrication process and utilizing a double-faced insulative adhesive tape and a bottom conductive adhesive tape structure.
Figure 98:
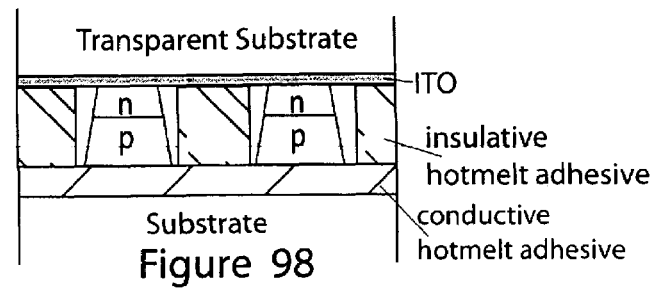
FIG. 98 is a cross sectional view of another embodiment of the present invention utilizing an insulative hotmelt adhesive and a bottom conductive hotmelt adhesive structure.
Figure 96:
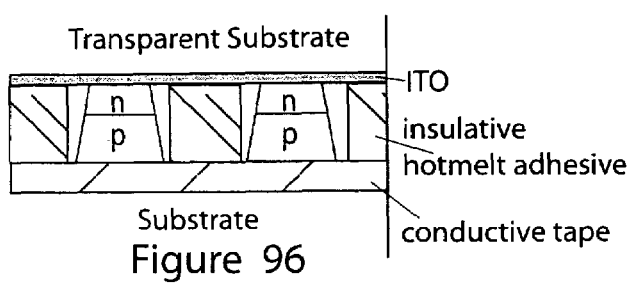
FIG. 96 is a cross sectional view of another embodiment of the present invention utilizing a insulative hotmelt sheet and a bottom conductive adhesive tape structure.
Figure 97:
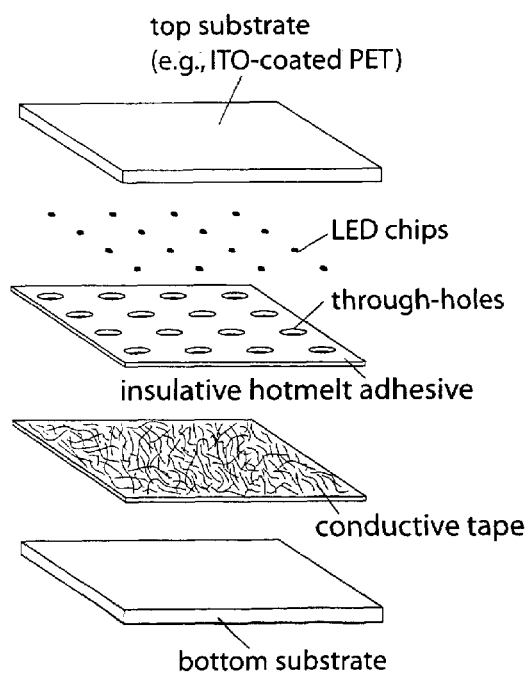
FIG. 97 is an exploded view of the main constituent components of the embodiment shown in FIG. 96.
Figure 99:
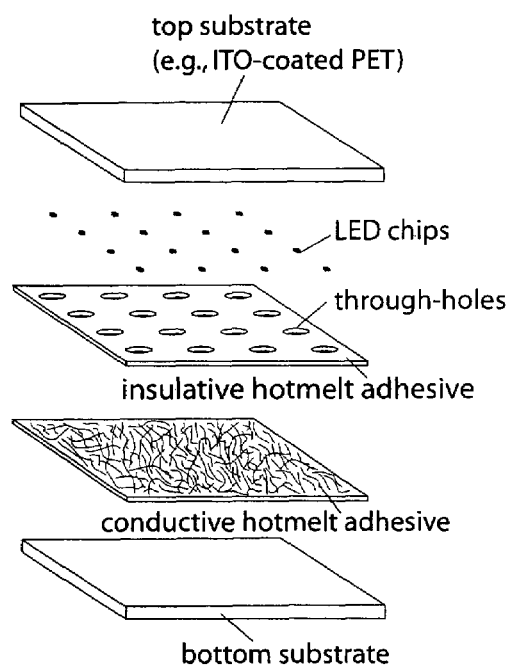
FIG. 99 is an exploded view of the main constituent components of the embodiment shown in FIG. 98.
Figure 100:
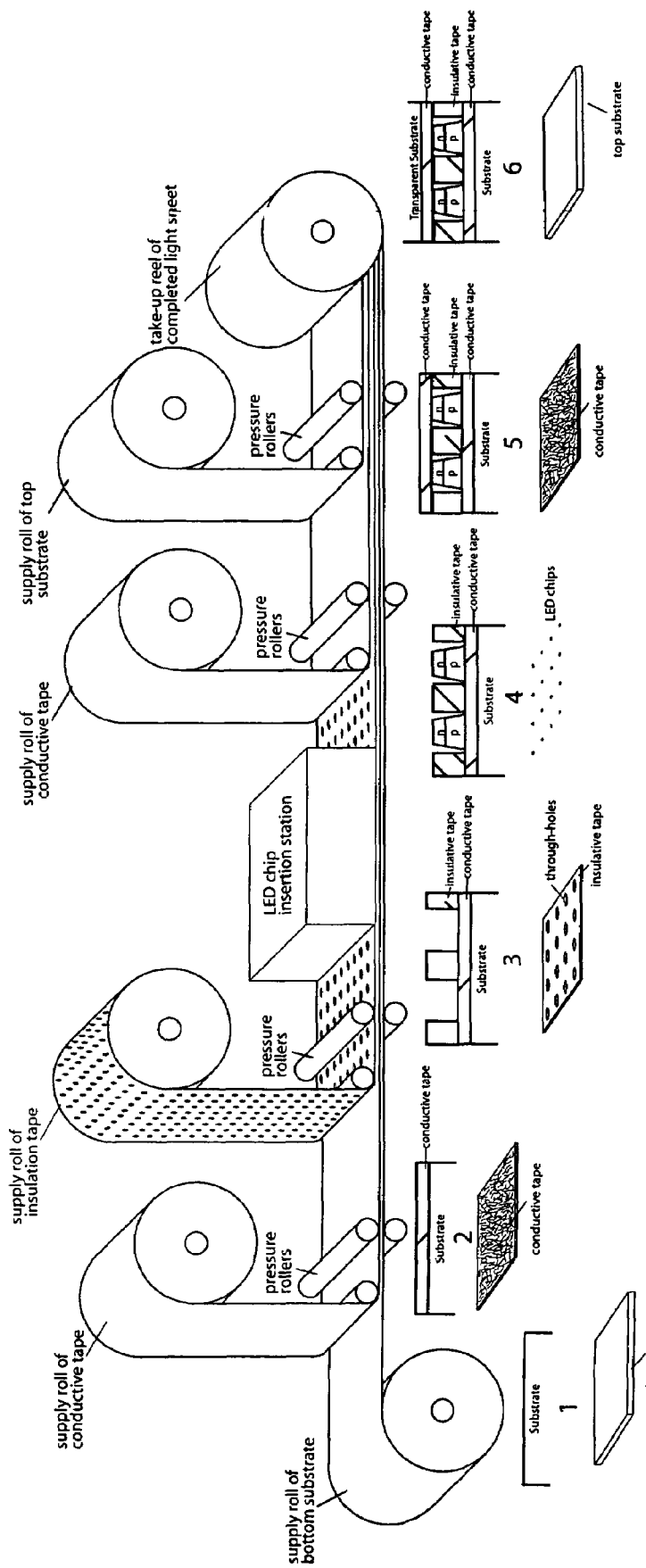
FIG. 100 illustrates an inventive method for manufacturing a light active sheet using a roll-to-roll fabrication process and utilizing a top conductive adhesive tape, double-faced insulative adhesive tape and a bottom conductive adhesive tape structure.
Figure 103:
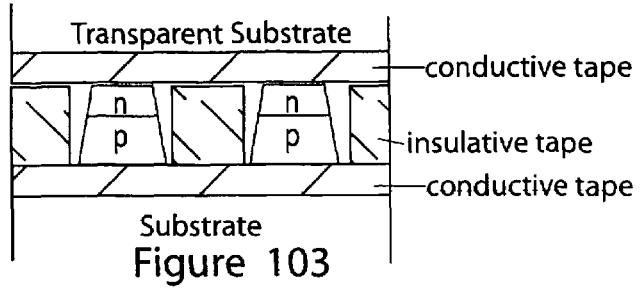
FIG. 103 is a cross sectional view of another embodiment of the present invention utilizing a top conductive hotmelt adhesive, double-faced insulative adhesive tape and a bottom conductive hotmelt adhesive structure.
Figure 101:
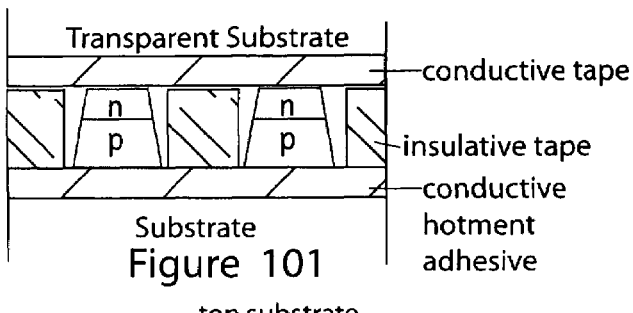
FIG. 101 is a cross sectional view of another embodiment of the present invention utilizing a top conductive adhesive tape, double-faced insulative adhesive tape and a bottom conductive hotmelt adhesive structure.
Figure 102:
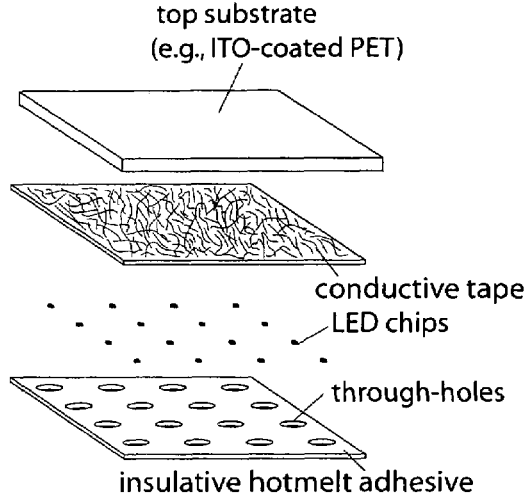
FIG. 102 is an exploded view of the main constituent components of the embodiment shown in FIG. 101.
Figure 104:
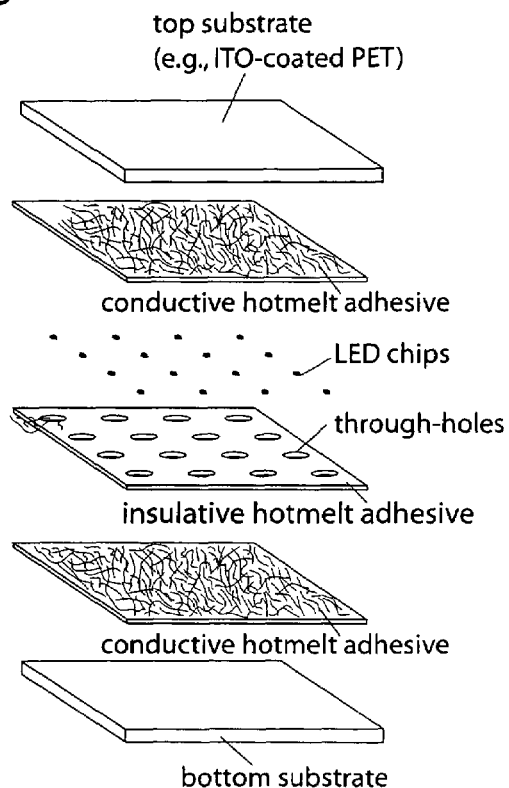
FIG. 104 is an exploded view of the main constituent components of the embodiment shown in FIG. 103.
Figure 105:
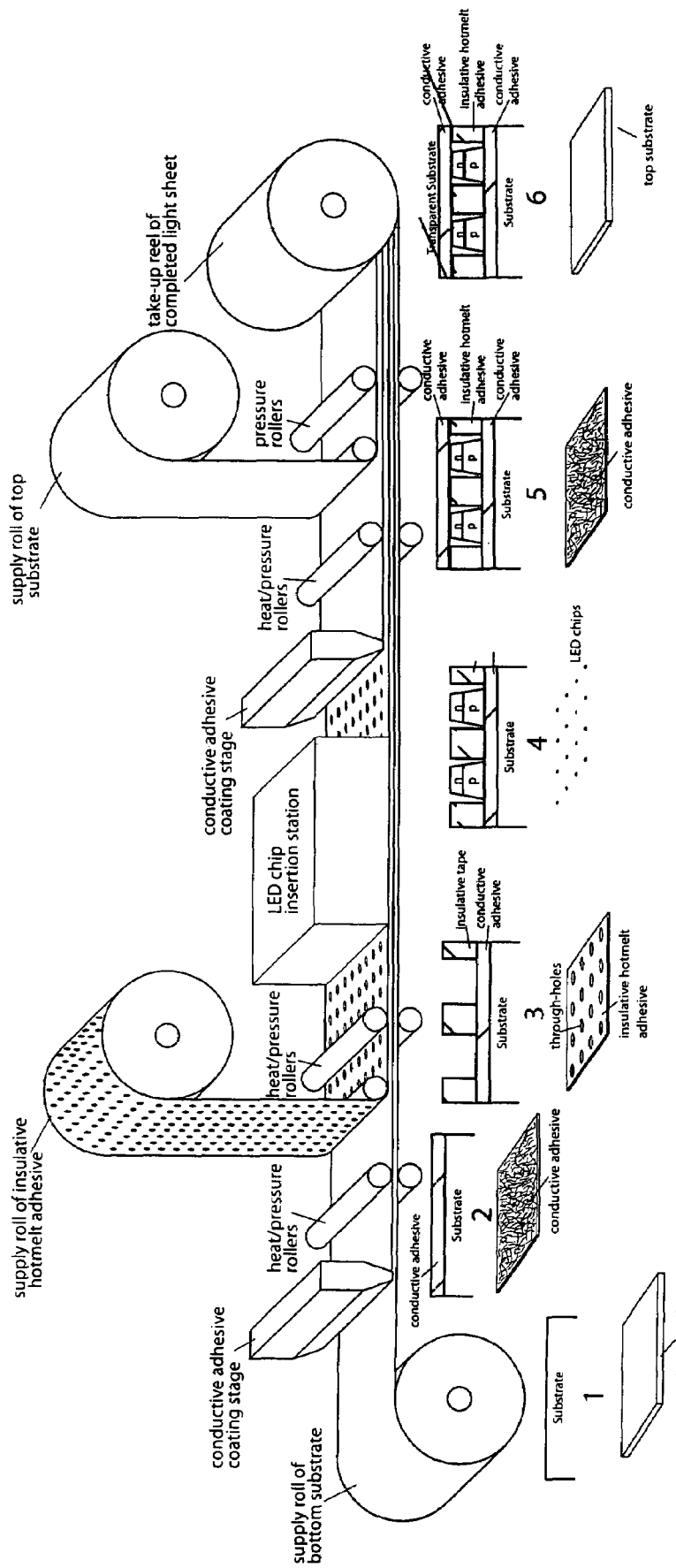
FIG. 105 illustrates an inventive method for manufacturing a light active sheet using a roll-to-roll fabrication process, wherein a conductive coating is formed on the top and bottom substrate using slot-die coating stages.
Figure 110:
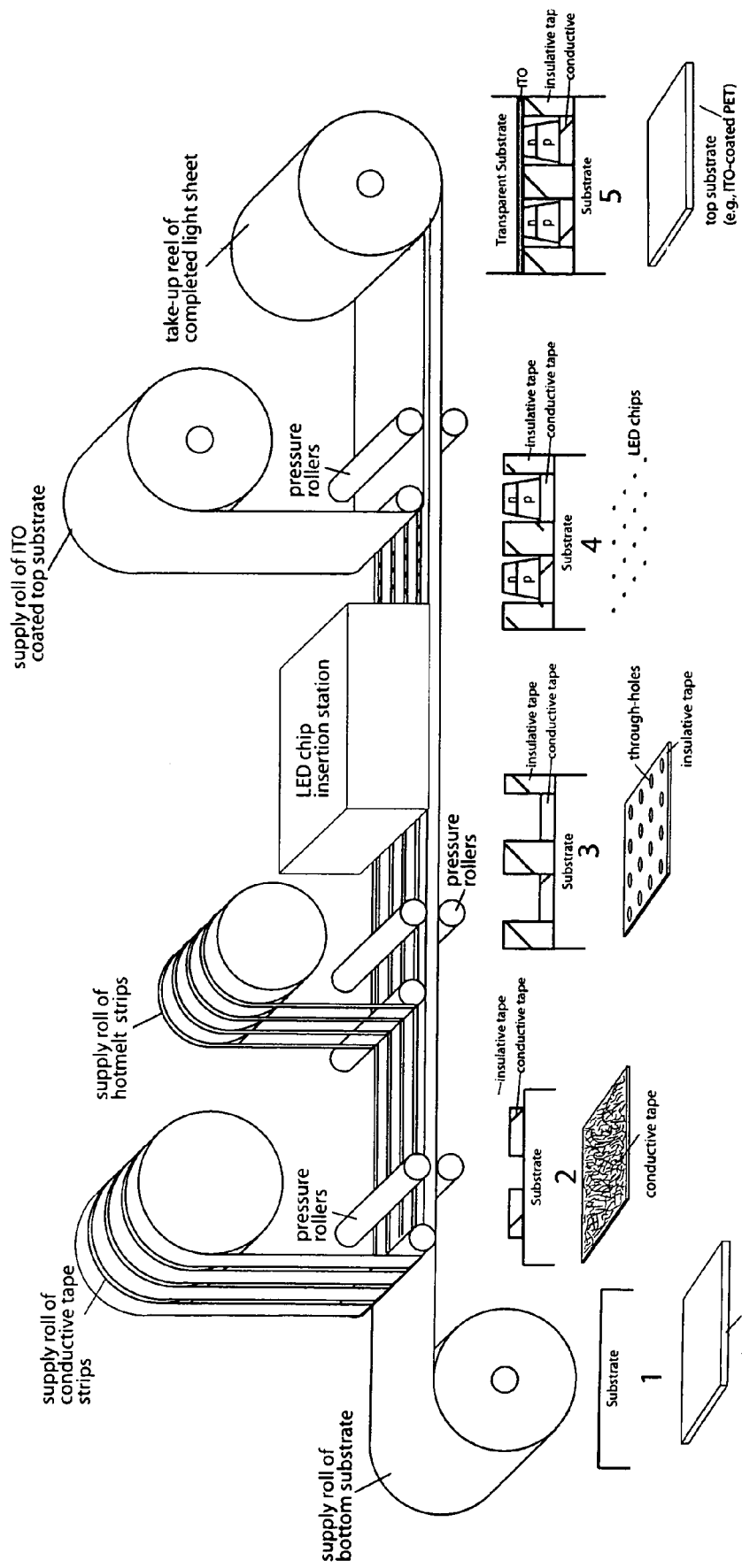

Alternative methods and device architectures can be employed that add components such as doubsided electrically conductive tape or conductive adhesive to connect the LED die or semiconductor devices. These elements can also be employed in addition to the other inventive methods and device architectures described herein to connect other electronic components and form more complex device sheets. FIG. 91 is a cross sectional view of another embodiment of the present invention utilizing a double-faced insulative adhesive tape and a bottom conductive adhesive tape structure. FIG. 92 is an exploded view of the main constituent components of the embodiment shown in FIG. 91. FIG. 93 is a cross sectional view of another embodiment of the present invention utilizing a top conductive adhesive tape, double-faced insulative adhesive tape and a bottom conductive adhesive tape structure. FIG. 94 is an exploded view of the main constituent components of the embodiment shown in FIG. 93. FIG. 95 illustrates an inventive method for manufacturing a light active sheet using a roll-to-roll fabrication process and utilizing a double-faced insulative adhesive tape and a bottom conductive adhesive tape structure. FIG. 96 is a cross sectional view of another embodiment of the present invention utilizing an insulative hotmelt sheet and a bottom conductive adhesive tape structure. FIG. 97 is an exploded view of the main constituent components of the embodiment shown in FIG. 96. FIG. 98 is a cross sectional view of another embodiment of the present invention utilizing an insulative hotmelt adhesive and a bottom conductive hotmelt adhesive structure. FIG. 99 is an exploded view of the main constituent components of the embodiment shown in FIG. 98. FIG. 100 illustrates an inventive method for manufacturing a light active sheet using a roll-to-roll fabrication process and utilizing a top conductive adhesive tape, double-faced insulative adhesive tape and a bottom conductive adhesive tape structure. FIG. 101 is a cross sectional view of another embodiment of the present invention utilizing a top conductive adhesive tape, double-faced insulative adhesive tape and a bottom conductive hotmelt adhesive structure. FIG. 102 is an exploded view of the main constituent components of the embodiment shown in FIG. 101. FIG. 103 is a cross sectional view of another embodiment of the present invention utilizing a top conductive hotmelt adhesive, double-faced insulative adhesive tape and a bottom conductive hotmelt adhesive structure. FIG. 104 is an exploded view of the main constituent components of the embodiment shown in FIG. 103. FIG. 101 is a cross sectional view of another embodiment of the present invention utilizing a top conductive adhesive tape, double-faced insulative adhesive tape and a bottom conductive hotmelt adhesive structure. FIG. 102 is an exploded view of the main constituent components of the embodiment shown in FIG. 101. FIG. 103 is a cross sectional view of another embodiment of the present invention utilizing a top conductive hotmelt adhesive, double-faced insulative adhesive tape and a bottom conductive hotmelt adhesive structure. FIG. 104 is an exploded view of the main constituent components of the embodiment shown in FIG. 103. FIG. 105 illustrates an inventive method for manufacturing a light active sheet using a roll-to-roll fabrication process, wherein a conductive coating is formed on the top and bottom substrate using slot-die coating stages. FIG. 106 is a cross sectional view of another embodiment of the present invention utilizing insulative hotmelt adhesive strips and conductive adhesive tape structure. FIG. 107 is an exploded view of the main constituent components of the embodiment shown in FIG. 106. FIG. 108 is a cross sectional view of another embodiment of the present invention utilizing an insulative hotmelt adhesive strips, top conductive strips and bottom conductive adhesive tape structure. FIG. 109 is an exploded view of the main constituent components of the embodiment shown in FIG. 108. FIG. 110 illustrates an inventive method for manufacturing a light active sheet using conductive strips and adhesive strips in a roll-to-roll manufacturing process.

In accordance with the present invention, a bright light panel is obtained using a grid of LED dice fixed between sheets of flexible conductive substrates. The panels are extremely lightweight, flexible, long-lived (100,000 hours based on the LED lifetime), and easily deployed. Thinner than a credit card, the lights are so rugged that they can be nailed or cut without affecting performance. The light is bright and diffuse at low power and compatible with photovoltaic sources. In accordance with another aspect of the present invention, a two-color lighting panel is provided, having, for example white light for general illumination, and red-light for a command and control situation or as a night vision aid. In an embodiment of the present invention, to change the color, only the polarity of the electrical source is switched.

The features of the inventive lighting system include:
1. Low power, highly efficient, evenly diffuse solid state lighting that can be dimmed
2. Single- or two-color illumination
3. Easily repaired, amenable to low-voltage battery, direct photovoltaic source or charging system
4. Rugged, flexible, thin light sheet and fixture format—unbreakable
5. Unique solid-state technology robust against shock and vibration
6. Low cost at high volume when manufactured roll-to-roll The inventive device structure imbeds LED dice (chips) between two conductive layers, at least one of which is transparent. For example Indium Tin Oxide (ITO)-coated poly (ethylene terephthalate) (PET) has been successfully used in prototype devices. The other substrate could also be ITO/PET or for a higher level of conductivity (and brighter light), made of a reflective, metallized PET for flexibility and toughness, or a metal foil. The transparent electrode can also have a fine pattern of conductive ink printed on it to even out the current to the individual dies in a regular array for even lighting, or patterned for a signage application. The inventive structure is fabricated from prepared materials according to the manufacturing process described herein. In accordance with an embodiment of the present invention, the manufacturing process comprises a simple lamination that can be used for producing sheet lighting material.

The inventive process requires the preparation of the roll of hot-melt adhesive to make a holt-melt active layer for the final lamination. In accordance with embodiments of the present invention, methods are provided to accurately orient the LED dice (dies) for the adhesive layer, and place them in the right place. The inventive fabrication of the hot-melt active layer may be a two-step process. First the dice are oriented and placed accurately on a tacky adhesive to hold them in place in a pattern of holes formed in a silicone-coated release layer template. Then the hot melt adhesive is warmed to soften and pick up the dice from the template. The template may be reused. A manual orientation and placement of the die may be used, or to increase the economic benefits of this inexpensive solid-state light source, one of the following inventive placement methods, or others, may be employed.

Pick and Place Method. The current method for placing dice on printed circuit boards, or for fabricating individual LED lamps involves robotics orientation and placement using machine vision. Conventional pick and place equipment can be adapted for the placement of dice on a continuous hotmelt sheet web.

Figure 112:
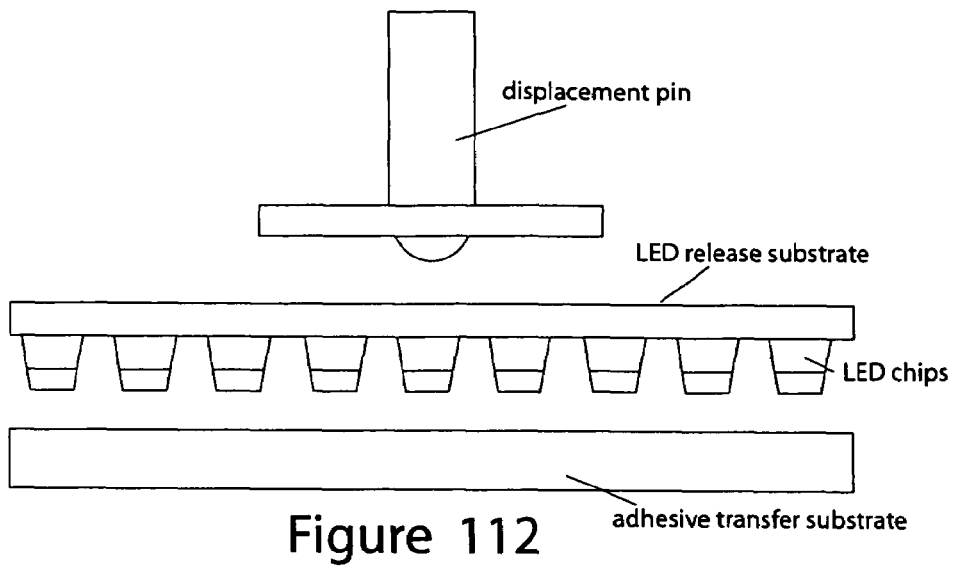
Figure 113:
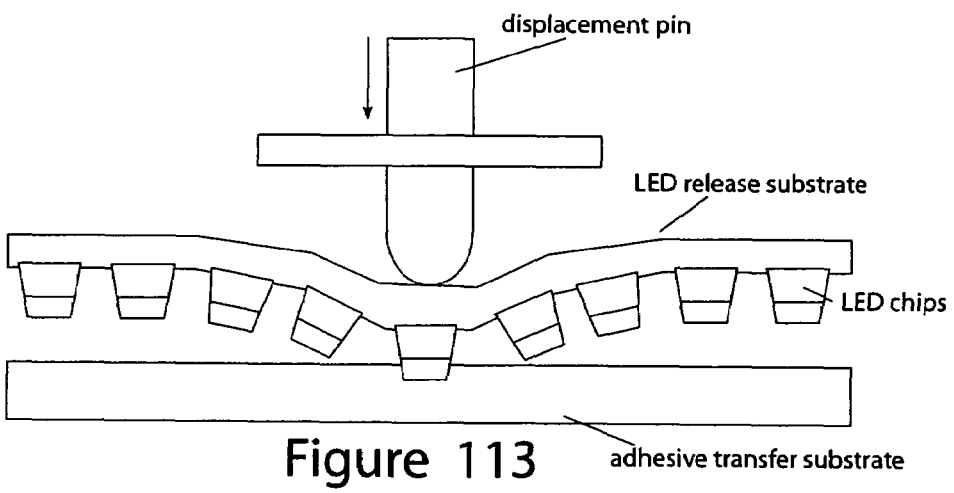
Figure 114:
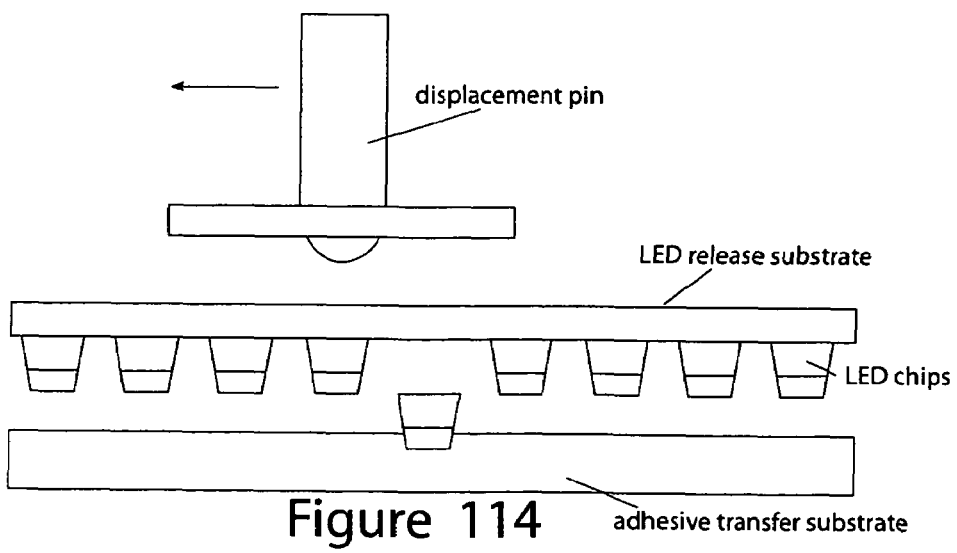

FIG. 112 shows a first step of an inventive adhesive transfer method for fixing semiconductor elements onto an adhesive transfer substrate. In this case, the predetermined pattern is formed by transferring the semiconductor elements from a relatively lower tack adhesive to a relatively higher tack adhesive. FIG. 113 shows a second step of the inventive adhesive transfer method for fixing semiconductor elements onto the adhesive transfer substrate. FIG. 114 shows a third step of the inventive adhesive transfer method for fixing semiconductor elements onto the adhesive transfer substrate.

Figure 115:
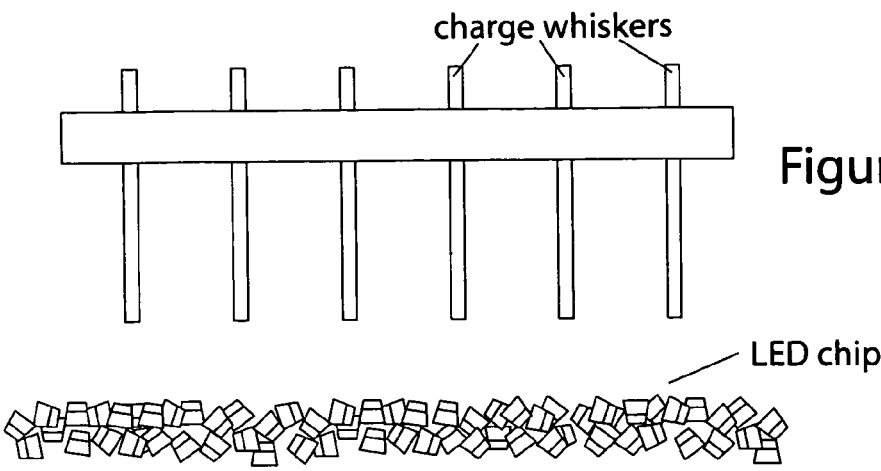
Figure 116:
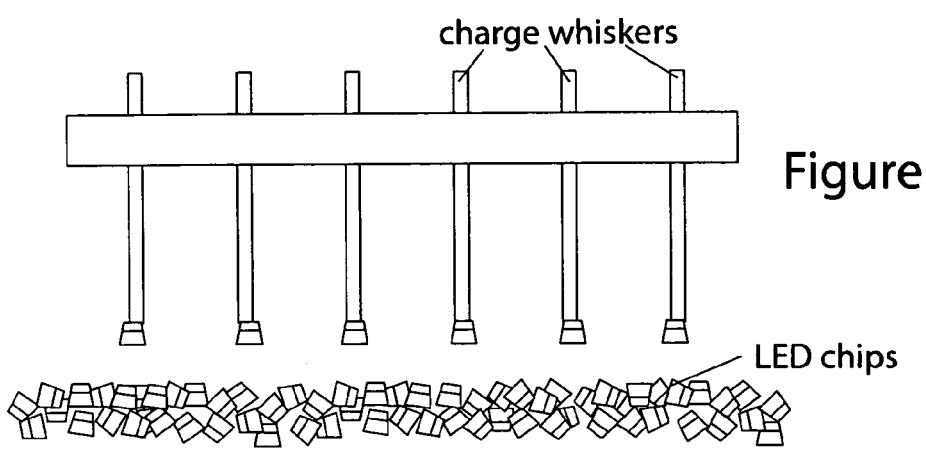
Figure 117:
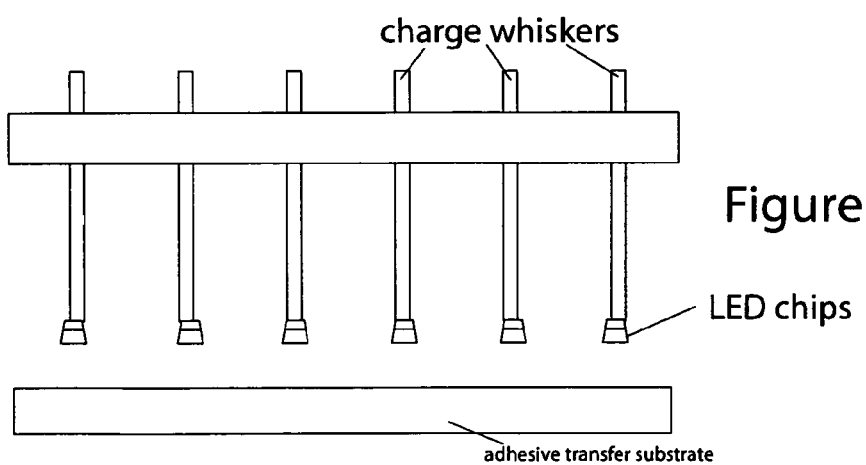
Figure 118:
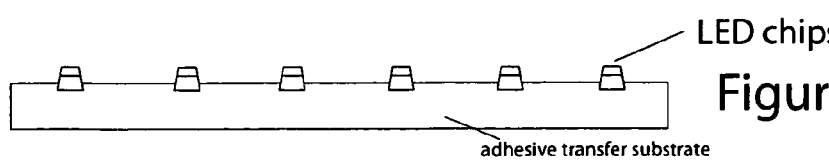
Figure 119:
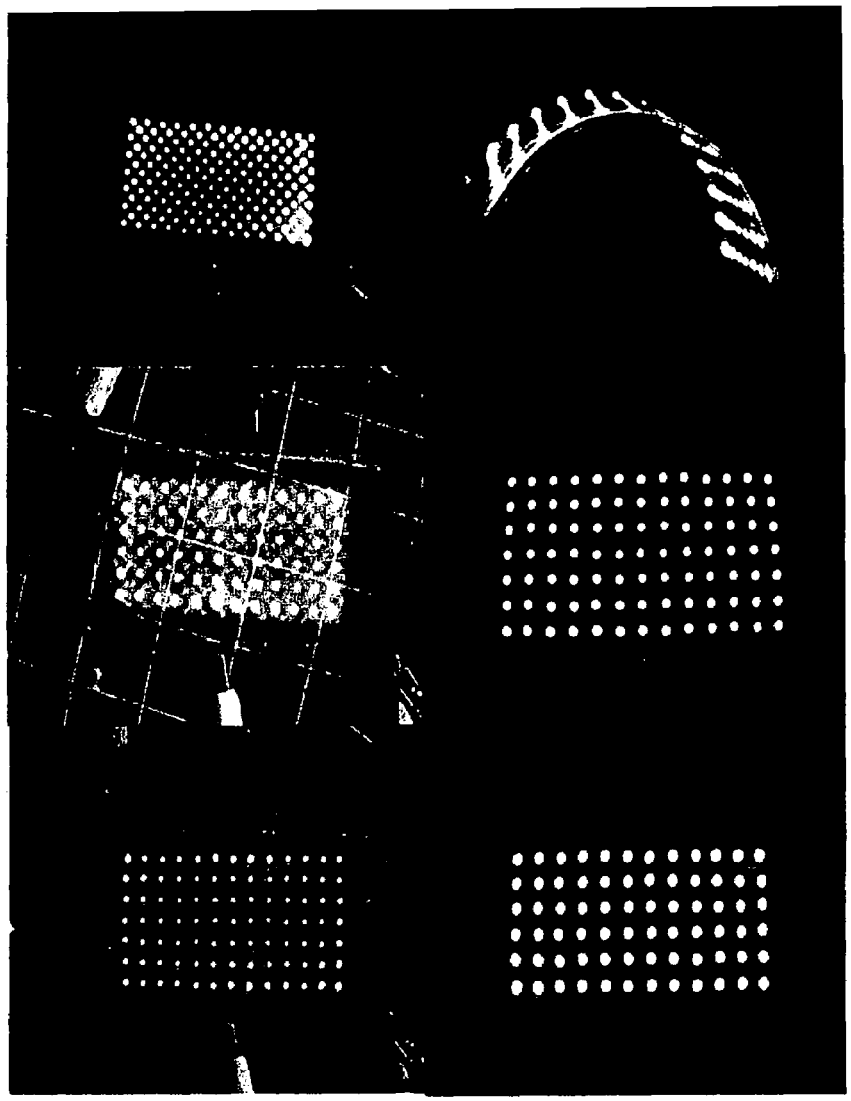
Figure 120:
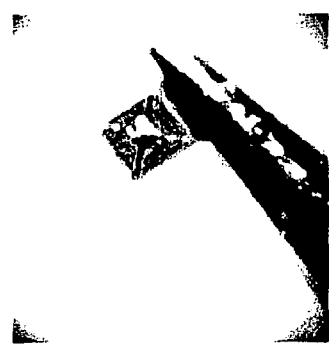

Electrostatic Transfer Method. An electrostatic printing method can be used to orient and place the dice on the hot melt adhesive. In this approach, in effect the dice become the toner in a low-resolution device that prints on a continuous web of the hot melt adhesive. Applicants have demonstrated the electrostatic attraction of the dice and have used an electrostatic field to orient the dice. FIG. 120 is a photograph demonstrating a LED die electrostatically attracted to a charged needle. FIG. 121 is a photograph demonstrating three LED dice electrostatically attracted to a charged needle. As long as current doesn't flow, the LEDs are not damaged and continue to operate. An array of charged whiskers can be used to selectively pick up and place the semiconductor elements on an adhesive transfer susbtrate. The placement can be as an evenly spaced array, or by selectively charging the whiskers, a pattern of semiconductor elements can be formed. FIG. 115 shows a first step of an electrostatic attraction transfer method for fixing semiconductor elements onto an adhesive transfer substrate. FIG. 116 shows a second step of the electrostatic attraction transfer method for fixing semiconductor elements onto the adhesive transfer substrate. FIG. 117 shows a third step of the electrostatic attraction transfer method for fixing semiconductor elements onto the adhesive transfer substrate. FIG. 118 shows a fourth step of the electrostatic attraction transfer method for fixing semiconductor elements onto the adhesive transfer substrate. Multiple passes or several stages in line enable several colors to be placed for red, green and blue (RGB) synthesis of white light from several dice accurately placed on printed electrodes.

Figure 111:
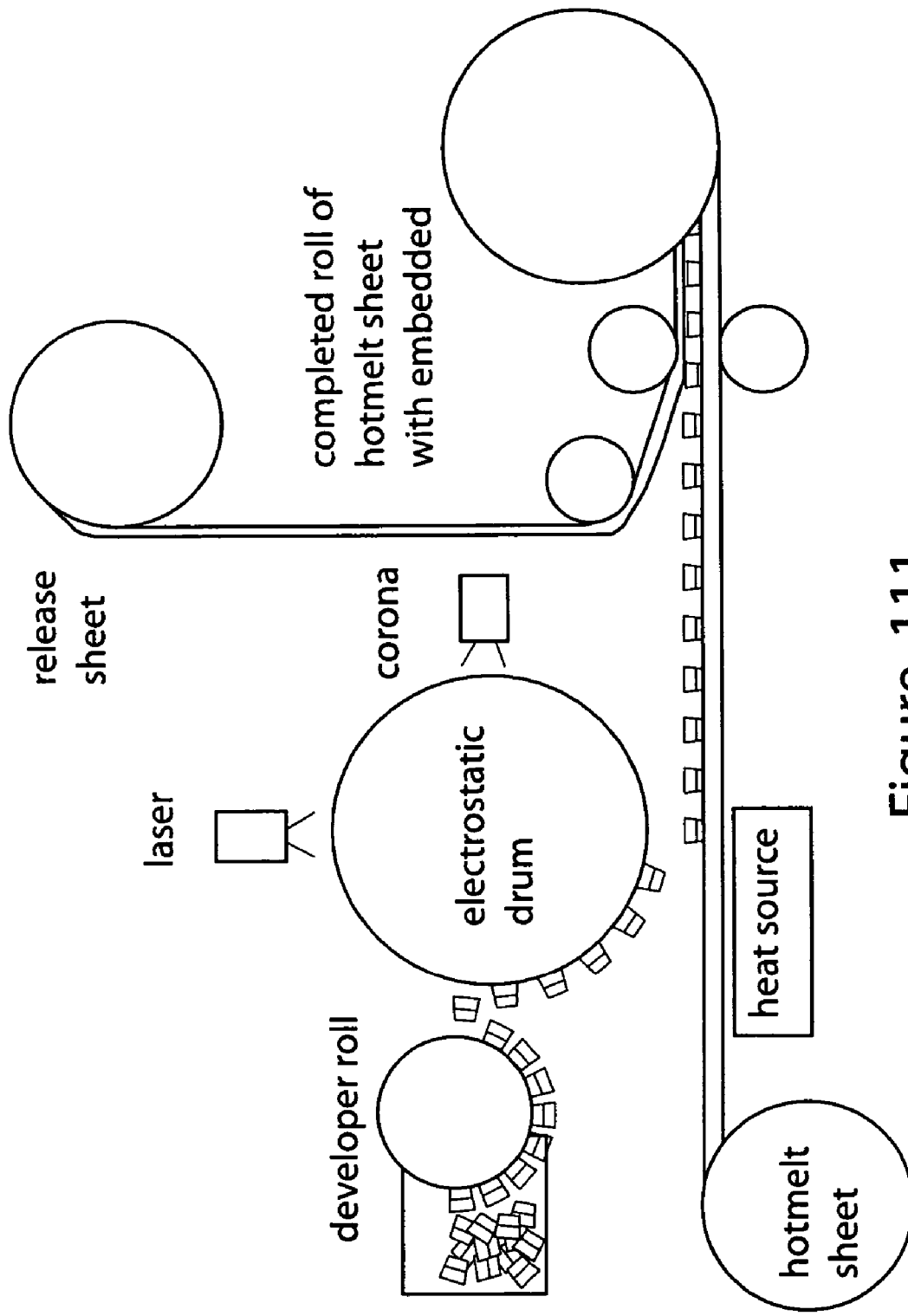

FIG. 111 illustrates an inventive method of making the active layer of the inventive light active sheet using an electrostatic drum transfer system for orienting and patterning LED dice on a hotmelt sheet. In order to write the dice into a hot melt array, the dice are used as toner in a laser printer. The analogous steps of the process are: 1) A transfer drum is charged with a positive (+) charge. 2) The laser writes a negative image on the photosensitive drum under the PCL or Postscript control of the laser printer. 3) The developer roll is negatively charged to attract the positively charged LED dice. 4) The positively charged dice transfer to more negatively charged ("write black") regions of the transfer drum. 5) The even more highly negatively charged hot melt adhesive accepts the dice from the transfer drum and as it passes, the detac corona strip removes the charge. 6) In a hot zone, the melt adhesive is softened slightly to hold the dice in place. 7) The active array of dice in the hot melt is re-rolled at the end.

As an alternative, or in addition to, charging the developer roll, it may be coated with a sulfide-based material like cadmium sulfide or something more benign like iron sulfide. Organic sulfides might also be used, or even vulcanized rubber. Gold attracts to sulfide better than most anything else, so there might be a preference for the gold electrode side of the dice to prefer the sulfide-coated developer roller. In Step 3 above, the attraction of gold to sulfur may be used instead of, or in addition to, the electrostatics to align the dice, and then the charge on the transfer roll used to position the dice according to a desired pattern. The dice are then oriented with the gold electrode facing toward the developer roller with the light-emitting electrode oriented towards the transfer drum, then transferred to the hot melt adhesive gold electrode base down with the transparent electrode facing up.

The image to be printed can be written on a commercially available laser printer. First the transfer drum is covered with a positive charge. Then the photosensitive drum is written on ("write black") with the laser under the control of the laser print engine, translating computer PCT or Postscript commands to the laser/mirror control unit to accurately write on the drum. The photoactive layer ejects electrons to cancel the positive charge in those areas and with the intensity of the laser, converts that latent (neutral) image to a negatively-charged image on the transfer drum. This is the normal operation of the laser printer.

The die-printing operation utilizes a relatively low resolution electrostatic laser "printer" with roughly 0.012"×0.12" dice replacing the usual toner. Alternatively, the dice can be fabricated having a magnetically attractive electrode, in which case, the developer roller and/or the drum can be magnetic systems, and may employ a optomagnetic coating for patterning.

Only the negative areas written by the laser should receive dice from the developer roller. To implement this cleanly, the charge balance between the source and destination is adjusted so that the transfer takes place accurately and completely without disturbing the die orientation.

The hot melt adhesive sheet (still solid) receives a negative charge and attracts the dice from the weaker-charged transfer drum. A so-called "detac corona" removes the charge from the hot melt sheet.

The next step is similar to the fuser step in the commercial laser printer process except it is the substrate and not the toner that will soften. The proper selection of the hot melt softening temperature, or an adjustment of the fuser temperature and rate of motion or all of the above are used to get an optimum adhesion of the dice to the substrate. Rapid cooling with an air stream may be used for cooling the substrate. The resulting active layer made of hot melt adhesive with imbedded dice is then rolled up in a continuous process, or stacked as individual sheets.

FIG. 122 is a cross sectional view of an inventive encapsulated semiconductor device wherein the semiconductor elements are npn-type devices, with an addressable middle p-layer. FIG. 123 is a cross sectional view of an inventive encapsulated semiconductor device wherein the semiconductor elements are npn-type devices, with an addressable top n-layer. FIG. 124(a) is a cross sectional view of an inventive encapsulated device electronic circuit, wherein an LED die, npn transistor, resistor and conductors are connected in an electronic circuit forming a pixel for a display device. FIG. 124(b) is a cross sectional view of an alternative of the inventive encapsulated device electronic circuit shown in FIG. 124(a). In this case, the transparent conductor acts as both an electrical connection and a resistor element for connecting the LED element to ground through the npn transistor element. FIG. 124(c) is a cross sectional view of another alternative of the inventive encapsulated device electronic circuit shown in FIG. 124(a). In this case, a capacitor element is provided. FIG. 124(d) is a cross sectional view of an alternative of the inventive encapsulated device electronic circuit shown in FIG. 124(a). In this case, the capacitor element is energized in response to a signal received by another circuit element, such as a flip-flop or the like (shown schematically connected). These variations are only intended to be examples, more and less complex circuits can be formed in accordance with the present invention. Other semiconductor and well-known electronic circuit elements can be included within the system.

FIG. 125 is a circuit diagram illustrating the sub-pixel circuit shown in FIG. 124(a). FIG. 126 is a cross sectional view of a pixel from an inventive display device, the pixel includes red, green and blue sub-pixel circuit and an optical lens element formed in the top substrate. FIG. 127 is an exploded view of the inventive encapsulated semiconductor device showing a conductive sheet layer between insulative hotmelt adhesive layers.

In accordance with another aspect of the present invention, as shown in FIG. 122-127, a method is provided for making an encapsulated semiconductor device. A bottom substrate is provided having an electrically conductive surface. An adhesive layer is provided on the electrically conductive surface. A predetermined pattern of semiconductor elements are fixed to the adhesive. The semiconductor elements each having a top device conductor and a bottom device conductor. A top substrate having a conductive pattern disposed thereon. A lamination is formed comprising the bottom substrate, the adhesive layer (with the semiconductor elements) and the top substrate. The lamination is formed so that the adhesive electrically insulates and binds the top substrate to the bottom substrate. In so doing, one of the top device conductor and bottom device conductor of the semiconductor elements is in electrical communication with the conductive pattern of the top substrate and the other of the top device conductor and bottom device conductor of each semiconductor element is in electrical communication with the electrically conductive layer of the bottom substrate. In this manner, each semiconductor element is automatically connected to the top and bottom conductors that are preformed on the top and bottom substrates. There is no need for wirebonding, solder, lead wires, or other electrical connection elements or steps.

In accordance with the present invention, at least one the semiconductor elements is provided with a middle conductor region between the top conductor and the bottom conductor. For example, the semiconductor can be an npn or pnp transistor. The adhesive comprises at least one electrically conductive portion for making an electrical connection with the middle conductor region. Additional electronic circuit components can also be included, such as resistors and conductors, and other semiconductor elements. Some of the electronic elements do not have a top and bottom conductor, but rather have a top of bottom conductor that extends into the middle conductor region.

The semiconductor elements can be light emitting diode die, or other semiconductor and circuit elements, such as transistors, resistors, conductors, etc. They can be connected in an electronic circuit through the inventive hotmelt lamination method described herein. Further, the light active semiconductor elements can be light-to-energy devices, such as diodes effective for converting sunlight to electrical energy.

With respect to the above description, it is realized that the optimum dimensional relationships for parts of the invention, including variations in size, materials, shape, form, function, and manner of operation, assembly and use, are deemed readily apparent and obvious to one skilled in the art. All equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

The invention claimed is:

1. A light active sheet comprising:
    a bottom substrate flexible sheet having an electrically conductive surface;
    a top transparent substrate flexible sheet having a transparent conductive layer disposed thereon;
    an electrically insulative adhesive flexible sheet;
    light active semiconductor elements fixed to the electrically insulative adhesive sheet, said light active semiconductor elements each having an n-side and a p-side, the electrically insulative adhesive sheet having the light active semiconductor elements fixed thereon being inserted between the electrically conductive surface and the transparent conductive layer to form a lamination and activated so that the electrically insulative adhesive electrically insulates and binds the top substrate sheet to the bottom substrate sheet so that one of said n-side or said p-side of the light active semiconductor elements is in electrical communication with the transparent conductive layer of the top substrate sheet and so that the other of said n-side or said p-side of each said light active semiconductor element is in electrical communication with the electrically conductive surface of the bottom substrate sheet to form a light active device,
    wherein the bottom substrate, the electrically insulative adhesive and the top substrate are provided as respective rolls of material; and the step of inserting comprising bringing the bottom substrate, the electrically insulative adhesive and the top substrate together in a continuous roll fabrication process.

2. A light active sheet according to claim 1; wherein the electrically insulative adhesive comprises a hotmelt material activatable by applying heat and pressure to the lamination to soften the hotmelt material.

3. A light active sheet according to claim 1; wherein the adhesive is activatable by at least one of solvent action, evaporation, catalytic reaction and radiation curing.

4. A light active sheet according to claim 1; wherein the light active semiconductor elements are light emitting diode die.

5. A light active sheet according to claim 1; wherein the light active semiconductor elements are light-to-energy devices.

6. A light active sheet according to claim 1; wherein a first portion of the light active semiconductor elements emit a first wavelength of radiation and a second portion of the light active semiconductor elements emit a second wavelength of radiation.

7. A light active sheet according to claim 1; wherein the electrically insulative adhesive comprises a hotmelt sheet; and the light active semiconductor elements are embedded into the hotmelt sheet before forming the lamination.

8. A light active sheet according to claim 1; wherein the light active semiconductor elements are formed into a predetermined pattern.

9. A light active sheet according to claim 8; wherein the light active semiconductor elements are formed into the predetermined pattern by electrostatically attracting a plurality of said light active semiconductor elements on a transfer member and transferring the predetermined pattern onto the insulative adhesive.

10. A method of making a light active sheet according to claim 8; wherein the light active semiconductor elements are formed into the predetermined pattern by magnetically attracting a plurality of said light active semiconductor elements on a transfer member and transferring the predetermined pattern onto the insulative adhesive.

11. A light active sheet according to claim 1; wherein the transparent conductive layer comprises a transparent conductive material formed as conductive light transmissive connecting lands, each said land for connecting with a respective light active semiconductor.

12. A light active sheet according to claim 11; further comprising a relatively higher conducting line pattern formed on at least one of the top substrate and the bottom substrate for providing a relatively lower path of resistance from a power supply source to each said light active semiconductor element.

13. A light active sheet according to claim 1; wherein the electrically conductive surface and the electrically conductive pattern comprise a respective x and y wiring grid for selectively addressing individual said light active semiconductor elements for forming a display.

14. A light active sheet according to claim 1; further comprising a phosphor provided in the lamination, said phosphor being optically stimulated by a radiation emission of a first wavelength from the light active semiconductor element to emit light of a second wavelength.

* * * * *